US012417693B2

(12) United States Patent
Menzel et al.

(10) Patent No.: US 12,417,693 B2
(45) Date of Patent: Sep. 16, 2025

(54) SYSTEMS AND METHODS FOR ANALYZING ALARMS TO CHARACTERIZE ELECTRICAL SYSTEM ISSUES

(71) Applicant: Schneider Electric USA, Inc., Andover, MA (US)

(72) Inventors: Johannes Menzel, Plateau des Petites Roches (FR); Jon A. Bickel, Murfreesboro, TN (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 17/708,591

(22) Filed: Mar. 30, 2022

(65) Prior Publication Data
US 2022/0319299 A1    Oct. 6, 2022

Related U.S. Application Data

(60) Provisional application No. 63/287,835, filed on Dec. 9, 2021, provisional application No. 63/175,274, filed on Apr. 15, 2021, provisional application No. 63/168,517, filed on Mar. 31, 2021.

(51) Int. Cl.
*G08B 29/18* (2006.01)
*G01R 21/133* (2006.01)
(Continued)

(52) U.S. Cl.
CPC ......... *G08B 29/185* (2013.01); *G01R 21/133* (2013.01); *G01R 31/40* (2013.01);
(Continued)

(58) Field of Classification Search
CPC ...... G08B 29/185; G08B 29/04; G08B 29/06; G08B 21/185; H02J 13/00001
See application file for complete search history.

(56) References Cited

U.S. PATENT DOCUMENTS

2009/0187344 A1* 7/2009 Brancaccio ........ G01R 19/2513
702/58
2009/0276170 A1   11/2009 Bickel
(Continued)

FOREIGN PATENT DOCUMENTS

WO    2019195532 A1    10/2019
WO    2019195582 A1    10/2019

OTHER PUBLICATIONS

International Search Report and the Written Opinion for corresponding International Patent Application No. PCT/US22/22593, dated Jun. 15, 2022, 9 pages.
(Continued)

*Primary Examiner* — Mirza F Alam

(57) ABSTRACT

Systems and methods for analyzing alarms to characterize electrical system issues are disclosed herein. In one aspect, a method for analyzing alarms to characterize electrical system issues includes processing electrical measurement data from or derived from energy-related signals captured or derived by at least one intelligent electronic device in the electrical system to identify events in the electrical system, and alarms triggered in response to the identified events. Information related to at least the identified events and/or the identified alarms may be aggregated, and the aggregated information may be analyzed to determine issue(s) associated with the electrical system, and origin(s), source(s), cause(s), transitions/evolutions and/or interrelationship(s) of the issue(s).

26 Claims, 29 Drawing Sheets

(51) Int. Cl.
  *G01R 31/40* (2020.01)
  *G08B 21/18* (2006.01)
  *G08B 27/00* (2006.01)
  *G08B 29/04* (2006.01)
  *G08B 29/06* (2006.01)

(52) U.S. Cl.
  CPC ......... *G08B 21/185* (2013.01); *G08B 27/005* (2013.01); *G08B 29/04* (2013.01); *G08B 29/06* (2013.01)

(56) References Cited

U.S. PATENT DOCUMENTS

| | | | | |
|---|---|---|---|---|
| 2012/0004867 | A1* | 1/2012 | Mousavi | G01R 31/3274 702/58 |
| 2012/0284790 | A1* | 11/2012 | Bhargava | G06Q 10/063 726/22 |
| 2016/0179598 | A1 | 6/2016 | Lvin et al. | |
| 2017/0270414 | A1* | 9/2017 | Ignatova | G06N 5/04 |
| 2017/0285114 | A1 | 10/2017 | Bickel et al. | |
| 2020/0011903 | A1 | 1/2020 | Menzel et al. | |
| 2023/0162123 | A1* | 5/2023 | Kagan | G06Q 10/04 700/286 |

OTHER PUBLICATIONS

The International Search Report and Written Opinion fo PCT Patent Application No. PCT/US2022/022601, dated Jun. 22, 2022.
Hu, Wenkai, et al. "Framework for a smart data analytics platform towards process monitoring and alarm management", Computers & Chemical Engineering, vol. 114, Jun. 1, 2018, pp. 225-244, XP093224625, GB, ISSN: 0098-1354, DOI: 10.1016/j.compchemeng. 2017.10.010; Retrieved from the Internet: URL:https://pdf.sciencedirectassets.com/27 1414/1-s2.0-S0098135418X00052/1-s2.0-S0098135417303551/main.pdf?X-Amz-Security-Token=IQoJb3J pZ2luX2VjEHsaCXVzLWVhc3QtMSJIMEYCIQDH7b8ulwvzuEn zo3miw7sU84.
Bote, Ahillya S., et al. "Intelligent Based Alarm Management System for Plant Automation", 2018 3rd IEEE International Conference on Recent Trends in Electronics, Information & Communication Technology (RTEICT), IEEE, May 18, 2018, pp. 1569-1573, XP033724640, DOI: 10.1109/RTEICT42901.2018.9012105.
Pratama, Irfan, et al. "A review of missing values handling methods on time-series data", 2016 International Conference on Information Technology Systems and Innovation (ICITSI), IEEE, Oct. 24, 2016, pp. 1-6, XP033067323, DOI: 10.1109/ICITSI.2016.7858189.
Wang, Jiandong et al. "An online method for detection and reduction of chattering alarms due to oscillation", Computers & Chemical Engineering, Pergamon Press, Oxford, GB, vol. 54, Apr. 12, 2013, pp. 140-150, XP028541262, ISSN: 0098-1354, DOI: 10.1016/J. COMPCHEMENG.2013.03.025.
Wang, Jiandong et al. "An Overview of Industrial Alarm Systems: Main Causes for Alarm Overloading, Research Status, and Open Problems", IEEE Transactions on Automation Science and Engineering, IEEE Service Center, New York, NY, vol. 13, US, No. 2, Apr. 1, 2016, pp. 1045-1061, XP011605536, ISSN: 1545-5955, DOI: 10.1109/TASE.2015.2464234; retrieved on Apr. 5, 2016.
Extended European Search Report for European Patent Application No. EP22782116.2, dated Feb. 17, 2025.

* cited by examiner

SYSTEMS AND METHODS FOR ANALYZING ALARMS TO CHARACTERIZE ELECTRICAL SYSTEM ISSUES

CROSS REFERENCE TO RELATED APPLICATIONS

This application claims the benefit of and priority to U.S. Provisional Application No. 63/168,517, filed on Mar. 31, 2021, U.S. Provisional Application No. 63/175,274, filed on Apr. 15, 2021, and U.S. Provisional Application No. 63/287,835, filed on Dec. 9, 2021, which applications were filed under 35 U.S.C. § 119(e) and are incorporated by reference herein in their entireties.

FIELD

This disclosure relates generally to electrical systems, and more particularly, to systems and methods related to analyzing alarms to address electrical system issues.

BACKGROUND

The changing world of energy is making it increasingly challenging to optimize power reliability, energy costs, and operational efficiency such as in critical power environments (e.g., hospitals, data centers, airports, and manufacturing facilities). Utility power grids are becoming more dynamic and facility power distribution systems are becoming more complex and sensitive to power quality issues due to increasing electronic control devices, threatening network stability. Competitive pressures and environmental regulations are pushing expectations for energy efficiency and business sustainability higher than ever. Addressing these challenges requires new digital tools designed specifically to enable faster response to opportunities and risks related to electrical/power system reliability and operational stability.

Power quality issues are a primary cause of unexpected business downtime and equipment malfunction/damage/failure. Examples of the detrimental effects to equipment that may be attributed to power quality issues include overheating of equipment components (e.g., motors, capacitors, cables, transformers, etc.), accelerated wear and tear, premature aging of equipment components, malfunctions and mis-operations, and erroneous circuit breaker or relays operations.

The economic impact produced by power quality issues may include increased energy bills, additional financial penalties (e.g., penalties as a result of power disruption), and potentially detrimental impacts on the environment (e.g., increased carbon footprint). Power quality issues may also adversely result in increased demand charges, increased electrical/power system losses, and increases in voltage drops. Three examples of areas influenced by power quality issues include: uptime, asset condition, and energy efficiency. For example, system uptime may be affected by electrical installations inadvertently being removed from service due to voltage sags, interruptions, and/or undervoltage/overvoltage conditions. Moreover, nuisance trips of circuits caused by harmonics, voltage swells, or transients can also lead to reduced uptime. Assets and infrastructure (e.g., cables, transformers, capacitor banks, etc.) may be detrimentally affected by power quality issues and associated conditions. For instance, overheating of equipment, an unplanned change in design characteristics, and/or a decreased service life are just a few problems caused by power quality anomalies. Finally, the efficient use of energy is also influenced by power quality issues.

According to a specific example, capacitor banks may be affected by power quality issues (e.g., harmonics) that are characterized as a steady-state distortion of the voltage and/or current signals. Non-linear power loads from electric arc furnaces (EAFs), electric railway systems, thyristor-based voltage and frequency altering devices have become important harmonic-producing sources in a power grid. These technologies inject large amounts of harmonic currents into electrical systems, leading to distortion of the source voltage in the electrical grid. Harmonics can adversely impact the normal operations of capacitor banks in numerous ways (e.g., increasing power losses, producing harmonic resonance, increasing harmonic currents, causing fuses to fail, and reducing the service life of the capacitor bank through additional heating). Many of the above-described events will generate events data and alarms data.

SUMMARY

Described herein are systems and methods related to providing electrical system analytics. The electrical systems may be associated with at least one load, process, building, facility, watercraft, aircraft, or other type of structure, for example. Additionally, the electrical systems may be associated with one or more segments (e.g., customer segments), for example, retail, offices, semiconductor fabs, automotive manufacturing facilities, hotels, hospitals, data centers, food and beverage, and oil and gas to name a few.

As is known, electrical system analysis can be very time consuming and is most often based on fixed thresholds and business intelligence (e.g., data cube, tools letting an expert user access the events and alarms data, navigate, select, filter, combine, aggregate results, or zoom into details). Existing tools and techniques typically require an expert user to conduct the hands-on investigation. To be able to analyze all the details requires significant effort and time to sift through all the data and identify the relevant information. As is known, electrical systems analysis requires considerable understanding of the field of application and expertise to identify and troubleshoot issues, understanding of the context of the site/segment/building, and a good understanding of the driven loads and processes.

The current state of the art requires system operators to evaluate alarms, propagation of events, alarms nuisance behaviors, alarm patterns identification, coincident waveform information, load impact, event source locations, interrelated events analysis, historic alarm data analysis to avoid over-focus, spatial context, and so forth. In short, evaluating alarms can be overwhelming; however, not evaluating alarms can be risky and costly. Alarm analysis is time consuming and requires additional time beyond supporting operations at the site (e.g., power systems engineers state that it may take them up to 3 weeks to conduct postmortem alarms analysis after a major issue occurs in a data center to ensure all potential causes of an event are identified. It is also important to check robustness and coverage of mitigation solutions, which can potentially impact design of the electrical system (and could change the specification of future implemented solutions to avoid a repeat event).

Alarms can be a powerful tool to quickly identify issues so that uptime is improved. However, even for experienced end-users, alarms can be disconcerting, ill-timed, and overwhelming, especially in larger systems. Some events produce different types of alarms (e.g., PQ events, over current, comms errors, etc.), which can exacerbate confusion and indecision, lead to mistakes, and waste time and/or resources. Ironically (and perhaps more importantly), alarms can lead end-users to disregard the value and information Electrical Power Monitoring Systems (EPMSs) provide because the end-users may not know how the alarms interrelate. Clues associated with understanding the importance of alarm data are often spread across multiple sources, alarm types, and/or a range of time. Because of the volume, complexity, and potential significance of alarms originating from an end-user's electrical system, a firm understanding of their relevance is the essential to achieve the most benefit from an EPMS. And this may become a major barrier in the near future as qualified power systems engineers leave the workforce and the available expertise becomes scarce.

Herein, for simplicity, the term EPMS is also used to refer to a Monitoring and Control System (MCS), Power Monitoring System (PMS), or any other system that measures, derives, controls, and/or provides/reports information with respect to the electrical system. Supervisory control and data acquisition (SCADA) systems (e.g., Power SCADA, Manufacturing SCADA), building management systems (BMSs), programmable logic controllers (PLCs), input/output systems and equipment, and/or any other system or combination of systems and/or devices capable of at least one of monitoring, measuring, deriving, gathering, processing, producing, analyzing, alarming, communicating, displaying, reporting, storing, and/or any other action and/or process associated with, or part of, a facility's utility system(s) (e.g., WAGES: water, air, gas, electricity, steam) may be considered relevant to this application. Additionally, a diagnostic system is used herein as a part or subset of the EPMS for identifying, analyzing, determining, ascertaining, learning, teaching, providing, benefiting, and/or otherwise evaluating data to obtain a better understanding of one or more data implication(s).

One goal of alarms analysis and identifying abnormal conditions occurring within an electrical system is to propose and optimize mitigation actions. This requires a good understanding of the customer segment, the load types related to (or possibly impacted by) power events, and the criticality of particular loads to the customer process or building functions. So, a deep understanding of the site and customer's system(s) is an essential element to successfully analyze alarms, to determine the cause of abnormal conditions, and defining, selecting, and/or prioritizing potential solutions and mitigations.

As will be appreciated from discussion below, the disclosed systems and methods automatically examine large amounts of data to more quickly identify and resolve EPMS (or other source(s)), electrical system and/or equipment problems. They discriminate between noise (alarms nuisance behavior) and relevant signal/data. They identify likely sources of nuisances (e.g., missing events and alarms timestamped data) and enables the EPMS (or other source(s)) to correct certain types of missing data by leveraging other available data and expertise (e.g., correcting partially the missing data). The systems and methods process all available data automatically, reducing the risk of overlooking important data or derived information in the analysis, as can happen with human experts operating within set time constraints. Additionally, the disclosed systems and methods provide guidance on potential impacts & causes (source location) in the analysis, and provide recommendations based on the segment context (e.g., data center vs. industrial vs. office, etc.), load types (e.g., motors, automotive industrial process, HVAC, lighting, IT racks, etc.), and other libraries and settings.

In addition to the above benefits, it will be readily understood there are many other benefits associated with the disclosed systems and methods. For example, as will be further appreciated from the discussions below in the Summary and Detailed Description sections of this disclosure, the disclosed systems and methods are able to:
   simplify customer troubleshooting to mitigate or resolve problems faster,
   reduce data clutter to reduce customer confusion,
   automates event analysis to reduce customer mistakes and omissions,
   prioritizes events to help customer focus on the most important problems,
   enables services such as causal analysis, problem locations, impacts, chronic issues, improvement opportunities, etc., and
   provides custom event analysis based on customer type/segment.

In one aspect of this disclosure, systems and methods related to reducing alarm nuisance behaviors in an electrical system are provided. A method for reducing alarm nuisance behaviors in an electrical system may include, for example, processing electrical measurement data from or derived from energy-related signals captured or derived by at least one intelligent electronic device (IED) in the electrical system to identify events (e.g., power events) in the electrical system, and alarms triggered in response to the identified events and/or other events (e.g., events other than the identified power events such as HVAC control changes or manufacturing SCADA process control actions or detected status changes on loads) in (or related to) the electrical system. Information related to at least the identified events and the identified alarms may be aggregated, and the aggregated information may be analyzed (e.g., automatically and/or dynamically analyzed) to identify at least one alarm nuisance behavior. In some embodiments, at least one action may be taken or performed based on (or in response to) the at least one identified alarm nuisance behavior. For example, at least one potential mitigation or remediation to address at least one identified alarm nuisance behavior may be identified, and one or more of the at least one potential mitigation or remediation may be selected and recommended (e.g., based on the particular user(s) and/or customer segment type(s) associated with the electrical system).

In accordance with some embodiments of this disclosure, the aggregated information includes information from at least one of: an EPMS, a SCADA system (e.g., Power SCADA, Manufacturing SCADA), a building management system (BMS), I/O devices, and system users (e.g., user-initiated actions). In some embodiments, the EPMS may include the at least one IED responsible for capturing or deriving the energy-related signals.

In accordance with some embodiments of this disclosure, the aggregated information may be further analyzed to identify missing or incomplete data (e.g., due to an IED losing control power), and impact of the missing or incomplete data on the at least one identified alarm nuisance behavior. In some embodiments, the at least one identified alarm nuisance behavior is an indication of suboptimal alarm health. Additionally, in some embodiments the at least one action taken or performed based on or in response to the at least one identified alarm nuisance behavior includes at least one action to improve the alarm health.

In accordance with some embodiments of this disclosure, the at least one identified alarm nuisance behavior includes behavior indicative of at least one predefined or prescribed alarm nuisance behavior, user-defined (e.g., customized)

alarm nuisance behavior, or learned alarm nuisance behavior. In some embodiments, the predefined or prescribed alarm nuisance behavior is defined based, at least in part, on good engineering practices, thresholds defined during one of the typical steps of American National Standards Institute (ANSI)/International Society of Automation (ISA) 18.2 alarms "audit and philosophy loop" (A, B, C, D, H, I, J) or at the commissioning of a site (in absence of a formal process such as recommended by ISA 18.2 this may be equated to steps A to E) or prescribed (e.g., such as when data centers are built in different new projects or updates of procedures, re-implementing prescribed thresholds used and tested in previous installations). Additionally, in some embodiments the learned alarm nuisance behavior is learned from analysis of data received from at least one of: system users, and I/O systems and IED (or other source(s)). In some embodiments, the at least one predefined or prescribed alarm nuisance behavior, user-defined alarm nuisance behavior, or learned alarm nuisance behavior is based, at least in part, on customer segment type or a load type.

In accordance with some embodiments of this disclosure, the at least one action taken or performed based on or in response to the at least one identified alarm nuisance behavior includes characterizing and/or quantifying the at least one identified alarm nuisance behavior. In some embodiments, the characterization includes grouping the at least one identified alarm nuisance behavior into one or more of a plurality of predefined or prescribed alarm nuisance behaviors, user-defined alarm nuisance behaviors, or learned alarm nuisance behaviors. The plurality of predefined or prescribed alarm nuisance behaviors, user-defined alarm nuisance behaviors, or learned alarm nuisance behaviors may include, for example, at least one of: stale alarm nuisance behavior, chattering alarm nuisance behavior, fleeting alarm nuisance behavior, and flood alarm nuisance behavior. In some embodiments, the at least one identified alarm nuisance behavior is grouped into the one or more of the plurality of predefined or prescribed alarm nuisance behaviors, user-defined alarm nuisance behaviors, or learned alarm nuisance behaviors in response to determining the at least one identified alarm nuisance behavior meets predefined, prescribed, user-defined or learned (validation of nuisance issue) thresholds associated with the one or more of the plurality of predefined or prescribed alarm nuisance behaviors, user-defined alarm nuisance behaviors, or learned alarm nuisance behaviors.

In accordance with some embodiments of this disclosure, information related to the at least one identified alarm nuisance behavior is pre-processed prior to characterizing and/or quantifying the at least one identified alarm nuisance behavior. In some embodiments, the pre-processing includes identifying, filtering and/or correcting errors in the information related at least one identified alarm nuisance behavior. The errors may be based, for example, on incorrect or incomplete data (e.g., incorrect timestamps).

In accordance with some embodiments of this disclosure, it may be determined if the at least one identified alarm nuisance behavior meets prescribed conditions. In some embodiments, the prescribed conditions include a minimal quantity of occurrences of the at least one identified alarm nuisance behavior over a given analysis period for the at least one identified alarm nuisance behavior to be considered a nuisance behavior for purposes of future analyses. In some embodiments, in response to the at least one identified alarm nuisance behavior not meeting the prescribed conditions, the at least one identified alarm nuisance behavior may be filtered or removed from a data set, processing step, graphical presentation or report, including the at least one identified alarm nuisance behavior.

In accordance with some embodiments of this disclosure, information related to the characterized and/or quantified at least one identified alarm nuisance behavior may be appended to time-series information associated with the identified alarms. The appended information may include, for example, information relating to time(s) of occurrence of the identified alarms, frequency(s) of occurrence of the identified alarms, duration(s) of the identified alarms, magnitude(s) of the identified alarms, severity(s) of the identified alarms, location(s) of the identified alarms, groups or clusters of the identified alarms, etc.

Systems for reducing alarm nuisance behaviors in an electrical system are also provided. In one aspect, a system for reducing alarm nuisance behaviors in an electrical system includes at least one processor and at least one memory device coupled to the at least one processor. The at least one processor and the at least one memory device may be configured to process electrical measurement data from or derived from energy-related signals captured or derived by at least one IED in the electrical system to identify events in the electrical system, and alarms triggered in response to the identified events and/or other events in or related to the electrical system. Information related to at least the identified events and the identified alarms may be aggregated, and the aggregated information may be analyzed (e.g., automatically and/or dynamically analyzed) to identify at least one alarm nuisance behavior. In some embodiments, at least one action may be taken or performed based on or in response to the at least one identified alarm nuisance behavior. In accordance with some embodiments of this disclosure, the system corresponds to, includes, or is part of an EPMS.

As will be further appreciated from the discussions in the Detailed Description section of this disclosure, the disclosed systems and methods for reducing alarm nuisance behaviors in an electrical system automatically examines large amounts of data to more quickly identify and resolve system and/or equipment problems. This includes different nuisance behavior such as chattering alarms, fleeting alarms, and flood periods. This invention also identifies and proposes automatically correcting of missing events and their timestamps which create nuisance behavior that may blur the alarms analysis and visualization.

It is important to note that ANSI/ISA 18.2 explicitly excludes from its scope any method or any operational definition of how to identify alarms nuisance behaviors, potential causes of alarms nuisance behaviors, how to reduce alarms nuisance behaviors, etc. More particularly, the standard does not define or require any specific method for alarm identification. Rather, the standard (e.g., in Section 8.2 of the standard) indicates that alarms may be identified by a variety of good engineering practices or regulatory requirements. With respect to alarm types (e.g., Section 10.4 of the standard), the standard indicates that alarm types should be selected carefully based on engineering judgment. Certain types, such as rate-of-change, deviation, bad-measurement, and controller output alarms, can be sources of nuisance alarms if they are not applied correctly. Accordingly, it is an objective of the disclosed systems and methods for reducing alarm nuisance behaviors to provide techniques to identify alarms nuisance behaviors, causes of alarms nuisance behaviors, and techniques to reduce alarms nuisance behaviors, etc. so that more clarity and value can be achieved from ANSI/ISA 18.2 in electrical system applications.

Further exemplary benefits of the disclosed systems and methods for reducing alarm nuisance behaviors in an electrical system include:
- reducing data clutter and nuisance information for optimal processing, communication, and storage requirements,
- simplifying customer evaluation and problem resolution, minimizing customer required expertise,
- automating alarm analysis to decrease customer errors and omissions,
- improving value of EPMS through time savings, improved efficiency, and insight, and
- leveraging customer segment and load types for unique and focused assessments.

Systems and methods related to analyzing alarms for characterizing electrical system issues are also provided herein. In one aspect, a method for alarms to characterize electrical system issues includes processing electrical measurement data from or derived from energy-related signals captured or derived by at least one IED in the electrical system to identify events (e.g., power events) in the electrical system, and alarms triggered in response to the identified events. Information related to at least the identified events and/or the identified alarms may be aggregated, and the aggregated information may be analyzed (e.g., automatically or dynamically analyzed) to determine issue(s) associated with the electrical system, and origins (e.g., time(s), location(s)), source(s) (e.g., process(es), specific load(s)), cause(s) (e.g., something the process(s) or load(s) is/are doing such as a motor starting in a process), transitions/evolutions (e.g., over time changes) and/or interrelationships of the issue(s) associated with the electrical system. The issue(s) associated with the electrical system may, for example, contribute to unsatisfactory operation of the electrical system.

In accordance with some embodiments of this disclosure, the aggregated information includes information from at least one of: an EPMS (or other source(s)), a SCADA system (e.g., Power SCADA, Manufacturing SCADA), a building management system (BMS), I/O devices, and system users (e.g., user-initiated actions). In some embodiments, the EPMS (or other source(s)) may include the at least one IED responsible for capturing or deriving the energy-related signals. In some embodiments, the aggregated information may be further analyzed to determine issue(s) associated with the EPMS, for example. The issue(s) associated with the EPMS may include, for example, issue(s) associated with the EPMS not detecting or inadequately detecting issue(s) existing in the electrical system. In some embodiments, issue(s) associated with the EPMS may be addressed by modifying one or more settings associated within the EPMS (or other source(s)). It is understood that the issue(s) associated with the EPMS may be addressed in a variety of other manners, as will be appreciated by one of ordinary skill in the art.

In accordance with some embodiments of this disclosure, issue(s) existing in the electrical system are indicative of the health of the electrical system. Health of the electrical system may correspond, for example, to a condition of the electrical system (or a subcomponent such as a load/equipment, infrastructure, etc.) or ability of the electrical system to perform or operate as intended. In accordance with some embodiments of this disclosure, the health of the electrical system is related to alarm health of the electrical system, and the alarm health of the electrical system may be indicative of the health of the electrical system. The alarm health of the electrical system may be determined, for example, based, at least in part, on an analysis of at least one of: quantity, type(s), behavior(s), impact(s), severity(s), breadth, and location(s) of the identified alarms.

In accordance with some embodiments of this disclosure, impact of the identified alarms and/or alarm periods associated with the identified alarms on the electrical system may be determined. Additionally, actionable recommendations may be provided to reduce or eliminate causes of issues and measured impact of the identified alarms and/or the alarm periods associated with the identified alarms. In accordance with some embodiments of this disclosure, the actionable recommendations are based on segment-type (e.g., retail, offices, hotels, hospitals, data centers, food and beverage, and oil and gas), load type, and/or customer configurations and/or determined preferences.

In accordance with some embodiments of this disclosure, relevant information relating to the identified alarms may be communicated accordingly. Relevant information may, for example, provide real-time awareness of one or more of: alarm health, alarm configuration(s), alarm operation, alarm source(s), alarm impact, alarm absence, and recent alarm activity. The relevant information may, for example, be provided on an alarm data dashboard, report, text, email, audible communication, and/or another alarm. The alarm data dashboard may be customizable and configurable (e.g., based on user segment and/or in response to user input) in some instances. Additionally, one or more aspects of the alarm data dashboard may be user selectable and capable of providing further insights and analytics in response to one or more user actions on the alarm data dashboard (e.g., clicks, gestures or other interactions). The communication may be provided, for example, to at least one of: an end-user, equipment manufacturer, services team, other interested individual or party (e.g., with the interested individual or party providing the user actions), and/or library(s).

In accordance with some embodiments of this disclosure, the identified events and/or the identified alarms may be analyzed to identify co-occurring groups of the identified events and/or the identified alarms, and reoccurrences of the identified co-occurring groups of the identified events and/or the identified alarms. In accordance with some embodiments of this disclosure, information relating to the identified co-occurring groups of the identified events and/or the identified alarms may be included in the aggregated information used to determine whether the issue(s) or probable issues existing in the electrical system, and the source(s) or the cause(s) of the issue(s) contributing to the suboptimal operation of the electrical system.

In accordance with some embodiments of this disclosure, the identified events may include power quality events and/or events capable of triggering protection devices (e.g., protection relays). The power quality events may, for example, be indicative of power quality issues in the electrical system.

In accordance with some embodiments of this disclosure, the information is aggregated, and/or the issue(s) existing in the electrical system are determined, based on segment-type (e.g., retail, offices, hotels, hospitals, data centers, food and beverage, and oil and gas) (i.e., the electrical system issues are dynamic to each site/customer application) and/or load type. Additionally, in accordance with some embodiments of this disclosure, information relating to impact and location is analyzed with the aggregated information to determine whether the issue(s) are associated with the electrical system, and origins, source(s), cause(s), transitions/evolutions and/or interrelationships of the issue(s) associated with the electrical system.

In accordance with some embodiments of this disclosure, subsequent to identifying the origins, source(s), cause(s), transitions/evolutions and/or interrelationships of the issue(s) associated with the electrical system, one or more actions may be taken to increase or improve the operation of the electrical system. The one or more actions may include, for example, adjustments to one or more alarm parameters or thresholds. In some embodiments, these actions are automatically performed by a control system associated with the electrical system. The control system may be communicatively coupled to the at least one IED responsible for capturing or deriving the energy-related signals, and/or to a cloud-based system, on-site/edge software, a gateway, and other head-end system associated with the electrical system, for example.

Systems for analyzing alarms to characterize electrical system issues are also provided. In one aspect, a system for analyzing alarms to characterize electrical system issues includes at least one processor and at least one memory device coupled to the at least one processor. The at least one processor and the at least one memory device may be configured to process electrical measurement data from or derived from energy-related signals captured or derived by at least one IED in the electrical system to identify events (e.g., power events) in the electrical system, and alarms triggered in response to the identified events. Information related to at least the identified events and/or the identified alarms may be aggregated, and the aggregated information may be analyzed to determine issue(s) associated with the electrical system, and origins, source(s), cause(s), transitions/evolutions and/or interrelationships of the issue(s) associated with the electrical system.

As will be further appreciated from the discussions in the Detailed Description section of this disclosure, the disclosed systems and methods for analyzing alarms to characterize electrical system issues analyzes alarm data to determine the interrelation of alarms, system impacts, spatial context, segment types, and/or load types to determine the scope and influence of electrical events. Contextual data (of both the end-user's electrical system and their EPMS) may be used to determine historical, contemporaneous and potential future implications of events associated with alarm data. Guidance on possible impacts & causes (source location) is provided in the analysis. Additionally, recommendations may be provided based on the segment (data center vs. industrial vs. office) and their respective typical loads (motors, automotive industrial process, HVAC, lighting, IT racks, etc.) and settings.

Since each energy consumer is unique in its use of energy, the priorities, thresholds, and/or consolidation of multiple alarms may also be distinctive. The disclosed systems and methods for analyzing alarms to characterize electrical system issues automatically processes alarms to simplify indications from the EPMS, which improves the end-user's ability to respond in a timely manner. Its purpose is to leverage the end-user's market segment/type to evaluate alarms through their significance to a particular customer's energy segment. For example, experiencing voltage sag events in one market segment/type (e.g., semiconductor fabs, data centers, etc.) may have a more detrimental impact to an operation than in a second market segment/type (e.g., commercial office buildings, etc.). Additionally, the time of an event (e.g., day, evening, etc.) in one market segment/type may be more detrimental than in another. The disclosed systems and methods for analyzing alarms to characterize electrical system issues facilitates the amalgamation of alarm data to help end-users identify problems for troubleshooting and providing causal analysis.

Example benefits of the disclosed systems and methods for analyzing alarms to characterize electrical system issues include:
- streamlining customer troubleshooting for faster problem identification,
- minimizing "false positives" from alarm data to reduce customer confusion,
- automating event analysis to lessen customer mistakes and omissions,
- prioritizing alarms to facilitate focus on the most important electrical problems,
- enabling new services such as causal analysis, problem localization, impacts and effects, chronic issues, etc., and
- leveraging customer segment/type for custom event analysis.

Systems and methods related to analyzing alarms to address electrical system issues are also provided herein. In one aspect, a method for alarms to address electrical system issues includes processing electrical measurement data from or derived from energy-related signals captured or derived by at least one IED in the electrical system to identify at least one of: event(s) (e.g., power events) in the electrical system, alarm(s) triggered in response to the identified event(s), and cause(s) and/or origin(s) of the identified event(s) and/or identified alarm(s). Information related to at least one of: the identified event(s), the identified alarm(s), and/or the identified cause(s) and/or origin(s) of the identified event(s) and/or identified alarm(s) may be aggregated, and the aggregated information may be analyzed to identify mitigation and/or remediation opportunities and techniques to address at least one of: event symptom(s), alarm source(s), and the identified cause(s)/origin(s) of the identified event(s) and/or the identified alarm(s).

The identified mitigation and/or remediation opportunities and techniques may include, for example, recommended changes to at least one of an operation, equipment type, and an aspect of an EPMS associated with the electrical system to improve at least one of a characteristic, parameter, property, and attribute of the electrical system or the EPMS. In accordance with some embodiments of this disclosure, at least one action (e.g., at least one type of mitigation and/or remediation) may be taken or performed to improve or resolve the at least one of: the event symptom(s), the alarm source(s), and the identified cause(s)/origin(s) of the identified event(s) and/or the identified alarm(s), based on the analysis of the aggregated information.

In accordance with some embodiments of this disclosure, at least one of: location(s), event type(s), segment type(s), quantity, etc. of the at least one of the event symptom(s), the alarm source(s), and the identified cause(s) and/or origin(s) of the identified event(s) and/or the identified alarm(s) may be used to determine the at least one action taken or performed. Additionally, in accordance with some embodiments of this disclosure, at least one of: location(s), event type(s), segment type(s), quantity, etc. of the at least one of the event symptom(s), the alarm source(s), and the identified cause(s)/origin(s) of the identified event(s) and/or the identified alarm(s) may be used to recommend prioritization of the at least one action taken or performed. The recommended prioritization may also be based, for example, on at least one of: severity, impact and prevalence of the at least one of the event symptom(s), the alarm source(s), and the identified cause(s) and/or origin(s).

In accordance with some embodiments of this disclosure, subsequent to taking or performing the at least one action, the effectiveness of the at least one action may be evaluated, for example, verified and validated (e.g., after a predetermined time period). The evaluation may include analyzing and comparing the aggregated information from prior to taking or performing the at least one action with the aggregated information from subsequent to taking or performing the at least one action. The aggregated information from prior to taking or performing the at least one action may be derived, for example, from the energy-related signals captured or derived by the at least IED at a first time prior to taking or performing the at least one action. Additionally, the aggregated information from subsequent to taking or performing the at least one action may be derived from the energy-related signals captured or derived by the at least IED at a second time subsequent to taking or performing the at least one action.

In accordance with some embodiments of this disclosure, the evaluation (e.g., measurement, verification and validation) quantifies the effectiveness of the at least one action that is take or performed. In response to the quantified effectiveness meeting or exceeding an acceptable threshold, it may be determined if it is necessary to continue to take or perform the at least one action. Additionally, in response to the quantified effectiveness not meeting or exceeding an acceptable threshold, it may be determined if any adjustments need to be made to the at least one action taken or performed, or if at least one alternative action should be taken or performed.

In accordance with some embodiments of this disclosure, segment and/or load type information associated with a first facility or location may be leveraged to more effectively and/or proactively mitigate/remediate the event symptom, the alarm source, and the identified causes/origins of the identified events and/or the identified alarms at a second facility or location.

In accordance with some embodiments of this disclosure, the aggregated information includes information from at least one of: an EPMS, a SCADA system (e.g., Power SCADA, Manufacturing SCADA), a building management system (BMS), I/O devices, system users (e.g., user-initiated actions), and library(s). In some embodiments, the EPMS may include the at least one IED responsible for capturing or deriving the energy-related signals. In some embodiments, the aggregated information may be further analyzed to identify and/or determine mitigation/remediation opportunities and techniques/approaches/methods to address issue(s) associated with the EPMS (or other source(s)), for example. The issue(s) associated with the EPMS may include, for example, issue(s) associated with the EPMS not detecting or inadequately detecting issue(s) existing in the electrical system. In some embodiments, the identified and/or determined mitigation/remediation opportunities and techniques/approaches/methods to address issue(s) associated with the EPMS include changes to one or more settings associated with the EPMS to address the issue(s) associated with the EPMS. In accordance with some embodiments of this disclosure, the aggregated information may be further analyzed to determine quantity, placement, type, and/or configuration of the at least one IED to improve and/or augment the quality of alarms and associated data in the EPMS.

In accordance with some embodiments of this disclosure, one or more alarms may be generated, produced or initiated using an EPMS associated with electrical system to indicate an opportunity to mitigate/remediate the at least one of the event symptom, the alarm source, and the causes/origins of the identified events and/or the identified alarms. Additionally, in accordance with some embodiments of this disclosure, benefits (e.g., monetary benefits) associated with mitigating/remediating issues in the electrical system and/or in an EPMS associated with the electrical system may be projected and/or provided using the disclosed systems and methods.

Systems for analyzing alarms to address electrical system issues are also provided. In one aspect, a system for analyzing alarms to address electrical system issues includes at least one processor and at least one memory device coupled to the at least one processor. The at least one processor and the at least one memory device may be configured to process electrical measurement data from or derived from energy-related signals captured or derived by at least one IED in the electrical system to identify at least one of: event(s) (e.g., power events) in the electrical system, alarm(s) triggered in response to the identified event(s), and cause(s) and/or origin(s) of the identified event(s) and/or identified alarm(s). Information related to at least one of: the identified event(s), the identified alarm(s), and/or the identified cause(s) and/or origin(s) of the identified event(s) and/or identified alarm(s) may be aggregated, and the aggregated information may be analyzed to identify mitigation and/or remediation opportunities and techniques to address at least one of: event symptom(s), alarm source(s), and the identified cause(s) and/or origin(s) of the identified event(s) and/or the identified alarm(s). In accordance with some embodiments of this disclosure, at least one action may be taken or performed to improve or resolve the at least one of: the event symptom(s), the alarm source(s), and the identified cause(s) and/or origin(s) of the identified event(s) and/or the identified alarm(s), based on the analysis of the aggregated information.

As will be further appreciated from the discussions in the Detailed Description section of this disclosure, the ultimate purpose of the disclosed systems and methods for analyzing alarms to address electrical system issues is to understand potentially abnormal conditions occurring within an electrical system and to propose mitigation or remediation actions. Analysis of alarms is an important factor in determining the cause(s) of an abnormal condition and how to address/mitigate/remediate it. Additionally, analysis of alarms can help end-users validate the success (or failure) of mitigation or remediation steps taken to correct a problem and learn how to optimize mitigation and remediations solutions choices and implementations in the future. These issues can be related to difficulties associated with the end-user's electrical system or even the EPMS itself. Because of the volume, complexity, and potential significance of alarms originating from an end-user's electrical system, a firm understanding of their relevance is the essential to achieve the greatest benefits from an EPMS. Resolutions may be provided from data originating within the end-user's system OR from recommendations determined from other similar segments types. Additionally, automated audits of alarms may be used to determine risks associated with insufficient EPMS configurations and/or coverage to ensure optimal performance of the EPMS. Alarm interrelationships may be evaluated and ascertained to facilitate a faster understanding and mitigative/remediative actions of future events. Additionally, "tuned" alarm settings are recommended using market segment and/or load information.

Example benefits of the disclosed systems and methods for analyzing alarms to address electrical system issues include:

reducing requirements for customer expertise and analysis, improving time-to-action through more efficient and automated operation, automating alarm settings and reporting recommendations leveraging market segments (and their respective load types), providing specific mitigation recommendations for electrical system and EPMS issues using segments and load types, automating prioritization of mitigation techniques, verifying mitigation(s) efficacies through reports and interfaces, and enabling services to evaluate and provide mitigative approaches as needed.

In accordance with some embodiments of this disclosure, the above-discussed systems and methods (and other systems and methods disclosed herein) may be implemented using one or more IEDs of the above-discussed at least one IED that is described as capturing or deriving energy-related signals. Additionally, in some embodiments the method (or portions thereof) may be implemented remote from the at least one IED, for example, on a diagnostic system and/or on other portions of a EPMS associated with the electrical system. In some embodiments, the at least one IED may be coupled to measure energy-related signals, receive electrical measurement data from or derived from the energy-related signals at an input, and be configured to generate at least one or more outputs. The outputs may be used to identify power events, to trigger other actions, and/or to identify alarms triggered in response to the identified power events, in the electrical system. Examples of the at least one IED may include a smart utility meter, a power quality meter, and/or another metering device (or devices). The at least one IED may include breakers, relays, power quality correction devices, uninterruptible power supplies (UPSs), filters, and/or variable speed drives (VSDs), for example. Additionally, the at least one IED may include at least one virtual meter in some embodiments.

In some embodiments, each IED of the at least one IED is installed or located at a respective metering point of a plurality of metering points (e.g., physical or virtual metering points) in the electrical system, and the energy-related signals captured or derived by each IED of the at least one IED are associated with the respective metering point. At least one load (e.g., electrical equipment or devices) may be installed or located at each metering point of the plurality of metering points, for example, and each IED of the at least one IED may be configured to monitor the at least one load installed or located at the respective metering point at which the IED is installed or located. In the illustrated example, the energy-related signals captured or derived by the at least one IED may be associated with the at least one load.

As used herein, an IED (e.g., part of an EPMS) is a computational electronic device optimized to perform a particular function or set of functions. As discussed above, examples of IEDs include smart utility meters, power quality meters, and other metering devices. IEDs may also be imbedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, and the like. For example, where the IED is an electrical power monitoring device, it may be coupled to (or be installed in) an electrical power distribution system and configured to sense and store data as electrical parameters representing operating characteristics (e.g., voltage, current, waveform distortion, power, etc.) of the power distribution system. These parameters and characteristics may be analyzed by a user to evaluate potential performance, reliability or power quality-related issues. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem. For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software.

It is understood that the energy-related signals captured or derived by the at least one IED discussed above may include, for example, at least one of: a voltage signal, a current signal, input/output (I/O) data, and a derived or extracted value. In some embodiments, the I/O data includes at least one of a digital signal (e.g., two discrete states) and an analog signal (e.g., continuously variable). The digital signal may include, for example, at least one of on/off status(es), open/closed status(es), high/low status(es), synchronizing pulse and any other representative bi-stable signal. Additionally, the analog signal may include, for example, at least one of temperature, pressure, volume, spatial, rate, humidity, and any other physically or user/usage representative signal.

In accordance with some embodiments of this disclosure, the derived or extracted value includes at least one of a calculated, computed, estimated, derived, developed, interpolated, extrapolated, evaluated, and otherwise determined additional energy-related value from at least one of the measured voltage signal and/or the measured current signal. In some embodiments, the derived value additionally or alternatively includes at least one of active power(s), apparent power(s), reactive power(s), energy(s), harmonic distortion(s), power factor(s), magnitude/direction of harmonic power(s), harmonic voltage(s), harmonic current(s), interharmonic current(s), interharmonic voltage(s), magnitude/direction of interharmonic power(s), magnitude/direction of sub-harmonic power(s), individual phase current(s), phase angle(s), impedance(s), sequence component(s), total voltage harmonic distortion(s), total current harmonic distortion(s), three-phase current(s), phase voltage(s), line voltage(s), spectral analysis and/or other similar/related parameters. In some embodiments, the derived value additionally or alternatively includes at least one energy-related characteristic, the energy-related characteristic including magnitude, direction, phase angle, percentage, ratio, level, duration, associated frequency components, energy-related parameter shape, and/or decay rate. In accordance with some embodiments of this disclosure, the derived or extracted value may be linked to at least one process, load(s) identification, etc., for example.

It is understood that the energy-related signals captured or derived by at least one IED may include (or leverage) substantially any electrical parameter derived from at least one of a voltage and current signal (including the voltages and currents themselves), for example. It is also understood that the energy-related signals may be continuously or semi-continuously/periodically captured/recorded and/or transmitted and/or logged by the at least one IED, and power events and/or alarms may be detected/identified based on the energy-related signals.

In some embodiments, identifying power events from electrical measurement data from or derived from the energy-related signals includes identifying power quality event types of the of the power events. The power quality event types may include, for example, at least one of: a voltage sag, a voltage swell, a voltage or current transient, a temporary interruption, and voltage or current harmonic distortion. It is understood there are types of power quality events and there are certain characteristics of these types of power quality events. According to IEEE Standard 1159-2019, for example, a voltage sag is a decrease to between 0.1 and 0.9 per unit (pu) in rms voltage or current at the power frequency for durations of 0.5 cycle to 1 min. Typical values are 0.1 to 0.9 pu. Additionally, according to IEEE Standard 1159-2019, a voltage swell is an increase in rms voltage or current at the power frequency for durations from 0.5 cycles to 1 min. It is understood that IEEE Standard 1159-2019 is one standards body's (IEEE in this case) way of defining/characterizing power quality events. It is understood there are other standards that define power quality categories/events as well, such as the International Electrotechnical Commission (IEC), American National Standards Institute (ANSI), etc., which may have different descriptions or power quality event types, characteristics, and terminology. In some embodiments, power quality events may be customized power quality events (e.g., defined by a user or for a segment and/or application such as semi-conductor industries for example).

In some embodiments, the above-discussed systems and methods may include one or more of the following features either individually or in combination with other features in some embodiments. In some embodiments, at least one of the alarms is triggered in response to the electrical measurement data being above one or more upper alarm thresholds or below one or more lower alarm thresholds. An anomalous voltage condition, for example, which is one example type of power event, corresponds to a measured IED voltage being above one or more upper alarm thresholds or below one or more lower alarm thresholds.

In some embodiments, at least one of the alarms is additionally or alternatively triggered in response to multiple power events. For example, an alarm may be triggered in response to a sag and an interruption (or other group of power events) that occur over a particular time period. In another embodiment, many alarms may co-occur at the same time period (such, as for example, within a 10-minute time period) or in a sequence of events where alarms co-occur (aka "Incident", aka "Sequence of overlapping events (SooE)" as defined in patent application). In one case, we may have short bursts of alarms which may be very intense but not last. These would be considered "alarm spikes". An example would be one hundred twenty voltage sag alarms all occurring in less than one minute time duration. In another case, these overwhelming alarms may be considered "peak periods," which are characterized by a longer duration. Longer duration periods may be defined by fixed time periods (durations), for example, spanning three different 10-minute time periods, or having a duration of more than 20 minutes. Alternatively, they may occur dynamically and be derived from normal duration periods. For example, the system could be using the duration of $3^{rd}$ quantile multiplied by a factor of three to determine a "normal duration," and then classify events as peak periods when they last longer than a "normal duration." A typical example would be twenty-one voltage harmonics alarms lasting for 2 hours.

In some embodiments, discriminant characteristics may be identified in the aggregated information. Identifying the discriminant characteristics may include, for example, identifying breakpoints associated with any type of event (power events or other events as described earlier) and/or alarm periods, modeling each of the event and/or alarm periods, classifying each of the modeled event and/or alarm periods, and identifying discriminant characteristics in each of the modeled event and/or alarm periods. In some embodiments, the event and/or alarm periods may be identified based on detected changes in relevant data from the aggregated information. The breakpoints associated with the event and/or alarm periods may correspond to significant change points in the aggregated information separating one event and/or alarm period from a next event and/or alarm period of the event and/or alarm periods, for example.

In some embodiments, modeling each of the event and/or alarm periods, includes determining a best possible model for each of the event and/or alarm periods, and modeling each of the event and/or alarm periods based on the determined best possible model. The best possible model may be determined, for example, by comparing each event and/or alarm period of the event and/or alarm periods with a previous event and/or alarm period of the event and/or alarm periods. As one example, an impact of each event and/or alarm period on the electrical system may be compared with the impact of a previous event and/or alarm period on the electrical system to determine the best possible model. For example, a current day/real-time quantity of alarms/events may be determined to have many more alarms/events than any of the previous days over the past five years (or another period of time). Additionally, a current day may be determined to have a sequence of events (SoE) which is ten (or another multiple) times larger than a previous SoE group. Both could generate the action of triggering a diagnostic report, for example, showing the discriminant differences to help identify and focus on what is going wrong, or at a minimum where something is going wrong, or when the alarms/events started.

In some embodiments, each of the modeled event and/or alarm periods may be classified, for example, as stable, rising or dropping based on an analysis of the modeled event and/or alarm periods. Additionally, or alternatively, each of the event and/or alarm periods may be classified though curve fitting techniques, for example, using one or more statistical or machine learning algorithms to provide an enriched or finer model. The statistical or machine learning algorithms may model slope or slope variations of the event and/or alarm periods, for example. A simple median model (and many other models and/or modeling techniques) may be used. This may be leveraged in defining trends and in inferring prioritization of mitigation and/or remediation solutions.

In some embodiments, a relative criticality score of each of the identified discriminant characteristics may be determined, for example, to a process or an application associated with the electrical system. In some embodiments, the relative criticality score may be determined for a particular time period. The particular time period may be associated with one or more of the event periods and/or alarm periods, for example. In some embodiments, the relative criticality score is based on an impact of the identified discriminant characteristics to the process or the application over the particular time period. As one example, the impact of the identified discriminant characteristics may be related to tangible or intangible costs associated with the identified discriminant characteristics to the process or the application. In some embodiments, the relative criticality score may be used to prioritize responding to the identified alarms. In another embodiment, the relative criticality score may be determined based on the risk and/or measured impact and/or the possible or probable impact evaluation for the given segment, application, process, building or present load types of the site.

In some embodiments, the identified events and/or the identified alarms are enriched with the normal behavior profiles derived from waveform captures associated with the energy related signals and then are used as comparison for the discriminant dimensions identification and groupings, for example, using the waveform captures of normal operations (not triggered due to an abnormal condition), and the profiles derived which create "normal profiles" and store these in the digital repository. In some embodiments, these profiles may be linked to loads switching on/off or power consumption profiles as well as to other systems' status changes or processes. This provides context to the current application for more complete or more precise diagnostics, recommendations, actions, especially when impacting other systems. It also enriches the analysis and the interpretation of the alerts/events/alarms, as it provides additional contextual information (providing more meaning or help) to identify possible or probable sources. Examples may include using machine learning or other AI algorithms to identify the most probable source or combination of sources to explain a change in status or in a change of value.

Additional objects and advantages will be set forth in part in the description which follows, and in part will be obvious from the description, or may be learned by practice of the present disclosure. At least some of these objects and advantages may be realized and attained by the elements and combinations particularly pointed out in the disclosure.

It is to be understood that both the foregoing general description and the following detailed description are exemplary and explanatory only and are not restrictive of the invention, as disclosed.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
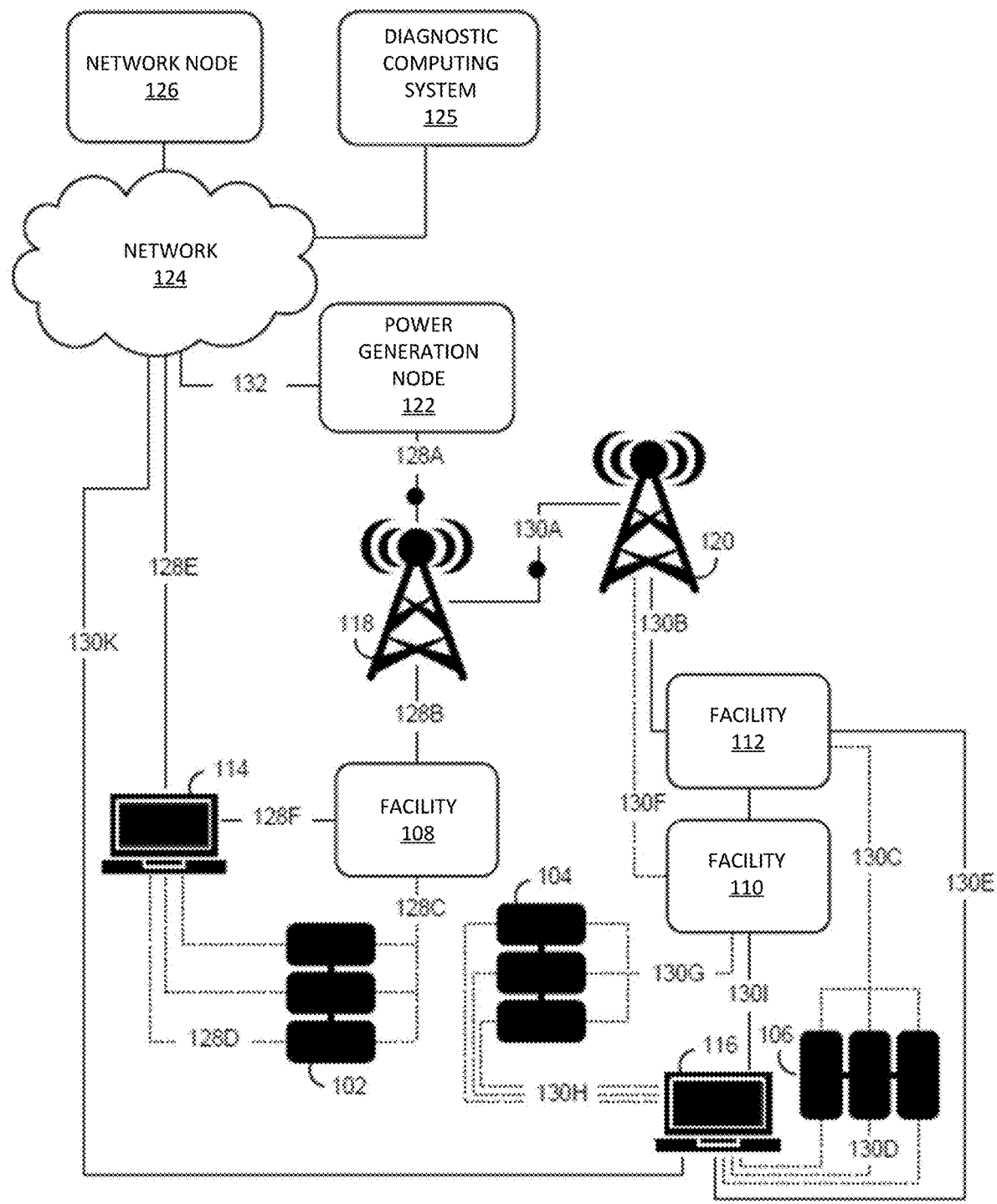
FIG. 1 shows an example network system architecture in accordance with embodiments of the disclosure.

Referring to FIG. 1, there is depicted a schematic view of an exemplary network system architecture configured to perform among other things intelligent event and/or alarm analysis and management. The architecture includes an electrical or power monitoring and control system, referred to herein as an EPMS, including one or more network nodes 126 and user devices 114 and 116 to monitor and control equipment or other devices 102, 104 and 106 of the facilities 108, 110 and 112. The network system architecture also includes an electrical or power system including a power generation node(s) 122 to supply power to the facilities 108, 110 and 112 across a power distribution network of a utility, e.g., power grids 118 and 120, and the facilities 108, 110 and 112. The facilities 108, 110 and 112 can be an automated industrial facility or include automated industrial equipment, or be a commercial building or university campus, as one example amongst many others. The systems and devices in the network architecture can use a local area network (LAN), wide area network (WAN), or internetwork (including the Internet) to communicate over a communication network 124. The communication network 124 can be a wired and/or wireless network that uses, for example, physical and/or wireless data links to carry network data among (or between) the network nodes.

Each network node 126 can include a computer system, such as an intelligent electronic device (IED), to sense, monitor, capture and analyze energy-related data on the electrical system. In accordance with the various embodiments, the IED can capture signal waveforms representative of voltage, current, power or other measurable electrical property on the electrical system, create power event profiles, perform event analysis to identify power events and additional information including alarms triggered in response to power events, and perform other operations as part of the systems and methods for managing smart alarms described herein. The IED can be a smart device such as a smart power meter or other power equipment, or be incorporated into or associated with a power meter or other power equipment on the electrical system. The architecture can include a plurality of IEDs arranged at different upstream and downstream positions in a hierarchical level or layer relationship on the electrical system (e.g., as shown in FIG. 1B, as will be discussed below) to monitor, derive or calculate, analyze and share energy-related information (e.g., measurement data, derived data, event data and additional information, results of event analysis, event profiles, etc.) at any desired position along the electrical system, including positions along the grid, between the utility and a facility, and within the facility. Each of the IEDs may be installed at a respective metering point or location of a plurality of metering points or locations in the electrical system (e.g., as shown in FIG. 1B, as will be discussed below).

In some embodiments, a user may view information about the IEDs (e.g., IED make, model, type, etc.) and data collected by the IEDs (e.g., energy usage statistics) using at least one of the user devices 114 and 116. Additionally, in some embodiments the user may configure the IEDs using at least one of the user devices 114 and 116. Each user device 114 and 116 can include a computing device, for example, a desktop computer, a laptop computer, a handheld computer, a tablet computer, a smart phone, and/or the like. Additionally, each user device 114 and 116 can include or be coupled to one or more input/output devices, for example, to facilitate user interaction with the IEDs (e.g., to view information about the IEDs).

In some embodiments, the EPMS may also include, or be communicatively coupled to, a diagnostic system 125 via the communication network 124. In some embodiments, the above-discussed IEDs and user devices 114 and 116 of the EPMS may be directly communicatively coupled to the diagnostic system 125. In other embodiments, the IEDs and user devices 114 and 116 may be indirectly communicatively coupled to the diagnostic system 125, for example, through an intermediate device, such as a cloud connected hub or a gateway. The cloud-connected hub (or the gateway) may, for example, provide the IEDs and the user devices 114 and 116 with access to the diagnostic system 125.

The diagnostic system 125 may be an example of a cloud computing system, or cloud-connected computing system. In embodiments, the diagnostic system 125 may be a server located within one or more of the facilities 108, 110 and 112, or may be a remotely-located cloud-based service. The diagnostic system 125 may include computing functional components similar to those of the IEDs is some embodiments, but may generally possess greater quantities and/or more powerful versions of components involved in data processing, such as processors, memory, storage, interconnection mechanisms, etc. The diagnostic system 125 can be configured to implement a variety of analysis techniques to identify patterns in received measurement data from the IEDs, as discussed further below. The various analysis techniques discussed herein further involve the execution of one or more software functions, algorithms, instructions, applications, and parameters, which are stored on one or more sources of memory communicatively coupled to the diagnostic system 125. In certain embodiments, the terms "function", "algorithm", "instruction", "application", or "parameter" may also refer to a hierarchy of functions, algorithms, instructions, applications, or parameters, respectively, operating in parallel and/or tandem. A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the diagnostic system 125 is connected to the cloud, it may access additional cloud-connected devices or databases (not shown) via the cloud. For example, the diagnostic system 125 may access historical measurement data previously received from the at least one IED, historical power event and/or alarm data, or other data that may be useful in analyzing current measurement data received from the at least one IED. In embodiments, the cloud-connected devices or databases may correspond to a device or database associated with one or more external data sources.

In embodiments, by leveraging the cloud-connectivity and enhanced computing resources of the diagnostic system 125 relative to the IEDs, sophisticated analysis can be performed on data retrieved from one or more IEDs, as well as on additional sources of data that may be received (e.g., from other devices in the electrical system, such as humidity and temperature sensors), when appropriate. This analysis can be used to dynamically control one or more parameters, processes, conditions or devices (e.g., 102, 104 and 106) associated with the electrical system.

In embodiments, the parameters, processes, conditions or equipment are dynamically controlled by one or more control devices of the EPMS. In embodiments, the control devices may correspond to, include, or be included one or more of the above-discussed IEDs, diagnostic system and/or other devices within or external to the electrical system.

It is understood that the network architecture shown in FIG. 1 is but one example network architecture of many potential network architectures that may be suitable for the systems and methods described herein. Any suitable network architecture may be used, which allows for communication and interaction between components of the EPMS (e.g., IEDs, diagnostic system, user devices, etc.), equipment or loads, facilities, etc. to perform the operations described herein. For example, the systems and methods herein, including but not limited to the identification of events (e.g., power events), and the identification of alarms triggered in response to the events, can be implemented through a cloud-based architecture via one or more network nodes.

Figure 1A:
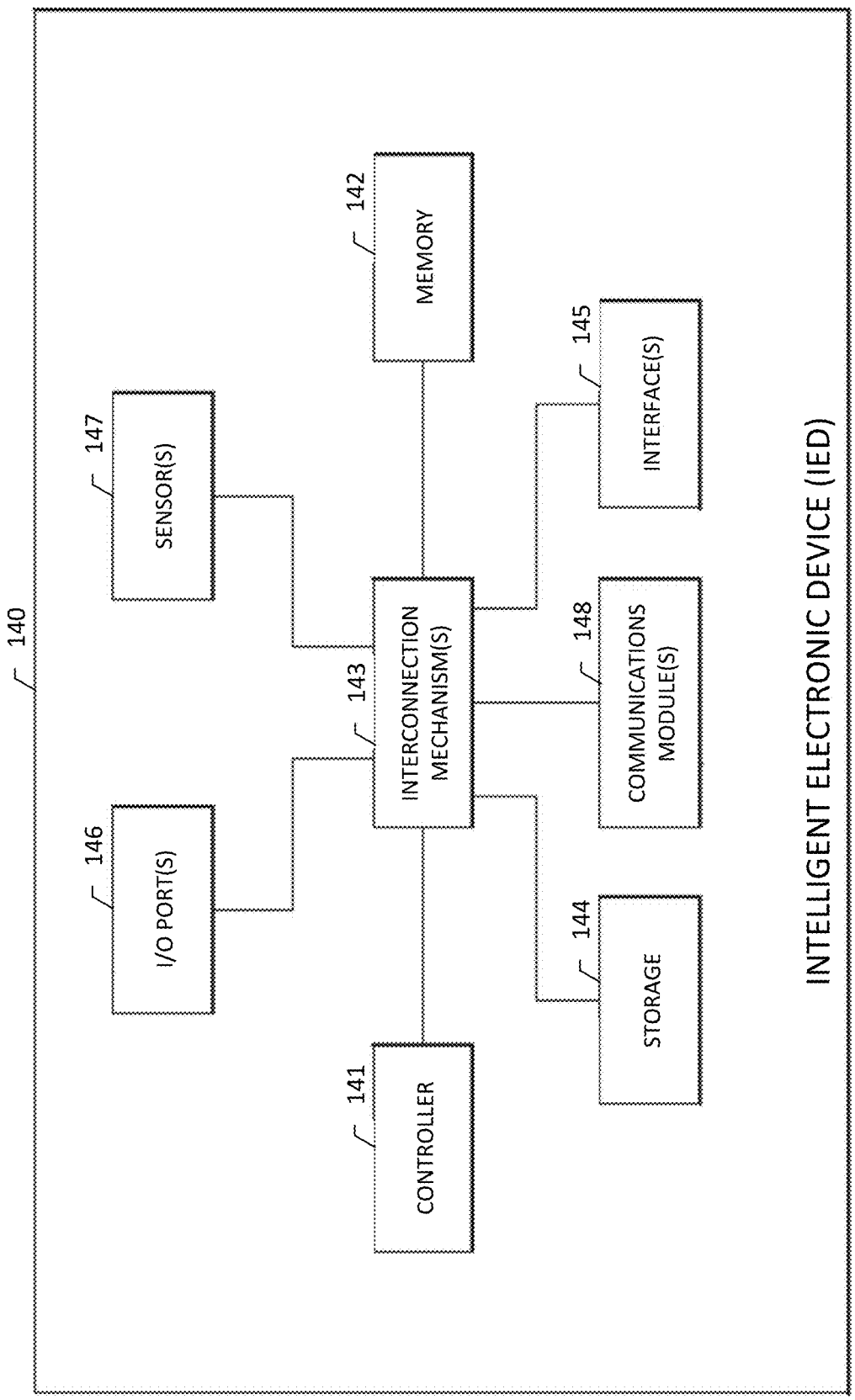
FIG. 1A shows an example intelligent electronic device (IED) that may be used in a network system in accordance with embodiments of the disclosure.
Figure 1B:
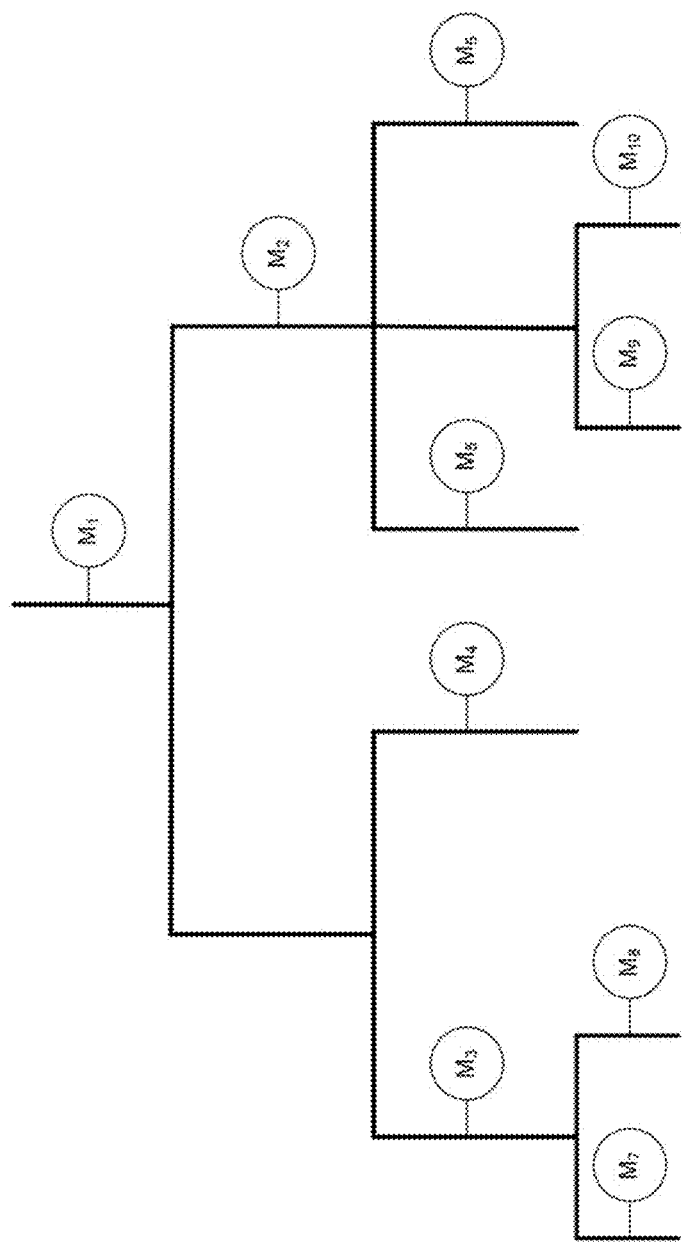
FIG. 1B shows an example configuration of IEDs in accordance with embodiments of the disclosure.

Referring to FIG. 1A, an example IED 140 that may be suitable for use in the network system architecture 100 shown in FIG. 1, for example, includes a controller 141, a memory device 142, storage 144, and an interface 145. The IED 140 also includes an input-output (I/O) port 146, a sensor 147, a communication module 148, and an interconnection mechanism 143 for communicatively coupling two or more IED components 141-148.

The memory device 142 may include volatile memory, such as DRAM or SRAM, for example. The memory device 142 may store programs and data collected during operation of the IED 140. For example, in embodiments in which the IED 140 is configured to monitor or measure one or more electrical parameters associated with one or more devices or loads in an electrical system, the memory device 142 may store the monitored electrical parameters (e.g., from energy-related signals captured or derived by the IED 140).

The storage system 144 may include a computer readable and writeable nonvolatile recording medium, such as a disk or flash memory, in which signals are stored that define a program to be executed by the controller 141 or information to be processed by the program. The controller 141 may control transfer of data between the storage system 144 and the memory device 142 in accordance with known computing and data transfer mechanisms. In embodiments, the electrical parameters monitored or measured by the IED 140 may be stored in the storage system 144.

The I/O port 146 can be used to couple loads (e.g., 111, shown in FIG. 1A) to the IED 140, and the sensor 147 can be used to monitor or measure the electrical parameters associated with the loads. The I/O port 146 can also be used to coupled external devices, such as sensor devices (e.g., temperature and/or motion sensor devices) and/or user input devices (e.g., local or remote computing devices) (not shown), to the IED 140. The I/O port 146 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the IED 140.

The communication module 148 may be configured to couple the IED 140 to one or more external communication networks or devices. These networks may be private networks within a building in which the IED 140 is installed, or public networks, such as the Internet. In embodiments, the communication module 148 may also be configured to couple the IED 140 to a cloud-connected hub, or to a cloud-connected central processing unit, associated with a network system architecture including IED 140.

The IED controller 141 may include one or more processors that are configured to perform specified function(s) of the IED 140. The processor(s) can be a commercially available processor, such as the well-known Pentium™, Core™, or Atom™ class processors available from the Intel Corporation. Many other processors are available, including programmable logic controllers. The IED controller 141 can execute an operating system to define a computing platform on which application(s) associated with the IED 140 can run.

In embodiments, the electrical parameters monitored or measured by the IED 140 may be received at an input of the controller 141 as IED input data, and the controller 141 may process the measured electrical parameters to generate IED output data or signals at an output thereof. In embodiments, the IED output data or signals may correspond to an output of the IED 140. The IED output data or signals may be provided at I/O port(s) 146, for example. In embodiments, the IED output data or signals may be received by a diagnostic system, for example, for further processing (e.g., to identify power events, as briefly discussed above in connection with FIG. 1), and/or by equipment (e.g., loads) to which the IED is coupled (e.g., for controlling one or more parameters associated with the equipment, as will be discussed further below). In one example, the IED 140 may include an interface 145 for displaying visualizations indicative of the IED output data or signals. The interface 145 may correspond to a graphical user interface (GUI) in embodiments.

Components of the IED 140 may be coupled together by the interconnection mechanism 143, which may include one or more busses, wiring, or other electrical connection apparatus. The interconnection mechanism 143 may enable communications (e.g., data, instructions, etc.) to be exchanged between system components of the IED 140.

It is understood that IED 140 is but one of many potential configurations of IEDs in accordance with various aspects of the disclosure. For example, IEDs in accordance with embodiments of the disclosure may include more (or fewer) components than IED 140. Additionally, in embodiments one or more components of IED 140 may be combined. For example, in embodiments memory 142 and storage 144 may be combined.

Referring to FIG. 1B, an example configuration (e.g., a hierarchical configuration) of IEDs such as IED 140 in an electrical system is shown. As discussed above, an electrical system typically includes one or more metering points or locations. As also discussed above, one or more IEDs may be installed or located (temporarily or permanently) at the metering locations, for example, to measure, protect and/or control a load or loads in the electrical system. In some instances, the IEDs may be part of or associated with an Electrical Power Monitoring System (EPMS). The EPMS may be responsible for monitoring and/or controlling the electrical system, for example.

The illustrated electrical system includes a plurality of metering locations (here, $M_1$, $M_2$, $M_3$, etc.). In embodiments in which the electrical system is a "completely metered" system, for example, at least one IED is installed at the first metering location $M_1$, at least one IED is installed at the second metering location $M_2$, and so forth. Connection 1 is a physical point in the electrical system where energy flow (as measured at $M_1$ by the at least one IED installed at $M_1$) diverges to provide energy to the left electrical system branch (associated with metering locations $M_3$, $M_4$, $M_7$, $M_8$) and the right electrical system branch (associated with metering locations $M_2$, $M_5$, $M_6$, $M_9$, $M_{10}$). In accordance with some embodiments of this disclosure, as will be discussed further below, the IEDs installed at the various metering locations (here, $M_1$, $M_2$, $M_3$, etc.) may share electrical measurement data from or derived from energy-related signals captured by or derived from the IEDs. The shared electrical measurement data may be used, for example, to identify power events in the electrical system, and to identify alarms triggered in response to the identified power events. For example, IEDs installed at metering locations $M_7$, $M_8$ may share electrical measurement data with an IED installed at metering location $M_3$ to identify power events at metering location $M_3$, and to identify alarms triggered in response to the identified power events at metering location $M_3$.

In the illustrated example, the IED installed at metering location $M_3$ is considered to be "upstream" from the IEDs installed at metering locations $M_7$, $M_8$. Additionally, in the illustrated example, the IEDs installed at metering locations $M_7$, $M_8$ are considered to be downstream relative to the IED installed at metering location $M_3$. As used herein, the terms "upstream" and "downstream" are used to refer to electrical locations within an electrical system. More particularly, the electrical locations "upstream" and "downstream" are relative to an electrical location of an IED collecting data and providing this information. For example, in an electrical system including a plurality of IEDs, one or more IEDs may be positioned (or installed) at an electrical location that is upstream relative to one or more other IEDs in the electrical system, and the one or more IEDs may be positioned (or installed) at an electrical location that is downstream relative to one or more further IEDs in the electrical system. A first IED or load that is positioned on an electrical circuit upstream from a second IED or load may, for example, be positioned electrically closer to an input or source of the electrical system (e.g., a utility feed) than the second IED or load. Conversely, a first IED or load that is positioned on an electrical circuit downstream from a second IED or load may be positioned electrically closer to an end or terminus of the electrical system than the other IED. The above-described first and second IEDs can record an electrical event's voltage and current phase information (e.g., by sampling the respective signals) and communicatively transmit this information to a diagnostic system (e.g., 125, shown in FIG. 1). The EPMS may then analyze the voltage and current phase information (e.g., instantaneous, root-mean-square (rms), waveforms and/or other electrical characteristics) to determine if the source of the voltage event was electrically upstream or downstream from where the first and/or second IEDs are electrically coupled to the electrical system (or network), for example, to determine a direction of a power event (i.e., upstream or downstream).

It is understood that the above-discussed configuration or arrangement of IEDs is but one of many potential configurations of IEDs in an electrical system.

Figure 2:
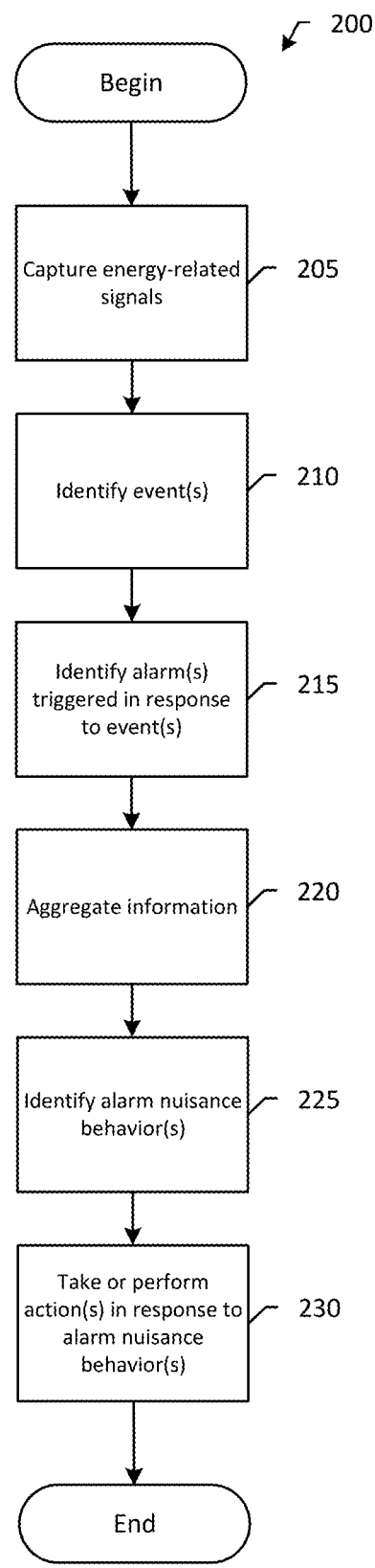
FIG. 2 shows an example method for reducing alarm nuisance behaviors in an electrical system in accordance with embodiments of the disclosure.

Referring to FIG. 2 and figures below, several flowcharts (or flow diagrams) are shown to illustrate various methods of the disclosure. Rectangular elements (typified by element 205 in FIG. 2), as may be referred to herein as "processing blocks," may represent computer software and/or IED algorithm instructions or groups of instructions. Diamond shaped elements, as may be referred to herein as "decision blocks," represent computer software and/or IED algorithm instructions, or groups of instructions, which affect the execution of the computer software and/or IED algorithm instructions represented by the processing blocks. The processing blocks and decision blocks can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including sequential blocks performed simultaneously and vice versa. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with providing electrical system analytics sought to be protected by this disclosure.

Systems and Methods for Reducing Alarm Nuisance Behaviors in an Electrical System Referring to FIGS. 2-5, shown are example figures relating to systems and methods for reducing alarm nuisance behaviors in an electrical system. In accordance with various aspects of this disclosure, an important analysis is alarms nuisance behavior identification. As is known by one knowledgeable in the art, as well as by anyone working with alarms, and described with high level definitions in American National Standards Institute (ANSI)/International Society of Automation (ISA) 18.2 "Management of Alarm Systems for the Process Industries" dedicated to alarms management in manufacturing, nuisance behavior of alarms may be detected and remediation put into place for correct operations. Alarm nuisance behaviors tend to overwhelm users and/or clutter understanding and analysis, by swamping them during alarm floods or periods where some alarms may rapidly reoccur (chattering behavior alarms), or short duration reoccurring alarms (fleeting) or with long-standing alarms (stale behavior alarms), for example.

These nuisance behavior alarms become very "noisy" (e.g., when a user sees hundreds of alarms coming in within a brief period such as within one minute of observation) and make it increasingly difficult or even impossible for a human observer or any user of the alarms system to discern what is important, what is new, what is changing, or what is a co-occurring alarms pattern. This noise level may even increase in a cumulative way, reducing the effectiveness (and thus, value) of an alarm system as each new problem adds to the previous non-resolved issue, if the former was not addressed immediately or as soon as possible (before next new type of issue appearance or reoccurrence of a known pattern).

The disclosed systems and methods provide techniques for automated nuisance analysis to process vast amounts of events and alarms data to reduce nuisance alarms behaviors, which may provide relevant diagnostics, recommendations and potential corrective actions of such alarm nuisance behaviors. This should in turn help analyze alarms by reducing noisy behaviors and helping users focus and prioritize the real issues needing to be resolved. For example, a maintenance engineer may use events and alarms nuisance analysis to reduce the quantity of stale alarms that may have been generated by the communication losses of events data due to unreliable Wi-Fi communication or power losses in gateways before a signal was received by the alarms system and stored correctly in the alarms data base.

Today, a maintenance engineer may be exposed to overwhelming quantity of alarms (e.g., a real case of over 500 alarms in 2 seconds). Using the disclosed systems and methods, operational safety, response time, recovery time and/or efficiency may be improved. Detrimental effects from power quality issues or other undesirable conditions on the electrical/power system or facilities may also be constrained. Additionally, the quality of mitigation and remediation activities may be improved due to faster identification of an issue's cause. This reduction of alarm nuisance behavior may, for example, help a maintenance engineer correctly focus on the impact analysis and reduce the data clutter associated with events or post-incident analysis of related events data and alarms data.

Referring now to FIG. 2, a flowchart illustrates an example method 200 for reducing alarm nuisance behaviors in an electrical system. The method 200 may be implemented, for example, on a processor of at least one IED (e.g., 121, shown in FIG. 1A) in the electrical/power system, a processor of a diagnostic system (e.g., 125, shown in FIG. 1) in the electrical/power system, and/or remote from the at least one IED and the diagnostic system, e.g., on a cloud computing device. The at least one IED, the diagnostic system and/or other devices on which the method 200 may be implemented may be included, or associated with, an EPMS in the electrical/power system, as discussed above in connection with FIG. 1, for example.

As illustrated in FIG. 2, the method 200 begins at block 205, where energy-related signals (or waveforms) are captured or derived by at least one IED in the electrical/power system. The at least one IED may be installed or located (temporality or permanently) at respective metering location in the electrical/power system, and the energy-related signals may be associated with the respective metering location (or one or more loads installed at the respective metering location). In some embodiments, the respective metering location may be a respective metering location of a plurality of metering locations in the electrical/power system, for example, in embodiments in which the at least one IED includes a plurality of IEDs. In these embodiments, the energy-related signals may be captured or derived by the plurality of IEDs at each of the respective plurality of metering locations. For example, a first one of the IEDs may be installed or located at a first metering location in the electrical/power system (e.g., $M_1$, shown in FIG. 1B), and the energy-related signals captured by the first IED may be captured at the first metering location, or derived from measurements taken at the first metering location. Additionally, a second one of the IEDs may be installed or located at a second metering location in the electrical/power system (e.g., $M_2$, shown in FIG. 1B), and the energy-related signals captured by the second IED may be captured at the second metering location, or derived from measurements taken at the second metering location.

The energy-related signals measured or derived by the at least one IED may include, for example, at least one of: voltage, current, energy, active power, apparent power, reactive power, harmonic voltages, harmonic currents, total voltage harmonic distortion, total current harmonic distortion, harmonic power, individual phase currents, three-phase currents, phase voltages, and line voltages as a few examples. It is understood that other types of energy-related signals may be captured or derived by the at least one IED (e.g., alarm signals or indications related to activities on the electrical system or from the EPMS). Further examples of energy-related signals are discussed in the Summary section of this disclosure, for example.

At block 210, electrical measurement data from or derived from the energy-related signals captured or derived by the at least one IED at block 205, is processed (e.g., on the at least one IED, on the diagnostic system, and/or remote from the at least one IED and the diagnostic system to identify events in the electrical/power system. The identified events may be associated with the metering location(s) in which the at least one IED is installed, a load or loads (e.g., 102, 104, 106, shown in FIG. 1) monitored by the at least one IED, and/or other portions (e.g., remote portions) or devices of the electrical/power system, for example.

In accordance with some embodiments of this disclosure, the identified events include power events and/or events capable of triggering protection devices (e.g., protection relays). For example, the identified events may include tripping a motor offline in different fault cases including: thermal stress, single-phasing, ground/earth faults, short circuits, locked rotors, excessive duty cycles, bearing failures, undervoltage conditions or harmonics causing breakers to trip offline, overcurrent events, etc. Power events may include power quality events, for example. In embodiments in which the power events include power quality events, identifying the events at block 210 may include identifying power quality event types of the of the power events. The power quality event types may include, for example, at least one of: a voltage sag, a voltage swell, a voltage or current transient, a temporary interruption, sustained interruption, and voltage or current harmonic distortion as a few examples. It is understood that other types of events may be identified. The other types of events may include, for example, manufacturing process(es) or load-related event(s) detected and signaled by manufacturing equipment via I/O signal or SCADA system, HVAC-related event(s), including user over-ride settings of BMS, overcurrent, peak demand, low or leading power factor, I/O input(s) indicating a change on or related to the electrical system.

Identifying the events may additionally or alternatively include identifying a magnitude(s) of the events, a duration(s) of the events, a location(s) of the events in the electrical/power system, and/or other information that may be helpful for identifying alarms (i.e., smart alarms) triggered in response to the identified events, as will be discussed further below. In some embodiments, the magnitude(s), duration(s), location(s) and/or other information may be determined based on electrical measurement data from or derived from energy-related signals captured or derived by a plurality of IEDs, for example, in embodiments in which the at least one IED includes a plurality of IEDs located at a respective plurality of metering location in the electrical/power system. For example, the plurality of IEDs may share the energy-related signals captured or derived by the plurality of IEDs with select ones of the plurality of IEDs (or the EPMS), and the shared energy-related signals may be used to determine the magnitude(s), duration(s), location(s) and/or other information associated with the identified event. This may include determining differences between the distinct measured levels of disturbances of events (e.g., the magnitude or duration) propagating through the electrical/power system as this may be inferred from the energy-related signals and the location of each IED. In some embodiments, the energy-related signals captured or derived by the plurality of IEDs may be stored on a memory device associated with the plurality of IEDs, on a memory device associated with a diagnostic system, and/or on another memory device depending on the implementation of the method 200 (e.g., on the at least one IED, on the diagnostic system, and/or on another device or system).

In one example implementation, each IED of the at least one IED may measure voltages and current per phase and derive additional measurements from these (such as frequency, power, power factor, reactive power, voltage harmonics, current harmonics, etc.). Based on any combination of these measurements, events may be detected, for example, when a threshold is crossed (e.g., a voltage sag is detected when the voltage drops below 10% of nominal voltage). An event generates a collection of event data, characterizing the event. Typically, events will have common data such as "duration" or the "impacted phases." Other data (e.g., "magnitude", "worst phase", "unbalance", "voltage THD", etc.) may be more specific to the type of event.

At block 215, it is determined if any alarms have been, should be, or should have been triggered in response to the identified events (e.g., power events) in or associated with the electrical system. In some embodiments, alarms may be triggered (e.g., automatically, or semi-automatically) in response to the identified events. For example, a load monitored by an IED in the electrical/power system may have an upper alarm threshold and/or a lower alarm threshold, and an alarm (or alarms) may be triggered in response to voltage and/or current signals captured by the IED, e.g., at block 205, being above the upper alarm threshold and/or below the lower alarm threshold. An anomalous voltage condition, for example, which is one example type of power event, corresponds to a measured IED voltage being above one or more upper alarm thresholds or below one or more lower alarm thresholds. In some embodiments, an alarm (or alarms) may be triggered in response to the anomalous voltage condition. In some embodiments, the upper alarm thresholds and the lower alarm thresholds, e.g., associated with anomalous voltage condition and/or other power events, align with a recommended operational range of one or more loads, processes, and/or systems monitored by the IEDs in the electrical/power system.

An alarm trigger may result in one or more portions (e.g., loads) of the electrical/power system being controlled, e.g., automatically by the IED, diagnostic computing device, and/or other system(s) or device(s) on which the method 200 is implemented. For example, an alarm trigger may result in a load monitored by the IED being adjusted (e.g., turned off, or having one or more parameters adjusted).

Additionally, or alternatively, an alarm trigger may result in a notification or alert indicting the alarm being sent to one or more devices or systems of the EPMS, for example. In some embodiments, the EPMS, or a user of the EPMS, may take an action (or actions) in response to the notification or alert. Example actions may include controlling the above-mentioned one or more portions of the electrical/power system, or delaying, changing the sequence or even postponing a process in another system (e.g., in a Power SCADA system, or in a building management system, or in a manufacturing SCADA system, are but few examples). It is understood that other actions may, of course, be performed.

In one example implementation, based on the events detected, an alarm may be triggered either on the same thresholds or on different thresholds, customized for the installation. For example, one site, part of a site, or even one IED may be configured to generate alarms only if a voltage sag impacted the system, leveraging the loss of load value (as described in another invention by the inventor). The at least one IED may send/store the events data as timestamped events data. This means that the data may receive a timestamp of the exact time of detection of the event and/or the alarm. This may include the beginning of an event, any significant change or most significant value such as the worst magnitude, or a change from a "phase AB voltage sag" to a "phase AB and Phase AN voltage sag", as well as the dropout timestamp of an event (such as for example when all the voltage levels are back within the +/−10% nominal voltage levels).

In addition to the events/alarms data, the at least one IED may also capture waveforms data. This may enable and enhance further analysis and visualization of the events/issues. In addition, regular interval logged values may also be used to describe the statistical context of each event/alarm. For example, this may include leveraging measurements captured for each 10- or 15-minutes regular interval, such as for illustration purposes, the median and/or average voltage levels, the minimum and maximum voltage level per phase, the mean and/or average and/or minimum and/or maximum power. It is understood that other data may be captured and leveraged in this invention, such as data related to the device (e.g., device settings such as thresholds to trigger events and alarm detections, whether or not a waveform is captured), other data related to the electrical system and installation (e.g., the electrical single-line diagram, descriptions loads, nameplate information, infrastructure equipment, etc.), data describing the types of loads monitored by an IED (e.g., lighting, HVAC), the physical location (e.g., GPS coordinates, address, site, building, floor, impedance, etc.), I/O data, PLC data, and data related to process and control systems (e.g., a building management system or a manufacturing SCADA system).

At block 220, select information is aggregated. For example, in one example implementation, information relating to the identified events and the identified alarms may be aggregated (e.g., quantity of daily events or alarms, quantity of groups of time-wise-overlapping events, impact on the downstream loads, etc.). The information relating to the identified events and the identified alarms may be aggregated as a quantity (i.e., block 301), for example, for a particular time period or interval, e.g., quarterly (i.e., block 302), as shown by plot 300 in FIG. 3A, as will be described further below, or hourly, weekly, monthly, etc. Additionally, or alternatively, the information relating to the identified events and the identified alarms may be aggregated based on event type, alarm type, IED type, load type, metering location(s), alarm criticality a particular process or application, etc. The aggregated information may indicate a quantity (or frequency(s)) of occurrences of an event and/or alarms for a particular time period. Additionally, the aggregated information may indicate a quantity (or frequency(s)) of occurrences of an event and/or alarms based on the event type, alarm type, IED type, load type, metering location(s), etc.

Figure 3A:
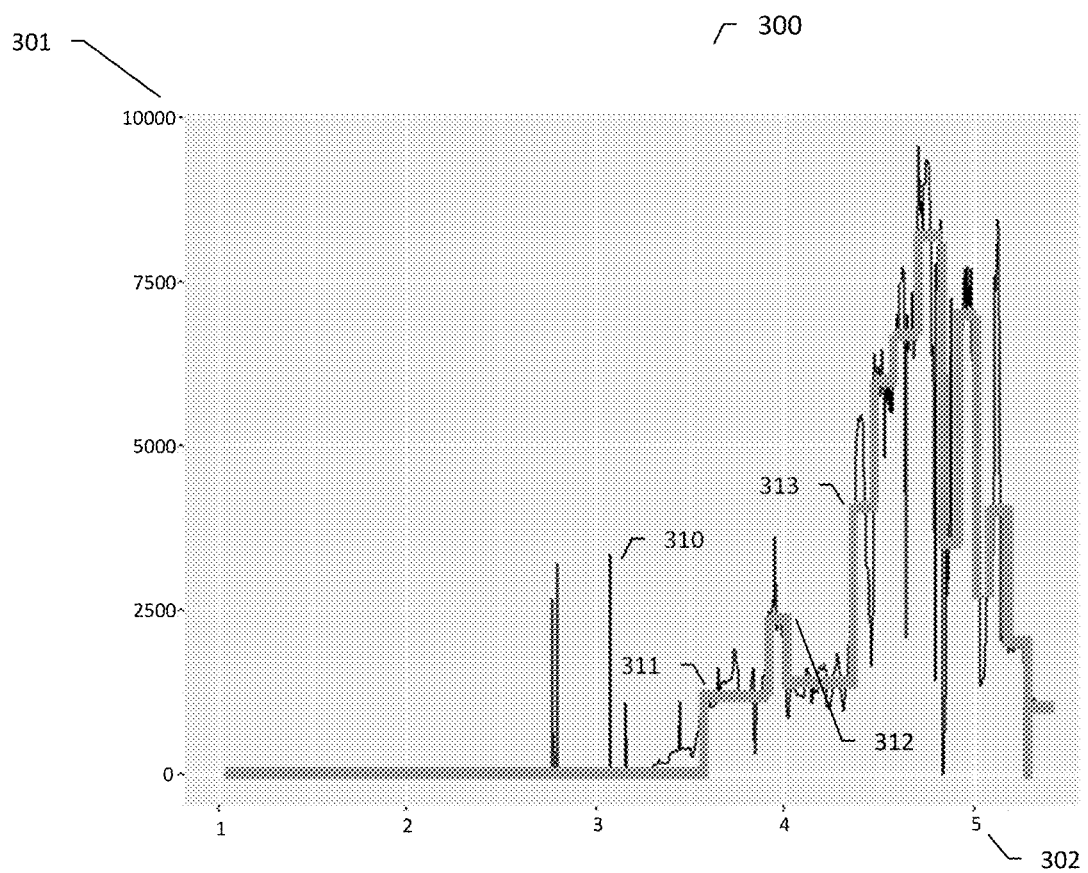
FIG. 3A illustrates an example plot of aggregated information that may be generated in accordance with embodiments of the disclosure.
Figure 3B:
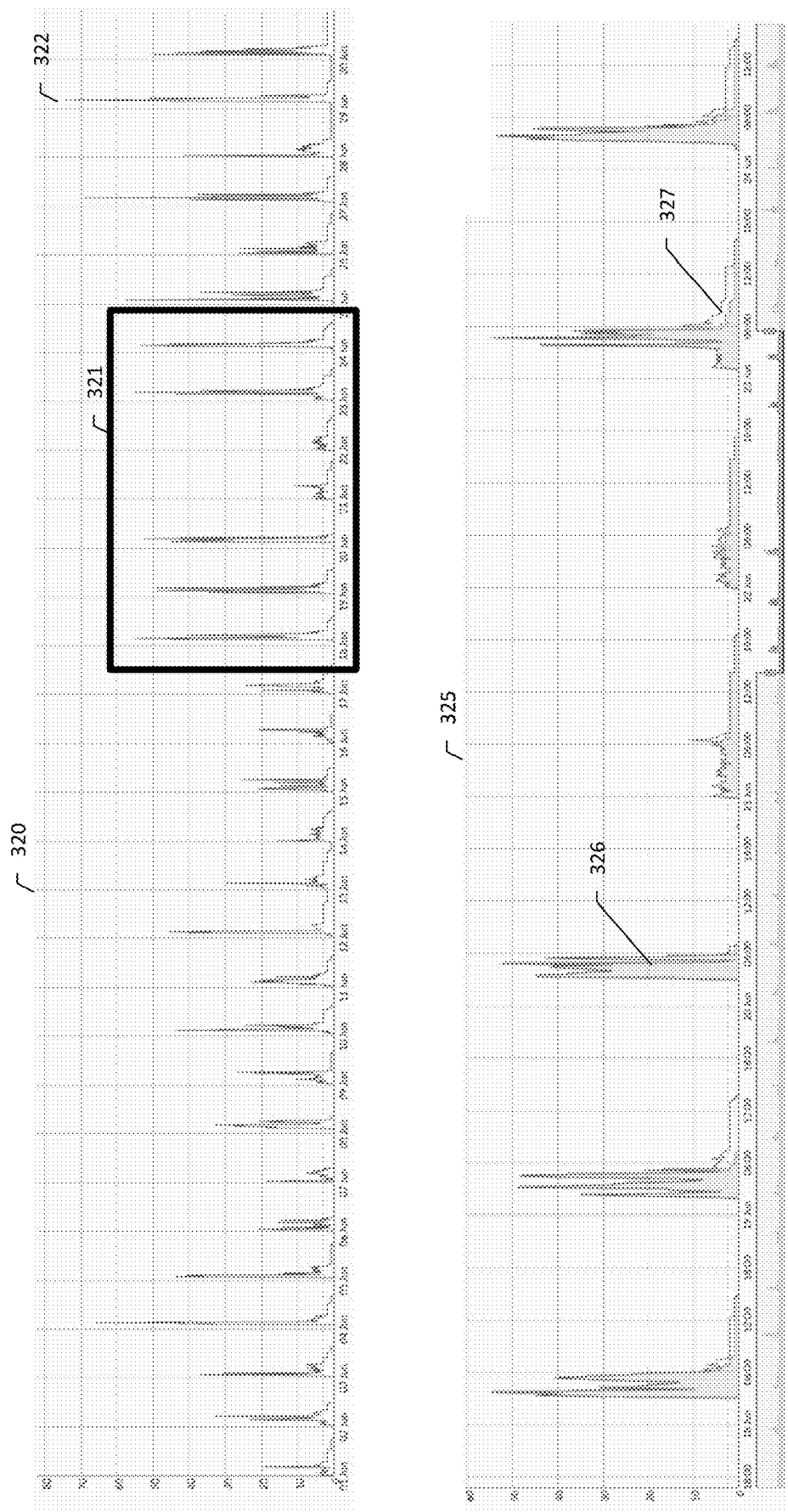
FIG. 3B illustrates chattering alarm nuisance behavior in accordance with embodiments of the disclosure.

As one example, the aggregated information may include an aggregated quantity (or count) of events and/or alarms for a day, as shown in FIG. 3A. The aggregated sum may, for example, indicate or be interpreted to determine whether the quantity of events and/or alarms is within acceptable limits. Additionally, in some cases, the aggregated sum may indicate whether an operator of a facility (e.g., 108, 110, 112, shown in FIG. 1) with the at least one IED capturing or deriving energy-related signals has lost, or is at risk of losing, control of the alarms in the facility (e.g., due to the aggregated sum being above an acceptable threshold). As one example, an aggregated sum of hundreds of alarms over a one-day period may indicate the facility operator has lost control of the facility's events/alarms. In some embodiments, the aggregated information (and the aggregated sum) may be stored on a memory device associated with the at least one IED, EPMS, and/or other system(s) or device(s) on which the method 200 is implemented.

As apparent from discussions above, in some embodiments the aggregated information may be plotted, as illustrated by plot 300 shown in FIG. 3A. However, it is understood that in some embodiments the aggregated information does not need to be plotted or otherwise visualized. In embodiments where aggregated information is plotted, the plot may be presented, for example, on a display device of a user device (e.g., 114, shown in FIG. 1) and/or a display device of another device of or associated with the EPMS and/or included in a report and/or a notification sent to a user.

FIG. 3A illustrates how events and/or alarms may evolve to become out of control and impact alarm the health of an electrical/power system. For example, as shown in FIG. 3A, before quarter 1, there are very long time periods where almost nothing is detected; neither event nor alarm (this can be the case just after commissioning a site). Within quarter 1, there may be long periods where alarms or events may appear sparsely while most of the 10 minutes time periods or even days have no event or alarm. At quarter 2 (and 310), the system changes. New loads are installed, the power system and its operation may evolve with modifications (e.g., within the manufacturing plant or its processes, changing an HVAC rooftop unit, etc.) and extensions of the site may be implemented (e.g., the addition of a warehouse, the addition of a new process to extend production capacity, etc.), maintenance teams make changes due to the appearance of issues or as preventive actions. This becomes visible as the quantity of alarms begins to rise (e.g., frequency of occurrences and quantity of alarms increases).

At quarter 3 (and after 311), it may be observed that the users are losing control of their quantity of alarms; the quantities do not return to 0. This may have many different causes. For example, the maintenance manager or some key expert with understanding and who maintains the power system is no longer managing the EPMS (e.g., retired, relocated, new job). The replacement may not understand the site's loads, equipment, processes, systems, EPMS, etc., so there may not be a good understanding of the alarm causes. At this point, alarms may begin to accumulate (e.g., a high THD may become a new normal, voltage unbalances may not be addressed, voltage sags may be caused by new motors) and the alarm health may deteriorate as illustrated at block 313.

It is understood that above-discussed example types of aggregated information (e.g., events and alarms) and illustration are just a few of many possible exemplary types of aggregated information that may be aggregated at block 220 in accordance with embodiments of this disclosure. For example, in accordance with some embodiments of this disclosure, the aggregated information may further include information from at least one of: an Electrical Power Monitoring System (EPMS), a SCADA system (e.g., Power SCADA, Manufacturing SCADA), a building management system (BMS), I/O devices, and system users (e.g., user-initiated actions). As noted earlier in this disclosure, in some instances the EPMS may include the at least one IED responsible for capturing or deriving the energy-related signals (e.g., at block 205 of method 200).

At block 225, the aggregated information is analyzed to identify at least one alarm nuisance behavior. More particularly, at block 225, the aggregated information is analyzed to generally determine if one or more portions or segments of the aggregated information includes behaviors indicative of alarm nuisance behavior. In accordance with some embodiments of this disclosure, the behaviors indicative of alarm nuisance behavior may include behaviors indicative of at least one predefined or prescribed alarm nuisance behavior, user-defined alarm nuisance behavior, or learned alarm nuisance behavior.

In one aspect of this disclosure, the predefined or prescribed alarm nuisance behavior is defined based, at least in part, on good engineering practices, thresholds defined during one of the typical steps of alarms ISA 18.2 "audit and philosophy loop" (A, B, C, D, H, I, J) or at commissioning of a site (in absence of a formal process such as recommended by ISA 18.2 this may be equated to steps A to E) or prescribed (e.g., data centers built in new projects, updates of procedures, re-implementing prescribed thresholds from previous installations). Additionally, in one aspect of this disclosure, the user-defined alarm nuisance behavior is alarm nuisance behavior as defined by a system user, operator, etc. For example, a user may define an 8-hour duration of alarm to be considered a "stale alarm" in one segment or specific site. In another site, a user may use a 24-hour duration of alarm to be considered as a "stale alarm." The rational would be that in the first case there may be 3 different work shifts, and any alarm longer than a single shift would be considered as a "stale alarm" (i.e., if unresolvable or unprocessed within one shift). In the second case, only one team maintains the system, so 24 hours is the normal working day duration for this site. Further, in one aspect of this disclosure, the learned alarm nuisance behavior is learned from at least one of: system users, and I/O systems and devices (e.g., over a learning period). For example, in one application the users of the EPMS may use a mobile application enabling the tagging of alarms as nuisance behaviors (e.g., based on the understanding of their manufacturing process). The system may then apply a filter in a visualization on alarms displaying the nuisance behavior (illustrated in FIG. 3 at block 312).

It is understood there could be many variables and measurements that may be leveraged for learning. For example, the "time to acknowledge an alarm" could be leveraged by the system as a metric to determine when a flood period is reached. The idea is to detect the threshold (e.g., number of alarms within one 10-minute interval) after which the users cannot keep previous normal metrics. For example, the system may infer a normal "time to acknowledge an alarm," ranging between 10 minutes and 1 hour. The system may calculate a model of the relationship between the number of alarms and the time to acknowledge (e.g., leveraging a multi-segmented regression curve). The system may then detect the inflection point between two of the segments of the regression lines using machine learning algorithms (e.g., the R package segmented), for example. The is breakpoint or inflection point may be used to detect flood nuisance behavior. The system may iterate until the inferred threshold of number of alarms is considered significant and repetitive. In some embodiments, this threshold could be dynamic, considering improvements and further degradations. The threshold may also be tuned to the work shift or team, for example. Other possible variables and measurements may include time related (e.g., the "time to identify issue," "time to define mitigation action," etc.) or user defined variables and measurements (e.g., user pushing a button when overwhelmed by alarms).

In some instances, the at least one predefined or prescribed alarm nuisance behavior, user-defined alarm nuisance behavior, or learned alarm nuisance behavior is based, at least in part, on customer type/segment (e.g., retail, offices, hotels, hospitals, data centers, food and beverages, oil and gas, etc.). More particularly, since each customer type/segment has its own unique configurations, requirements, and constraints, the at least one predefined or prescribed alarm nuisance behavior, user-defined alarm nuisance behavior, or learned alarm nuisance behavior may not necessarily be the same for different customer types/segments. Rather, the at least one predefined or prescribed alarm nuisance behavior, user-defined alarm nuisance behavior, or learned alarm nuisance behavior may need to be calibrated, configured and/or learned differently for different customer types/segments in some instances. For example, reactivity in a data center is much more critical than in an office building. Therefore, the duration of a stale nuisance alarm may be 24 hours in an office building. In contrast, the duration of the stale nuisance alarm may only be 3 hours in a data center.

Additional aspects relating to identifying, defining, characterizing, quantifying, etc. the at least one alarm nuisance behavior will be further appreciated from discussions in connection with block 230 and figures below.

It is understood that in some instances, the information analyzed at block 225 (i.e., the above-discussed aggregated information) may be further evaluated to identify additional situations, issues, concerns, or conditions (i.e., beyond identifying alarm nuisance behaviors). For example, the aggregated information may be analyzed to identify lost or incomplete data (e.g., due to IED cycling of control power) and its impact on the at least one identified alarm nuisance behavior and/or on the process of identifying the at least one alarm nuisance behavior. For example, the system may run an analysis to identify the consistency of the alarm type with the detected stale alarm nuisance behavior for stale nuisance alarms. There are definitions of alarm type that cannot be stale alarms. For example, a voltage sag may be defined as a maximum duration of event of 1 minute. If the IED had not detected the dropout of the event within maximum 1-minute duration, the IED would have changed the alarm type and label to another type of power quality event (e.g., an undervoltage). The event type provided by the IED is an important to detect incorrect stale alarm nuisance behavior and to enable the system remediation or mitigation actions (e.g., filtering this stale alarm in one implementation, supplementing the maximum real duration related end missing end timestamp to provide a data quality confidence level for the supplemented timestamp). This specific example will be described more in detail in later sections.

It is also understood that in some instances, the information analyzed at block 225 may be analyzed automatically or dynamically (i.e., without a user triggering the analysis), semi-automatically (e.g., with a user-defined trigger or condition), or manually (e.g., in response to user input), for example, based on predefined settings or user-configured preferences.

Subsequent to block 225, at least one action may be taken or performed at block 230 based on or in response to the at least one identified alarm nuisance behavior. For example, as will be discussed further in connection with figures below, in some instances the at least one action taken or performed may include characterizing and/or quantifying the at least one identified alarm nuisance behavior. Additionally, in some instances the at least one action taken or performed may include at least one action to improve alarm health, for example, in embodiments in which the at least one identified alarm nuisance behavior is an indication of suboptimal alarm health.

Subsequent to block 230, or subsequent to block 225 in instances in which no alarm nuisance behavior(s) are detected at block 225, the method may end, return to block 205, or one or more actions may be taken. For example, in embodiments in which it is desirable to continuously, or semi-continuously, or periodically capture energy-related signals and to dynamically analyze these captured energy-related signals for identifying alarm nuisance behaviors, the method may return to block 205 (e.g., for capturing and analyzing further energy-related signals). Alternatively, in embodiments in which it is desirable to analyze a single set of captured energy-related signals, for example, the method may end or one or more actions may be taken. Example actions may include storing, displaying and/or analyzing the previously captured or derived energy-related signals. Other exemplary actions may be appreciated from further discussions below. In embodiments in which the method ends after block 230 (or block 225), the method may be initiated again in response to user input and/or a control signal (e.g., timer/clock), for example.

It is understood that method 200 may include one or more additional blocks in some embodiments. Other example aspects, features and variations of the disclosed invention will be appreciated from discussions below.

Figure 4:
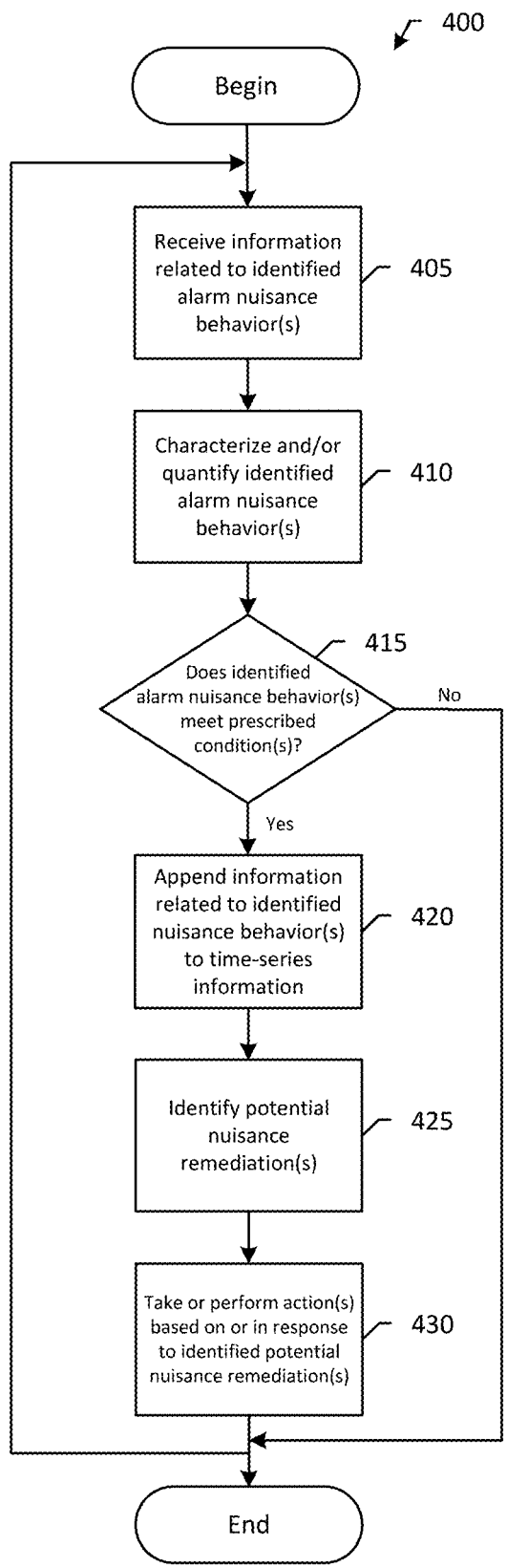
FIG. 4 shows an example method for analyzing and taking actions in response to identified alarm nuisance behaviors in accordance with embodiments of the disclosure.

Referring to FIG. 4, a flowchart illustrates an example method 400 for analyzing and taking actions in response to identified alarm nuisance behaviors. In accordance with some embodiments of this disclosure, method 400 is illustrative of example steps that may be performed in connection with method 200 discussed above in connection with FIG. 2. For example, in one example implementation, one or more steps of method 400 may correspond to example steps that may be performed at block 230 of method 200 subsequent to the at least one alarm nuisance behavior being identified at block 225 of method 200. Similar to method 200, method 400 may be implemented on a processor of at least one IED (e.g., 121, shown in FIG. 1A) in the electrical/power system, a processor of a diagnostic system (e.g., 125, shown in FIG. 1) in the electrical/power system, and/or remote from the at least one IED and the diagnostic system.

As illustrated in FIG. 4, the method 400 begins at block 405, where information related to at least one identified alarm nuisance behavior is received. The information received may include, for example, information associated with identifying the at least one alarm nuisance behavior at block 225 of method 200. For example, the information received may include the aggregated information (e.g., event and/or alarm information) from block 220 of method 200 that was used to identify the at least one alarm nuisance behavior at block 225.

At block 410, the at least one identified alarm nuisance behavior is characterized and/or quantified based on the information received at block 405.

In accordance with embodiments of this disclosure, assorted metrics may be detected or derived per detected nuisance behavior of the at least one identified alarm nuisance behavior. For example, metrics may be detected or derived for each IED of the at least one IED and for each alarm type detected per IED, similar to the following example metrics:
quantity of alarms for period,
quantity of alarms per interval when nuisance behavior occurs,
$80^{th}$, $90^{th}$, $95^{th}$, $98^{th}$ percentile of duration, duration to next alarm,
extreme values distribution (e.g., what is magnitude, unbalance, etc.),
etc.

In accordance with some embodiments of this disclosure, relevancy depends on the type of nuisance behavior and on the event and/or alarm types. For example, in some instances any measurement used for detecting/identifying the event (e.g., at block 210 of method 200) may produce a nuisance alarm. Consequently, the setting may sometimes be incorrectly defined and the thresholds are may be too low or too high to capture events and alarms, when in reality either none exist or are non-impacting. This is typically a place where knowing the segments and the related types of loads helps to identify nuisance events and/or alarms because there is no likely impact to load(s) at this site.

More detailed aspects relating to characterizing and/or quantifying the at least one identified alarm nuisance behavior are discussed further in connection with figures below (e.g., FIG. 5). However, let it suffice here to say that in addition to or instead of the above, the characterization and/or quantification may include grouping the at least one identified alarm nuisance behavior into one or more of a plurality of: predefined or prescribed alarm nuisance behaviors, user-defined alarm nuisance behaviors, or learned alarm nuisance behaviors.

At block 415, subsequent to characterizing and/or quantifying the at least one identified alarm nuisance behavior, it is determined whether the at least one identified alarm nuisance behavior meets at least one prescribed condition. More particularly, information related to the characterizing and/or quantifying of the at least one identified alarm nuisance behavior is analyzed to determine if the at least one identified alarm nuisance behavior meets the at least one prescribed condition. Prescribed conditions may include, for example, a minimal quantity of occurrences of the at least one identified alarm nuisance behavior over a given analysis period for the at least one identified alarm nuisance behavior to be considered a nuisance behavior for purposes of future analysis. In one example implementation, the step occurring at block 415 include a filtering step. For example, one simple reoccurrence (or another select quantity of occurrences or reoccurrences) may not be considered a nuisance behavior. In accordance with some embodiments of this disclosure, this type of behavior may be filtered or removed from the data set, including the at least one identified alarm nuisance behavior.

A single occurrence may be valid for stale alarms. For example, 10 stale alarms, present over longer periods such as hours, or even days and weeks, will become a baseline of alarms when present, and as such will not need to reoccur multiple times to be designated as nuisance behavior. As for alarm floods, even if only one 10 minutes interval displays a flood behavior over a specific analysis period (e.g., having 550 alarms hit the system within 2 minutes), the nuisance behavior may be valid. Some implementations may consider one flood period too short to "durably overwhelm" a team. In this case, the system may employ relevance filters. Some examples of possible implementations include: (1) at least 3 consecutive 10 minutes intervals need to display flood behaviors, or (2) a composite average quantity of alarms over a sliding window of 3 consecutive 10 minutes intervals may be required to declare a flood nuisance behavior valid. It is understood that these are just a few of many possible example implementations.

At block 415, if it is determined the at least one identified alarm nuisance behavior meets the prescribed conditions (such as those discussed above), the method may proceed to block 420. Alternatively, if it is determined the at least one identified alarm nuisance behavior does not meet the prescribed conditions, the method may end or return to block 405 (e.g., for processing additional or newly received information related to at least one identified alarm nuisance behavior).

At block 420, information related to the at least one identified nuisance behavior may be appended to time-series information associated with the identified alarms (e.g., alarms identified at block 215 of method 200). The appended information may include, for example, information relating to time(s) of occurrence of the identified alarms, frequency(s) of occurrence of the identified alarms, duration(s) of the identified alarms, magnitude(s) of the identified alarms, severity(s) of the identified alarms, location(s) of the identified alarms, groups or clusters of the identified alarms, metadata, etc. In accordance with some embodiments of this disclosure, the information appended at block 420 is layered on top of information that may be tagged or appended at block 410 (e.g., when performing the example steps discussed in connection with FIG. 5, as will be discussed further below).

In one example implementation, events passing the filters at block 415 append information associated with the nuisance data to the existing events and/or alarms data for later processing steps. More particularly, this data may enrich existing events and/or alarms data. For example, it may provide additional new data to be used on later processing steps (e.g., filtering nuisance behavior in visualizations, taking actions only on nuisance events and/or alarms, or conversely, only on events and/or alarms which do not display any nuisance behavior). This data may be made available or pushed to other layers of the alarms analysis system or to any other system leveraging or analyzing any of the events and/or alarms data. Additionally, this data may be stored in the same data base, or be appended to events data files (e.g., inside the json files, additional json files, etc.). It may also be pushed and published in a similar manner as the other events data.

At block 425, at least one potential nuisance remediation may be identified to address the at least one identified alarm nuisance behavior, for example, based on analysis of the information appended or tagged to the time-series information (e.g., at blocks 410 and/or 420). In accordance with some embodiments of this disclosure, the at least one potential nuisance remediation may be identified from a list, library, or repository of possible nuisance remediation techniques, devices, suggested settings adjustments, etc. Additionally, in accordance with some embodiments of this disclosure, the at least one identified potential nuisance remediation may include recommendations on how to avoid nuisance behaviors on alarms/events. For example, the at least one identified potential nuisance remediation may include timestamp corrections, removal of false stale alarms durations and possibly removal of nuisance characteristics for stale alarms. For each IED, each event type of the given IED, and each event and/or alarm, the duration may, for example, be checked and validated using timestamps and the durations provided by the IEDs. If a discrepancy exists between the two, a possible remediation action may be identified. For example, the duration reported by the device may be used to replace a missing or wrong dropout/end timestamp (e.g., pickup timestamp plus event duration reported by an IED to create the missing dropout/end timestamp). This may trigger an alarm health status update as it indicates poor event data quality (and may include missing data impacting the final data quality).

Additionally, for each IED, each event type of the given IED, and each event and/or alarm, the duration may be evaluated and validated leveraging the maximum possible or applicable duration of the event type. If the derived duration from the timestamps exceeds the maximum duration of the event type, the dropout/end timestamp and duration of the event may be tagged in the system as "poor quality—error". This in turn may trigger a system analysis to identify possible remediation actions. For example, the maximum possible duration for this event type may be used to replace a missing or wrong dropout/end timestamp (e.g., pickup timestamp plus event duration reported by an IED to create the missing dropout/end timestamp). Again, this may trigger an alarm health status update as it is indicative of poor events data quality (and may include missing data impacting the final data quality).

There are several types of mitigation and/or remediations for chattering nuisance alarm behaviors. Remediation may be performed at the source or at each subsequent layer and sub-layers (e.g., pre-processing layer, analysis layer, and action layer which may again be sub-divided according to the type of actions, such as visualization and/or control sub-layers). State of the art remediations generally focus on the source. The first idea is to leverage duration before an alarm is considered valid to avoid triggering on "very short duration events." Optionally, another idea is to extend the duration to avoid detecting "fast re-occurring events" as being distinct from the previous alarms. Proposed remediations may leverage expertise to either extend the on-delay setting (i.e., extending the time before an event and/or alarm is triggered, or is turned "on") or the off-delay settings (i.e., extending the time before an event and/or alarm is turned "off"). These remediations steps are described in the ISA 18.2 standard, for example, and are applied in sectors such as oil and gas for instance.

It is understood that a major drawback of these types of remediations is that they reduce the ability to detect events occurrences and their associated details within each occurrence, resulting in lost information. For example, if ten events or alarms reoccur within 1 minute after the end of the previous event and the expert has defined an off-delay time setting of 2 minutes to reduce the chattering behavior, then only one alarm will be triggered instead of ten distinct alarms. As another example, if the five original alarms determine the source of an event is upstream from their IED's connection point and five subsequent alarms determine the source of an event is downstream from their IED's connection point, this critical information will be lost and not be captured as distinct from the first alarm and/or event. In the same way, if the five final alarms have differing levels of load impact/loss (e.g., 30, 40, 50, 40, 30), then this detailed information would also be lost because only one event/alarm would be detected at the IED level.

In one implementation, the disclosed invention proposes to automatically recommend (e.g., a report) setting changes to the on-delay and off-delay durations for each IED and alarm. In another implementation, the disclosed invention proposes to automatically recommend updating the settings of on-delay and off-delay durations for each IED. On a regular period or on any detected change of patterns per IED and/or per type of event and/or alarm, the system may derive the recommended optimal setting(s) to reduce the chattering nuisance behavior from durations and the durations to next alarm reoccurrence of all the events of the period.

Figure 3C:
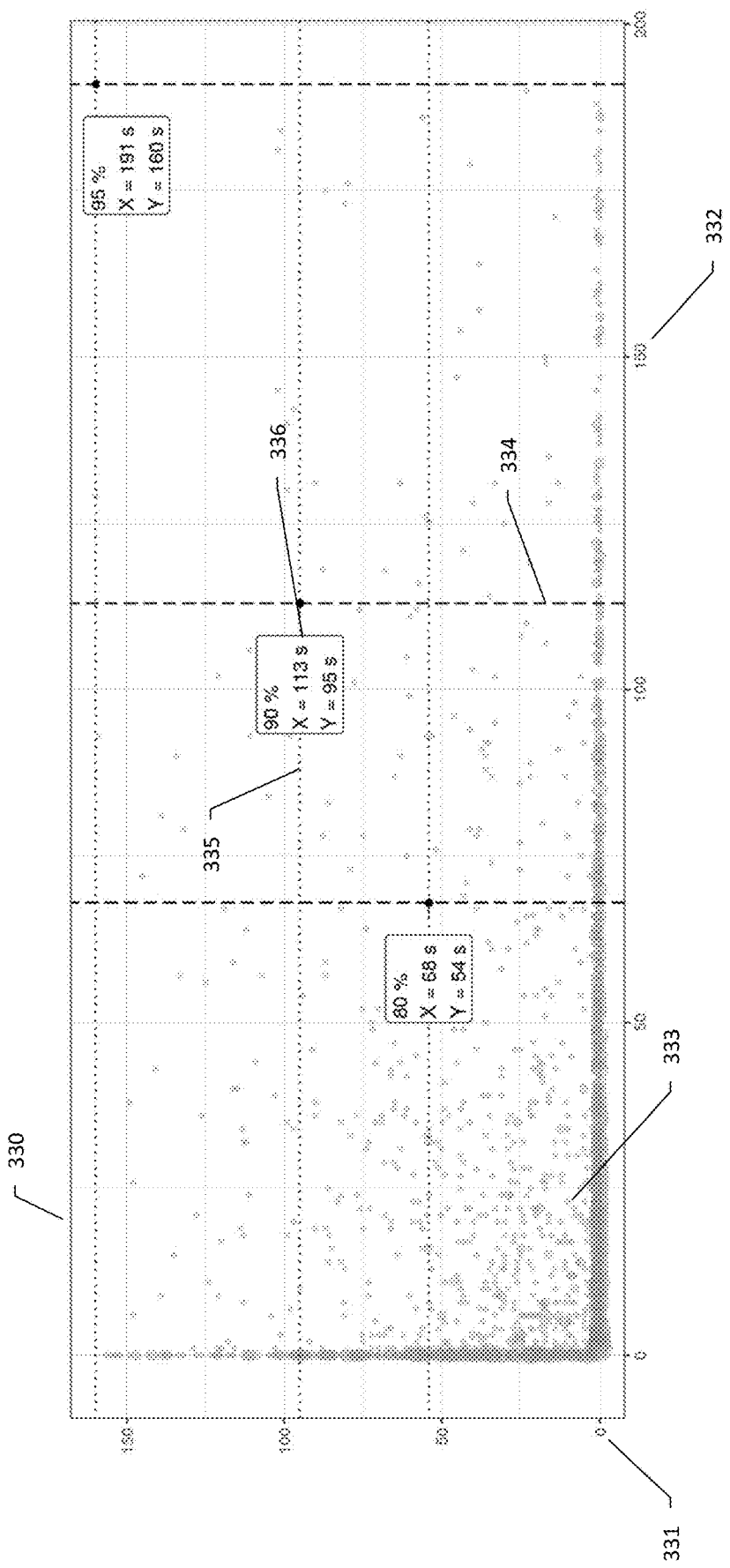
FIG. 3C illustrates an example analysis of reoccurring events and/or alarms in accordance with embodiments of the disclosure.

For all the "fast reoccurring events and/or alarms," for example, the system may define an ideal off-delay duration, which reduces the quantity of nuisance reoccurrences. FIG. 3C, for example, illustrates this with graph 330. Reference numeral 331 indicates the y-axis, which is the duration of the event in seconds. Additionally, reference numeral 332 indicates the x-axis, which is duration to the next re-occurrence of the alarm in seconds. Reference numeral 333 indicates one occurrence of this alarm as a small bubble, and reference numeral 334 indicates the vertical line of the $90^{th}$ percentile of all the alarms on the x-axis. This line shows all alarms that represent 90% of all the data points to the left (i.e., all the chattering alarms re-occurrences). Reference numeral 335 indicates the horizontal line of the $90^{th}$ percentile of all the alarms on the y-axis. This line shows to the bottom all alarms which represent 90% of all the data points (i.e., all the chattering alarms re-occurrences). Additionally, reference numeral 336 indicates the quantities related to both the vertical and horizontal lines of blocks 334 and 335, and links to the junction point of both these lines.

It is understood that there may be several ways to infer from the data this duration to a next alarm threshold. A simple implementation one would use statistics such as, for example (amongst many other approaches), "What is the quantity of alarms for the 80th, 90th, 95th, 98th percentile of duration to next reoccurrence of chattering nuisance behavior alarm?" The system may pick a pre-determined highest aggregation value (for example the $95^{th}$ or the $98^{th}$ percentiles) and add the corresponding duration value to the off-delay duration. The system may also be configured to have a more optimization approach such as using a penalty score to determine a relative improvement to avoid over-tuning the system that may not pick up additional distinct events/alarms. For example, the system could calculate an improvement ratio based on the percentile increase in quantity of nuisance remediations or the percent increase in duration to the next alarm.

It is understood that other metrics may be used as optimization metrics. For example, the system may use the global metric of mean of alarms per interval calculated for the analysis period, comparing it to previous periods. When a large change occurs (e.g., an increase in the quantity of nuisance alarms reoccurrences), the system may propose to update the settings so that the quantity of nuisance alarms is automatically reduced. In this case, the system could determine the percentile to get back to the previous quantity of nuisance behaviors (e.g., if these were deemed acceptable) instead of using a fixed percentile. The system may also be trained by users what is acceptable (and conversely, not acceptable) by implementing a user feedback loop to train the system when too many alarms reoccur. The system user may, for example, use an input mobile interface on their smart phone to select when too many alarms were reoccurring on the visualization screen of the alarms system.

As described above regarding the discussed example on remediations, the disclosed invention is able to implement simple solutions. As explained above, this essentially creates a filter as more detailed and relevant information may no longer be available for supplemental steps of analysis because the IED sensitivity is reduced. Under certain conditions, reduced sensitivity may be required if the system or a specific setting on a specific device is over-sensitive (e.g., capturing redundant or non-important events and/or alarms).

The disclosed invention focuses on remediations at the appropriate level, meaning the system does not reduce the data captured at the source by applying an arbitrary filter (changing the device on-delay and off delay duration settings), but by adding the respective remediation necessary for each discrete usage within the later layers.

Mitigation and remediation may also be defined and tuned to the needs at each layer and sub-layers. The layers and sub-layers may include a pre-processing layer, an analysis layer, and an action layer, which may again be sub-divided according to the type of actions (e.g., visualization and/or control sub-layers). For example, the system may be set up without applying any signal reduction (i.e., filtering) at the source (e.g., IED on-delay or off-delay duration settings) and without changing any threshold settings (unless something is wrong or inconsistent with measurements and other information associated with the events and alarming). This means each time a threshold is crossed by a relevant measurement (e.g., voltage, current, power, power factor, THD, reactive power, etc.), an event is captured. If a certain threshold is exceeded, a corresponding alarm may be triggered each time. At this point, the quantity of events or alarms is not considered a nuisance for the system, contrary to the ISA 18.2. No user needs to see or be "flooded" or "overwhelmed" with the quantity of alarms the system processes and resolves. The invention focuses on resolving each layer (one at a time) and responding accordingly on each layer's added value. Data presentation layers enable a simple presentation of results after distinguishing the essential information for a specific user, segment, and/or profile.

After removing the nuisance behavior at each layer, the invention identifies the initial source, breadth, propagation of events, and identifies the impact of the event(s) and/or alarm(s) (e.g., "initial IED pickup, initial meter location, source of event, propagation of the event within the system, impactful or not impactful, etc.) for the system. As already discussed, this is an important reason not to reduce the signal level (e.g., artificially reducing the information's granularity, sensitivity, and frequency of occurrence).

In accordance with some embodiments of this disclosure, remediation may not be applied at the pre-processing step (e.g., at block 510 of method 500, as will be discussed further below). Events and alarms are analyzed and any nuisance behavior (according to any standard such as ISA18.2 and any additional user/system definition) will be identified and characterized. In some embodiments, systematic Chattering alarm removal is not executed in the Causal Analysis layer; however, it is dependent on the analysis step being conducted.

In accordance with some embodiments of this disclosure, other remediation options may be provided, for example, on a visual interface. For example, an aggregation of an "event sequence high level" visualization may be provided. In this visualization, only one event aggregates all the chattering events from the initial pickup timestamp to the end of the sequence of overlapping events. This event sequence has metrics such as quantity of chattering alarms per event and/or alarm type that occurred during the sequence, pickup and dropout timestamp, and/or worst impact. It is possible in another implementation to discriminate, sort, separate, analyze, process, manage, or other related and/or associated action(s) within a single alarm type. For example, a voltage sag may be separated or sorted into those that originate upstream from an IED and those that originate downstream from an IED. Similarly, impacted phases (e.g., A, B, C or 1, 2, 3, neutral conductors, etc.) may be separated or sorted accordingly, for example. Upstream and downstream sources are distinguished and appended to the events and/or alarms label and are displayed as distinct lines in the graphs. An aggregated "events presence 1-minute or 10-minute interval" visualization may also be provided. In this visualization, an event may be considered present in each 1-minute or 10-minutes interval, whether one or several occurrences occurred during this interval. If any chattering appears during this period, the interval may simply be marked and/or tagged as "chattering occurrence(s)." Marking and/or tagging may be performed using specific colors or an intensity heatmap color code to indicate such Chattering. This may be performed in a separate diagram/graph from the global "events presence" visualization. A flood analysis visualization may also be provided where discrete flood periods are identified and the contribution of chattering behavior to each flood period is discernable as a stacked graph per event/alarm per IED.

It is understood that more global metrics may be provided for the nuisance behaviors. The data may be aggregated, for example, including the quantity of chattering nuisance behavior in analysis period and the trends vs previous analysis periods, etc. Details per event and/or alarms per device may also be presented. These may include global metrics to identify specific alarms and IEDs contributing the most to the given nuisance behavior, the top ten worst contributors (e.g., event and/or alarm types, IED cumulating all events and/or alarms, etc.). Specific metrics associated with recommendations may be provided in a report or in a user interface for each event and/or alarm per IED in some instances. At action layers (control sub-layers), for example, extreme values distribution may be provided (e.g., magnitude, unbalance, etc.).

Figure 3D:
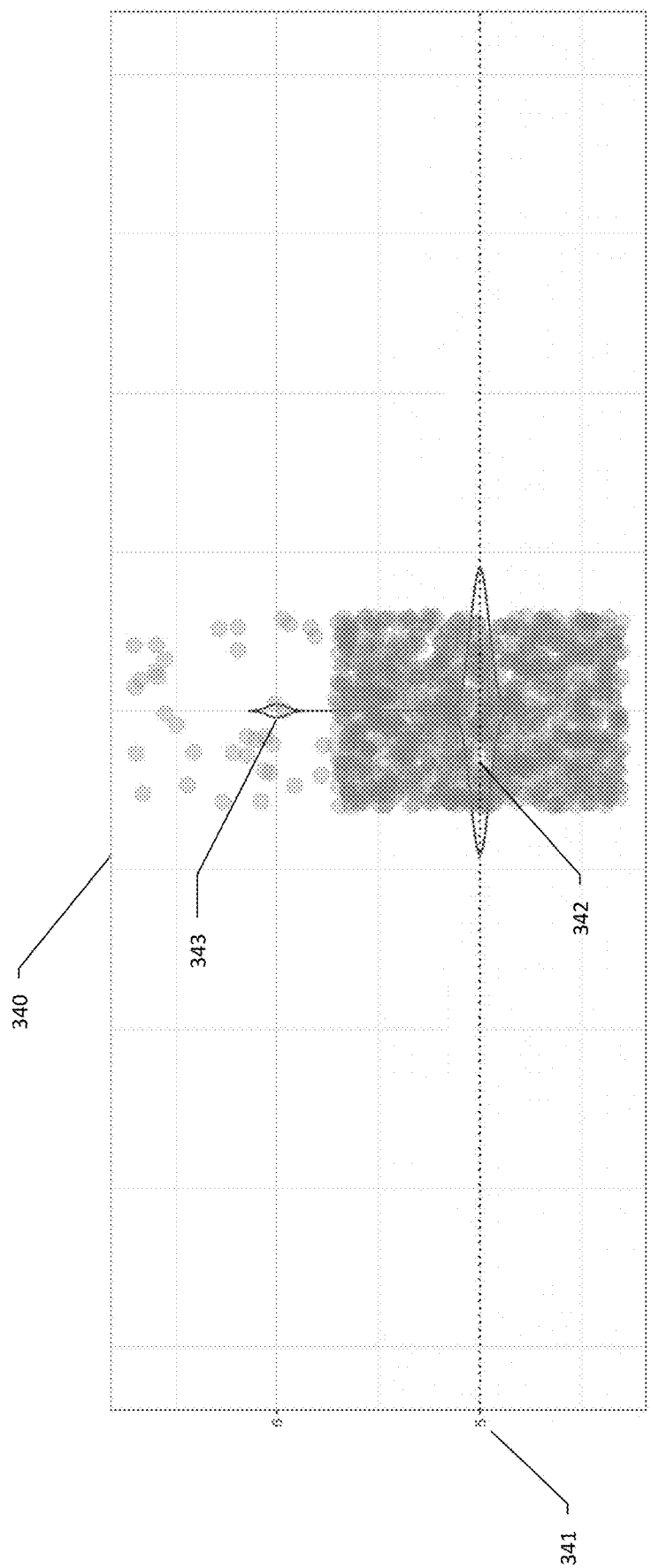
FIG. 3D illustrates an example of initial statistical analysis to identify potential alarm setting changes and their impact on the reduction of nuisance behavior in accordance with embodiments of the disclosure.

For fleeting nuisance alarms behavior, it is understood that there are many possible mitigation and/or remediation actions. In one implementation, the system may prepare an analysis to help an expert adjust alarm thresholds. For example, the alarm thresholds may be analyzed to determine whether threshold levels are correctly configured/set. In accordance with some embodiments of this disclosure, this may require domain expertise and cannot be performed by the system independently (i.e., autonomously). However, the system may prepare the analysis and use a graph similar to the chattering behavior analysis. This type of graph helps the user understand which extreme values are appearing that trigger the alarm (e.g., max/min magnitude of event). This is helpful to determine thresholds to reduce the quantity of alarms triggered/detected. In concert with load loss algorithms, this feature helps determine the magnitude loads may ride-through without significant impact to loads and processes. As such, an expert may use this analysis to determine event setting thresholds, which will be distinct from alarms that are determined to only trigger when impactful event thresholds are crossed (e.g., capturing the voltage sag and related information at 90% of nominal voltage, but not triggering an alarm until the voltage sags goes below a 60% of nominal voltage). FIG. 3D illustrates such a graph 340. In this case, the measured value indicated by reference numeral 341 is Voltage THD. As is visible in the line associated with reference numeral 342, most of the occurrences are related to the value of 6%. However, in certain cases, some of the occurrences are at 6% of Voltage THD, as indicated by reference numeral 343.

Flood periods may be more complex to solve in some instances because this nuisance behavior often cannot be directly linked to a single alarm or specific IED. In some cases, a single IED may generate many/most of the flood periods. In one example, it may be due to an incorrect or oversensitive alarm threshold (e.g., voltage sag threshold configured to 5% of the nominal voltage). In this case, the system's graph of extreme values may be sufficient for an expert to identify this oversensitive threshold because they would see many voltage sag alarms between 95 and 90% of the nominal voltage (i.e., an obvious abnormal threshold). The mitigation action would be obvious for an expert to reduce flood conditions, and probably chattering alarm nuisance behavior or fleeting alarms nuisance behaviors as well. This may also be indicative of incorrect settings (e.g., wrong CT/PT ratio) or of a faulty IED. An expert would be required to evaluate the IED and its configuration to identify the issue. However, the system can identify the single source of flood periods to help direct maintenance actions. In many cases, multiple IEDs and alarms of similar and dissimilar types are involved and co-occur within a flood period, which may differ per flood period. The system may require more advanced analysis of the IEDs and alarms co-occurring during each and all the flood periods.

In some instances, the at least one identified alarm nuisance behavior may be indicative of issues associated with electrical system (e.g., the electrical system itself or with associated EPMS devices), as will be appreciated from further discussions below. At least one action or type of mitigation may be taken or performed to improve or resolve issues. It is understood that this at least one action or type of mitigation may be related to the at least one potential nuisance remediation identified at block 425 in some cases.

Subsequent to identifying at least one potential nuisance remediation at block 425, at least one action may be taken or performed at block 430 based on or in response to the at least one identified potential nuisance remediation. For example, the at least one action taken or performed may include selecting and recommending one or more of the at least one potential nuisance remediation. For example, one or more of the at least one potential nuisance remediation may be selected and recommended based on the particular user(s) and/or customer segment type(s) associated with the electrical system. Additionally, the at least one potential nuisance remediation (e.g., the at least one potential nuisance remediation that is selected and recommended) may be applied or initiated (e.g., automatically, semi-automatically or manually). In accordance with some embodiments of this disclosure, recommendations may be provided to the end-user(s) by at least one of: a text, an email, a report, an alarm, an audible communication, and a communication on an interface of a screen/display (e.g., of a user device).

In accordance with some embodiments of this disclosure, it is important to ensure the consistency of such possible remediation solutions before taking an action on the event. For example, a meter may pick up a sequence of different types of events, all being a consecutive disturbance that is actually part of the initial event. This has been observed, with respect to example voltage disturbances that may begin as a line-to-line fault event and become a two-phase-to-ground fault event, each aspect having its own duration. Accordingly, the system may check if only one single event occurred for a given IED and within a given sequence of overlapping events. Alternatively, it may determine whether several events followed each other or even co-occurred. At this point, the system may insert a reconciliation step with the different correct individual event durations. The overall event may be a complex event suite made up by at least two successive and/or co-occurring events, each with a possibly corrected duration. This reconciliation step ensures the overall event will get a correct duration (i.e., taking all the constitutive durations into account) and using these to either corroborate the existing complex event duration or creating one complex event and associated overall duration.

After reconciling the durations and dropout timestamps, it is now possible to evaluate missing pickup timestamps of the event data, which is the symmetrical process to the missing dropout timestamps. For example, the system may identify dropout timestamps that do not have matching pickup timestamps for a given IED or per type of event and/or alarm (e.g., looking for patterns such as one pickup timestamp for two dropout timestamps). If the event dropout timestamp is associated with a device event duration in the event data sent by the IED, then it is possible to deduce the missing pickup timestamp of the event (e.g., using the dropout timestamp to deduce the duration). The system determines the maximum duration of the type of event. For the voltage sag examples above, the maximum duration would be between 2.55 seconds to 1 minute, depending on the geography and the norms and/or standards version or potentially custom settings of the IED. If the event dropout timestamp does not have any associated duration and the type of event has a maximum duration, the system would trigger the creation of the missing pickup timestamp. The pickup timestamp will be calculated by taking dropout timestamp and deducing the max possible duration. Created events and/or alarm pickup timestamps will be tagged as "less valid data."

In some example implementations, improvements or degradations of the alarm system health may be observed and provided using one or more alarm system health indicators. For example, if a non-proportional increase in the quantity of missing timestamps is detected through this process, indicators may highlight the alarm system health degradation from this measurement. In this case, it is possible to provide additional analyses on a specific source of bad data quality (e.g., a single device related to this increase or is it spread across the system). Conversely, if the proportional quantity of missing timestamps decrease (such as when going from 3% to 1%), the alarm system health confidence index should improve.

In every case, it is important to enable the system to correct any replaced data by going through these steps again if measured event and/or alarm data is received later by the system. This should retrigger the mechanism to reexamine the stale alarms nuisance behavior, as late arriving data may provide some, but not all, of the missing timestamps. In one example implementation, at least some of the stale alarm behaviors detected may be removed and remediated with lesser data quality timestamps.

Figure 5:
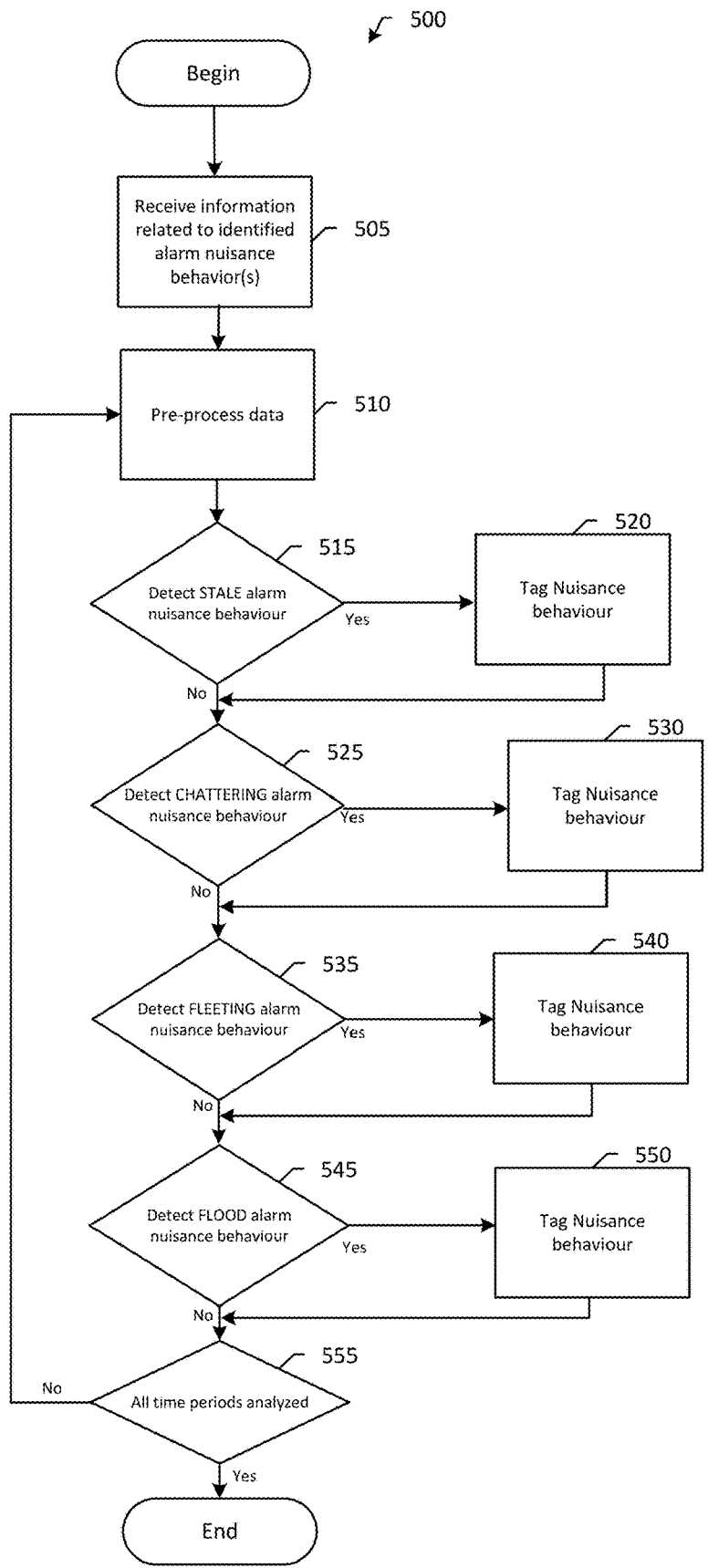
FIG. 5 shows an example method for characterizing identified alarm nuisance behaviors in accordance with embodiments of the disclosure.

As noted earlier and described further in connection with FIG. 5, in some instances several nuisance behaviors may co-occur. This is evident, for example, during a flood period, which is one example type of nuisance detected behavior occurring, e.g., over a 10-minute interval. During the flood period, it is possible to observe several alarms displaying chattering nuisance alarms behavior (such as each alarm repeating over ten occurrences within this 10-minute interval).

In accordance with some embodiments of this disclosure, the system may choose to apply different mitigation or remediations, depending on the type(s) of nuisance behaviors, for example. The most evident, but easiest to adjust, may be the settings on the at least one IED responsible for capturing the energy-related signals. This should be analyzed first to identify any incorrect settings or issues with the at least one IED. If all settings are suitable and correspond to standards or to sound engineering practices in this segment and type of process or monitored loads, then no further action needs to be taken at the source without thorough impact analysis. The reason is that this may lead the system to become blind to real valid alarms and/or real valid events. Issues may go un-detected if wrong settings are implemented.

In accordance with some embodiments of this disclosure, the second most obvious step may be to retain the complexity in the different processing and analysis steps and simplify the presentations for users. This is typically an essential part of UX/UI work, for example, each user only needs to see is relevant for their respective persona. For instance, only high-level statistics and possibly graphs illustrating global trends and few main points may appear in a C-level report. For these users, the time to absorb the information may be about five seconds; therefore, all alarm nuisance behaviors need to be quickly comprehensible. On another case, experts may need to analyze all events and alarms of the period preceding a critical power loss in a data center to accurately post-mortem event an event. For this example, the described time required ranges from hours to days (and even weeks) of investigations to make ensure and validate to minimize a reoccurrence of this situation in the future.

It is understood that many different solutions may be implemented. In one example implementation, the most obvious solution is simply to present an alarm present with a value of 1, or absent with a value 0. Any such graph would be easy to read as this is a presence/absence status graph. This helps a human brain visualize the co-occurrences of alarms (and conversely, when alarms do not co-occur). This helps remove chattering behaviors in a user's UX. In an additional exemplary implementation, the solution may be to remove the stale alarms and create a specific/distinct graph for all the stale alarms of this analysis period (e.g., month being analyzed). In a further example implementation, flood periods may be presented in separate graphs and analyzed separately from the other alarm periods. This would avoid typically phenomena of highest values "skewing the graphs" of other periods. By removing and processing/analyzing floods separately, additional patterns occurring during non-flood periods may become more visible.

In another possible implementation, real-time systems (e.g., a SCADA system) may enable the user to drill deeper into each event as alarms arrive. It may still have a "simplification layer" where nuisance behavior doesn't clutter the screen, but this system would enable expert users to zoom into the essential aspects without initially displaying any alarms related nuisance behavior such as chattering or fleeting behaviors (but may still display and highlight flood periods). In a further example implementation, the system may produce a regular (e.g., a monthly) nuisance alarms report suggesting specific nuisance behavior reduction (mitigation and remediation) actions.

In another example implementation, the system may remove nuisance behavior in the specific processing steps where details are not required. For chattering behavior, the system may determine what is a typical duration until the next occurrence of the event. It may then determine the setting(s) for this alarm to become a continuous alarm. This can be done, for instance, by changing the duration before dropout (end of alarm). In accordance with some embodiments of this disclosure, the system may be able to distinguish between a chattering meter (i.e., a meter that has chattering alarms), a chattering alarm (i.e., an alarm that has chattering behavior), and chattering alarm nuisance behavior (i.e., when it chatters). The system may also be able to classify if a source (IED) is constantly chattering and can then analyze whether any obvious patterns appear and refine accordingly when a meter is chattering constantly. For example, the source may chatter during site start-up, when HVAC either cools or heats the facility, or only during certain processes running at certain times of day.

Constantly chattering meters/alarms may be identified and indicated in some instances. This distinction may be important to provide correct recommendations as chattering behaviors are a relative concept. For example, it may be defined at a system level, at each device level, may be based on a fixed time duration to the next alarm (1 hour, for example), or it may be relative to each site/meter. For example, the system may deduce a typical duration to the next reoccurrence of the same alarm, based on a mix of statistics and of domain expertise-based rules, what threshold is relevant to ascribe this meter a chattering behavior. In another implementation, the system may propose or even take actions to automatically correct or propose to user(s) to validate correction before implementation (e.g., creating a missing pickup timestamp or a missing dropout time stamp as described previously).

It is understood that many other example actions may be taken or performed at block 430. For example, several mitigation and remediation actions may be triggered at different levels for a given nuisance behavior; no alarm data may be removed in processing. A specific visualization may be created where the nuisance behavior is removed in a real-time system UX interface (e.g., SCADA system). A nuisance reduction report may be created, and a waveform capture may be tagged as including nuisance behavior. Filtering of nuisance behavior may be enabled (e.g., only relevant event data is shown in the EPMS for the C-level dashboard). A wrong stale alarm may be filtered, and the missing pickup or dropout timestamp may be created.

Subsequent to block 430, the method may end, return to block 405, or one or more actions may be taken. For example, in embodiments where it is desirable to continuously (or semi-continuously) analyze received information related to at least one identified alarm nuisance behavior (i.e., one or more different points in time), the method may return to block 405 (e.g., analyzing further received information). Alternatively, in embodiments where it is desirable to analyze a single set of received information, for example, the method may end or one or more actions may be taken. Example actions may include storing, displaying and/or analyzing the previously received information related to at least one identified alarm nuisance behavior. Other example actions will be apparent to one of ordinary skill in the art. In embodiments in which the method ends after block 430, the method may be initiated again in response to user input and/or a control signal, for example.

It is understood that method 400 may include one or more additional blocks in some embodiments. For example, an additional example block may occur in method 400 and/or other methods disclosed herein and may include the ability to correct alarm information sent by a device such as pickup timestamps based on the text/label descriptions. For example, today events may be tagged at the moment of detection; however, the analysis period may have started earlier. This is true for any RMS calculation done over a period of time (e.g., over 1, 2, 5, 10 or 15-minute intervals or even 1, 2, 6, 8 or 24 hours). In each one of these cases, the system analyses the text or label or type of alarm/event and extracts from this the period/interval over which the event was calculated. If an alarm or event was detected and triggered, the IED or system corrects the event pickup timestamp to cover the entire interval/period of each event. For example, "over THD average mean value 10 minutes alarm" associated with a pickup timestamp and a dropout timestamp of "2021.03.01 22:00:00" which is when the IED had a value above alarm threshold and sent out the alarm. This would then be corrected to "event pickup timestamp=2021.03.01 21:50:00" and "dropout timestamp=2021.03.01 22:00:00". This more accurately reflects the reality of the covered interval. The system in this case creates a new timestamp distinction between the event itself (i.e., with the corrected period linked to the interval used for the average calculation) from when the alarm was detected and sent (i.e., at the end of this time 10 minutes interval).

Other example aspects, features and variations of the disclosed invention will be appreciated from discussions below.

Referring to FIG. 5, a flowchart illustrates an example method 500 for characterizing identified alarm nuisance behaviors. In accordance with some embodiments of this disclosure, method 500 is illustrative of example steps that may be performed in connection with methods 200 and 400 discussed above in connection with FIGS. 2 and 4. For example, in one example implementation, the steps performed in method 500 may correspond with example steps that may be performed at one or more of blocks 405, 410 and 415 of method 400. Similar to methods 200 and 400, method 500 may be implemented on a processor of at least one IED (e.g., 121, shown in FIG. 1A) in the electrical/power system, a processor of a diagnostic system (e.g., 125, shown in FIG. 1) in the electrical/power system, and/or remote from the at least one IED and the diagnostic system.

As illustrated in FIG. 5, the method 500 begins at block 505, where information related to at least one identified alarm nuisance behavior is received. Similar to block 405 of method 400, in some instances the received information may include aggregated information from block 220 of method 200 used to identify the at least one alarm nuisance behavior at block 225 of method 200.

At block 510, the information received at block 505 is pre-processed. It is understood that the pre-processing of the information may take a variety of forms and include various steps. For example, in one example implementation, obvious errors (e.g., wrong dates) may be filtered from the information. For example, dates prior to possible installation and/or logging capability (e.g., $19^{th}$ century dates) or future dates (e.g., five in the future), errors which may be due to errors and/or failures of IEDs, or may be due to communication errors (e.g., when using radio transmissions and signal may be modified or only partially received) or more frequently occurred due to system configuration changes (e.g., timestamp conventions), may be filtered from the information. In accordance with some embodiments of this disclosure, the system may provide useful information and warnings to users on any applied filter(s) as well as on the extent (e.g., percentage of data was filtered) and possible impact of each filter.

It is understood that the prep-processing at block 510 may include many additional or alternative steps. For example, the duration of the events may be detected and/or analyzed for each of the events identified from the electrical measurement data from or derived from the energy-related signals captured by the at least one IED (e.g., at block 205 of method 200). In one aspect of this invention, the duration of the events may be recalculated based on the available event and/or alarm data. Additionally, an alarm health status indicator may be recalculated to evaluate the coherence and the data quality. From this, it may be observed whether the received and/or stored data is complete (e.g., is there event pickup timestamped data and event dropout timestamped data for the same event, leveraging the event type). It is important to distinguish between missing data creating false nuisance behaviors and real events and/or alarms displaying nuisance behaviors (e.g., a stale alarm remaining active for days or even weeks in a row before being either acknowledged or receiving an event end).

In some embodiments of this disclosure, each alarm duration may be checked against the event and/or alarm type. For example, many power quality events have prescribed maximal durations associated with and event type. For example, a voltage sag is, according to IEEE Standard 1159-2019, limited to a duration of less than 1 minute, which can differ from standard to standard. In some instances, this definition and many other definitions may be included in device settings data. If the system(s) and/or device(s) where method 500 is implemented indicates a voltage sag alarm as including a nuisance behavior (e.g., a 10-hour duration), this is by definition incorrect. Accordingly, it may be considered a false nuisance behavior and may most probably be due to a missing the dropout of event timestamp. In some instances, the duration until a next event is detected/triggered may also be determined. This may, for example, be a key metric used to detect specific types of nuisance behaviors including chattering and fleeting for a given event or alarm.

At block 510, the time period(s) (e.g., monthly, quarterly, yearly) associated with the information to be analyzed may also be determined. For example, time-related frames required for further analysis may be created/defined/determined at block 510. For example, it may be determined that each 10-minute time interval from pickup timestamp to dropout timestamp should be analyzed. From this, 10-minute intervals may be created, including intervals where no event(s) occurred in some instances. It is understood that each 1-minute interval frame, 1 hour interval frame, etc. may be additionally or alternatively analyzed in other instances.

At block 510, incident frames (i.e., sequences of overlapping events) may also be inferred from events from various or all devices. In one example implementation of the invention, all events that are long lasting events (e.g., events lasting more than 10 minutes, 1 hour, or another defined time period) may be filtered or removed at block 510. This is done to avoid creating sequences that are heterogenous (e.g., one long event and/or alarm lasting 3 hours would aggregate approximately 21 sub-sequences of very short duration events such as a series of voltage sags). This creates sequences of overlapping events that infer a probable time relationship.

At block 510, relevant metrics may also be identified for each of the above-discussed frames (example of 10 minutes intervals, but also true for incident frame). These metrics may include, for example, (1) the events and/or alarms present (in each 10 minutes interval), (2) the types of events and/or alarms that occurred (in each 10 minutes interval), and/or (3) the different IED sources of these events and/or alarms (in each 10 minutes interval). It is understood that many other additional or alternative metrics are also possible and contemplated by this invention.

At block 510, relevant information may also be identified for each of the events and/or alarms. For example, extreme values (e.g., the magnitude of the voltage sag event, the maximum unbalance between two phases of a voltage unbalance event, etc.) may be identified. Additionally, all relevant textual information may be extracted and a mapping to a unique reference of different types of events and/alarms may be created. These events and/or alarms may include, for example, power quality events or any other types of events and/or alarms present in the system (e.g., protection events and/or alarms, operations status, settings changes, etc.).

It is understood that many additional or alternative steps may be performed at block 510. In one aspect of this disclosure, the additional or alternative steps may be performed with several objectives in mind. These objectives may include, for example, refining the analysis. For example, the sequences of overlapping events may be subdivided further by grouping only by similar types of events (e.g., grouping only voltage sags and voltage swell in one group separately from any voltage unbalances or voltage harmonics sequences). The main objectives may also include preparing the actions/recommendations. For example, a single-line diagram may be used to create branches related to specific types of loads (e.g., motors that may create voltage sags when energized).

Subsequent to block 510, the at least one identified alarm nuisance behavior is characterized in following blocks of method 500 using information from blocks 505 and/or 510. More particularly, the at least one identified alarm nuisance behavior is analyzed to determine whether the at least one identified alarm nuisance behavior is capable of being grouped into one or more of a plurality of predefined or prescribed alarm nuisance behaviors, user-defined alarm nuisance behaviors, and/or learned alarm nuisance behaviors. In the illustrated embodiment, the plurality of predefined or prescribed alarm nuisance behaviors, user-defined alarm nuisance behaviors, and/or learned alarm nuisance behaviors include at least one of a: stale alarm nuisance behavior, chattering alarm nuisance behavior, fleeting alarm nuisance behavior, and flood alarm nuisance behavior, as will be further appreciated from discussions below. It is understood that these are only a few possible types of alarm nuisance behaviors described by the disclosed invention. Other example types of alarm nuisance behaviors will be apparent to one of ordinary skill in the art (e.g., alarms not sufficiently displaying severity or criticality scores may be considered alarm nuisance behaviors, non-impactful alarms may be considered alarm nuisance behavior, etc.).

Returning now to block 510, subsequent to the data being pre-processed at block 510, the method proceeds to block 515 where it is determined whether a first type of nuisance alarm behavior is detected (i.e., stale alarm nuisance behavior). For example, the pre-processed data with information related to the at least one identified alarm nuisance behavior may be analyzed to determine whether the at least one identified alarm nuisance behavior meets predefined, prescribed, user-defined or learned thresholds associated with stale alarm nuisance behavior.

Stale alarm nuisance behavior is a well-known nuisance behavior category described in very general terms inside standards such as ISA 18.2. For example, ISA 18.2 defines a stale alarm as an "alarm that remains annunciated for an extended period of time (e.g., 24 hours)." The disclosed invention is able to leverage user-defined duration thresholds such as "any alarm with a duration lasting more than x hours." It is understood that x may vary per site (e.g., one site may use 8 hours as threshold to exceed an 8-hour work shift while another site may use 24 hours to reflect a daily rate).

It is understood that the thresholds may be set differently depending on the event and alarm types. For example, by definition, steady-state power quality events last much longer than transient events. Thresholds may be set by domain experts, refined by users, and/or by system engineers at the commissioning time (e.g., 24 hours for any steady state type of event and/or alarm, and at 8 hours for any non-steady state type of event and/or alarm (for a work shift duration).

It is also understood that thresholds may also be inferred by the system by learning what are "normal" durations per type of event and/or alarm. For example, the system may use statistical method including the consideration of any extreme outlier in terms of duration abnormal (e.g., leveraging statistical state of the art median duration+3*IQR of the duration). In another implementation, the system may use a machine learning algorithm to detect outliers or model "normal behaviors." All of these machine learning algorithms may be encompassed in the term of "anomaly detection algorithms" in the field of unsupervised machine learning (e.g., cluster-based, K nearest neighbor, LS™, ARIMA, Neural Networks, etc.). In conclusion, there would be many possible different implementations and combinations of algorithms.

At block 515, if it is determined the at least one identified alarm nuisance behavior meets predefined, prescribed, user-defined or learned thresholds associated with stale alarm nuisance behavior, the method may proceed to block 520 where the at least one identified alarm nuisance behavior may be identified and/or tagged as exhibiting stale alarm nuisance behavior. Alternatively, if it is determined the at least one identified alarm nuisance behavior does not meet predefined, prescribed, user-defined or learned thresholds associated with stale alarm nuisance behavior, the method may proceed to block 525 where it may be determined if the at least one identified alarm nuisance behavior meets predefined, prescribed, user-defined or learned thresholds associated with a second type of alarm nuisance behavior (i.e., chattering alarm nuisance behavior).

Chattering alarm nuisance behavior is a well-known nuisance behavior category described in very general terms inside standards such as ISA 18.2. For example, ISA 18.2 defines a chattering alarm as an "alarm that repeatedly transitions between active state and not active state in a short period of time." FIG. 3B, for example, provides an illustration of chattering alarm nuisance behavior. A first graph 320 gives an overview of a one-month number of alarms per 10-minutes interval. These range from 0 alarms per interval up to 76 per interval, as indicated by reference numeral 322. Reference numeral 321 illustrates the zoom period that is used in graph 325. In graph 325, the proportion of alarms displaying a chattering alarm nuisance behavior becomes visible. As indicated by reference numeral 326, all alarms are tagged as displaying chattering alarm nuisance behavior. Alternatively, only part of the alarms presented in the interval indicated by reference numeral 327 display a chattering nuisance behavior.

In accordance with some embodiments of this disclosure, the thresholds associated with chattering alarm nuisance behavior may include at least one user-defined threshold. For example, the user-defined thresholds may include user-defined duration thresholds (e.g., "any alarm with a duration to next alarm below a certain threshold"). For example, Y may be a standard value, therefore "if alarm repeats within 1-hour, mark it as chattering alarm." Additionally, Y may be different per site or segment sensitive. For example, one site may use 1-hour as threshold based on a measured or assumed response capability, so the capability of taking action by an alarm's management team, maintenance team, or another team is capable of analyzing, resolving, and/or acknowledging the alarms. Yet in another site, Y may be set to ten minutes because the reactivity of the team is much higher and so only faster reoccurrence rates would be considered as being chattering behaviors.

The thresholds associated with chattering alarm nuisance behavior may also be inferred by the system through learning, for example, the "normal" durations to the next alarm occurrence per type of event and/or alarm. For example, the system may infer from the data what is considered a short period of time. Additionally, the system may leverage action data (e.g., acknowledgement, resolution, shelving, etc.) to learn the normal time of reactivity of the teams involved in alarms management. In one example implementation, it may compare the time of alarms appearance in the system (e.g., when an alarm is presented or transferred to the team responsible for acknowledging the alarm) and the time required to act on this alarm (e.g., acknowledge, shelve, etc.). This time required to act (i.e., a duration) may then be analyzed to determine a typical (e.g., median or average time) reactivity time. The system may also infer from this data a bandwidth around the median based on any statistical value such as standard deviation or IQR.

By leveraging both the typical time to react and the bandwidth (e.g., sum of typical duration to react plus the typical bandwidth duration), the system could infer a "reactivity duration" for each site, and even for each event type. Applying this inferred "reactivity duration" to the time of a next alarm allows a determination of which alarm occurrence presents a "short period of time of transitioning between active and non-active state." This can be tuned, for example, according to each event and/or alarm type as different teams may be affected. Additionally, this can be tuned according to each team as reactivity may differ between the day and night shifts (e.g., the quantity of workers may differ, so reactivity may be impacted).

If it is determined the at least one identified alarm nuisance behavior meets predefined, prescribed, user-defined or learned thresholds associated with chattering alarm nuisance behavior, the method may proceed to block 530 where the at least one identified alarm nuisance behavior may be identified or tagged as including chattering alarm nuisance behavior. Alternatively, if it is determined the at least one identified alarm nuisance behavior does not meet predefined, prescribed, user-defined or learned thresholds associated with chattering alarm nuisance behavior, the method may proceed to block 535 where it may be determined whether the at least one identified alarm nuisance behavior meets predefined, prescribed, user-defined or learned thresholds associated with a third type of alarm nuisance behavior (i.e., fleeting alarm nuisance behavior).

Fleeting alarm nuisance behavior is a well-known nuisance behavior category described in very general terms inside standards such as ISA 18.2. For example, ISA 18.2 defines a fleeting alarm as an "alarm that transitions between an active alarm state and a not active alarm state in a short period of time without rapidly repeating."

The disclosed invention is able to leverage user-defined duration thresholds (e.g., "any alarm with a duration to next alarm below a certain threshold"). For example, Z may be a user-defined threshold (e.g., "the duration to next alarm is longer than 1-hour, but less than 3 hours"). Similar to chattering alarms, for example, fleeting alarms may be different per site, location, building, process, etc. and be sensitive to segment context. In one example implementation, fleeting alarms may be inferred using the same threshold of chattering as a lower starting point (i.e., any frequently reoccurring alarm which is not displaying chattering behavior may be a candidate for fleeting behavior), and then a higher threshold may be either defined or inferred. For example, the higher threshold may be determined by leveraging rules or expertise (i.e., simple thresholds, making this a hybrid inference+expertise-based model). The higher threshold may also be inferred, for example, using extreme outlier detection methods or looking for the "next normal/abnormal break point" algorithms (e.g., using changepoint identification or median+3*IQR). For example, Z will be any reoccurring alarm where the duration to next alarm falls within a lower threshold and a higher threshold.

If it is determined the at least one identified alarm nuisance behavior meets predefined, prescribed, user-defined or learned thresholds associated with fleeting alarm nuisance behavior, the method may proceed to block 540 where the at least one identified alarm nuisance behavior may be identified or tagged as including fleeting alarm nuisance behavior. Alternatively, if it is determined the at least one identified alarm nuisance behavior does not meet predefined, prescribed, user-defined or learned thresholds associated with fleeting alarm nuisance behavior, the method may proceed to block 545 where it may be determined whether the at least one identified alarm nuisance behavior meets predefined, prescribed, user-defined or learned thresholds associated with a fourth type of alarm nuisance behavior (i.e., flood alarm nuisance behavior).

Flood alarm nuisance behavior is a well-known nuisance behavior category described in very general terms inside standards such as ISA 18.2. For example, ISA 18.2 defines a flood alarm as a "condition during which the alarm rate is greater than the operator can effectively manage (e.g., more than 10 alarms per 10 minutes)."

The disclosed invention is able to leverage user-defined alarm rate thresholds (e.g., more than ten alarms per ten minutes). For example, the thresholds may be relative to the number of operators (e.g., two operators would be a rate of more than 20 alarms per 10 minutes, three operators would be a rate of more than 30 alarms per 10 minutes). Similar to the other nuisance behavior alarms, the alarm rate ratio may be very different per segment (oil & gas, semiconductor manufacturer, data center, or office building), site, location, building, process. Additionally, the alarm rate ratio may be inferred, for example, leveraging action data (i.e., acknowledgement, resolution, shelving, etc.) to learn what is a normal time of reactivity of the teams involved in alarms management. In one example implementation, the time of alarms appearance in the system (time when is it presented or transferred to the team responsible for acknowledging the alarm) and the time required to act on this alarm (acknowledge, shelve, etc.) may be compared. The time required to act (a duration) may then be analyzed to determine a typical (e.g., median or average time) reactivity time. A bandwidth around the median based on any statistical value such as standard deviation or IQR) may also be inferred from this data.

Leveraging both the typical time to react and the bandwidth (e.g., sum of typical duration to react plus the typical bandwidth duration), a "reactivity duration" may be inferred for each site and for each type of event. By applying this inferred "reactivity duration" alarm rate, it is possible to determine the alarm rate that makes it impossible to process the data within the 10-minutes time interval or the normal time to action duration if greater than 10-minute interval. In accordance with some embodiments of this disclosure, this can be tuned according to each event and/or alarm type as different teams may be impacted. Additionally, this can be tuned according to each team as reactivity may different between day and night shifts (e.g., the number of workers may differ, so reactivity may be impacted).

For the flood alarm nuisance classification at block 545 and for other alarm nuisance classifications (such as those noted above), it is understood that the system may also be taught what thresholds (and other characteristics) are typical for each given nuisance behavior through analysis of user interactions. Additionally, the thresholds (and other characteristics) may be inferred (i.e., learned, derived) from user tagging. For example, each team may have an interface or a tool to tag an alarm as displaying a nuisance behavior, enabling users to select the type of nuisance behavior being displayed. In some embodiments, the system may generalize the team or user definitions for the alarms. The system could also tune the alarm definitions to each event and/or alarm type, each team, each location within a site, or process, for example.

Returning now to block 545, if it is determined the at least one identified alarm nuisance behavior meets predefined, prescribed, user-defined or learned thresholds associated with flood alarm nuisance behavior, the method may proceed to block 550 where the at least one identified alarm nuisance behavior may be identified or tagged as including flood alarm nuisance behavior. Alternatively, if it is determined the at least one identified alarm nuisance behavior does not meet predefined, prescribed, user-defined or learned thresholds associated with flood alarm nuisance behavior, the method may proceed to block 555 where it may be determined if all time periods (and associated data) have been analyzed.

At block 555, if it is determined all time periods (and associated data) have been analyzed, the method may end, return to block 505, or one or more actions may be taken. For example, in embodiments in which new information related to the at least one identified alarm nuisance behavior is received, it may be desirable to return to block 505 for receiving and subsequently processing and analyzing the newly received information (e.g., to further characterize and/or recharacterize the newly received information). Additionally, in instances in where one or more of the predefined, prescribed, user-defined or learned thresholds associated with various types of alarm nuisance behaviors are redefined (e.g., due to changes in customer needs or constraints), it may be desirable to further characterize and/or recharacterize a previously characterized alarm nuisance behavior. Further, in instances where new types of alarm nuisance behaviors are added (i.e., beyond the above-discussed four example alarm nuisance behaviors), it may be desirable to further characterize and/or recharacterize a previously characterized alarm nuisance behavior. Other example actions (e.g., storing and displaying information related to the characterized alarm nuisance behavior, etc.) will be apparent to one of ordinary skill in the art. In embodiments where the method ends after block 555, the method may be reinitiated in response to user input and/or a control signal, for example.

Returning now to block 555, if it is determined all time periods (and associated data) have not been analyzed, the method may return to block 510 for pre-processing and characterizing the time periods (and associated data) that have not yet been analyzed.

It is understood that method 500 may include one or more additional blocks in some embodiments. Other example aspects, features and variations of the disclosed invention will be appreciated from discussions below.

Systems and Methods for Analyzing Alarms to Characterize Electrical System Issues In accordance with another aspect of this disclosure, systems and methods for analyzing alarms to characterize electrical system issues are provided. As is known, an important purpose of alarms in EPMSs is to notify customers of the occurrence of an abnormal event within their electrical system. Alarms can be a powerful tool to quickly identify issues to improve uptime; however, even for experienced end-users, alarms can be disconcerting, ill-timed, and overwhelming, especially in larger systems. Some events may produce different types of alarms (e.g., PQ events, over current, comms errors, etc.), which can exacerbate confusion and indecision, lead to mistakes, and waste time and/or resources. Ironically (and perhaps more importantly), alarms may lead end-users to disregard the value their EPMSs provide because the end-users may not know how the alarms interrelate.

Often, clues to understand the importance of alarm data are dispersed across multiple alarms, various alarm types, and/or a range of time. The disclosed systems and methods for analyzing alarms to characterize electrical system issues analyzes alarm data to determine the interrelation of alarms, system impacts, spatial context, segment types, and/or load types to determine the scope and influence of electrical events. Contextual data (of both the end-user's electrical system and their EPMS) may be used to determine historical, contemporaneous and potential future implications of events associated with alarm data.

Guidance on potential impacts and causes (e.g., source location) may be provided from the analysis. Recommendations for addressing or resolving the issues may be based on the segment (e.g., data center vs. industrial vs. office building) and typical loads (e.g., motors, lighting, automotive industrial process, HVAC, IT racks, etc.) and settings, for example. Because each energy consumer uses energy "uniquely," the priorities, thresholds, and/or consolidation of multiple alarms may also be distinctive. The disclosed systems and methods automatically process alarms to simplify indications from the EPMS, which improves the end-user's ability to respond in a timely manner. Its purpose is to leverage the end-user's market segment/type to evaluate alarms through their significance to a particular customer's energy segment. For example, experiencing voltage sag events in one market segment/type (e.g., semiconductor fabs, data centers, etc.) may have a more detrimental impact to an operation than in a second market segment/type (e.g., commercial office buildings, etc.). Additionally, the time an event occurs (e.g., day, evening, etc.) in one market segment/type may be more detrimental than in another. The disclosed systems and methods facilitate the amalgamation of alarm data to help end-users identify problems for troubleshooting and cause analysis.

Figure 6:
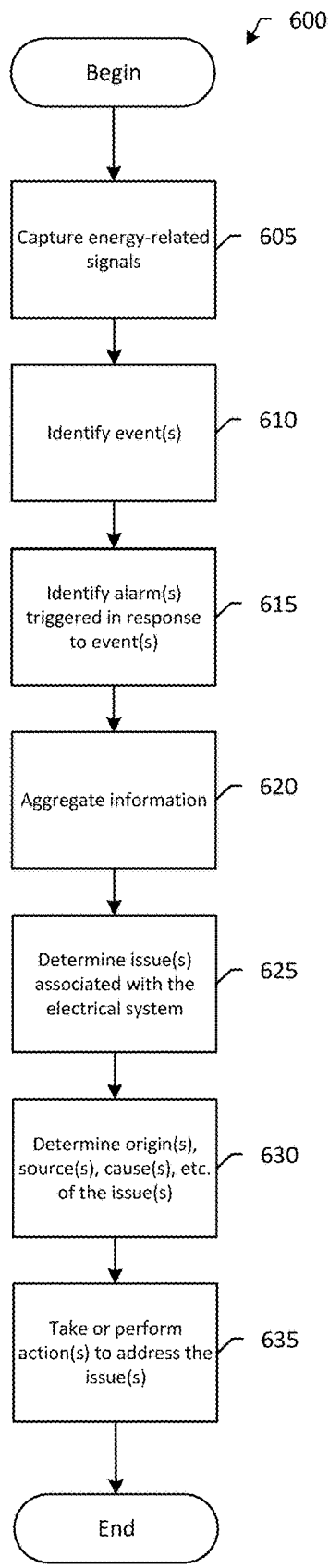
FIG. 6 shows an example method for analyzing alarms to characterize electrical system issues in accordance with embodiments of the disclosure.

Referring to FIG. 6, a flowchart illustrates an example method 600 for analyzing alarms to characterize electrical system issues in accordance with one aspect of the disclosure. Similar to the methods previously discussed (e.g., methods 200, 400, 500), method 600 may be implemented on a processor of at least one IED (e.g., 121, shown in FIG. 1A) in an electrical/power system, a processor of a diagnostic computing system (e.g., 125, shown in FIG. 1) in the electrical/power system, and/or remote from the at least one IED and the diagnostic computing system.

As illustrated in FIG. 6, the method 600 begins at block 605, similar to block 205 of method 200 discussed above, energy-related signals (or waveforms) are captured or derived by at least one IED in the electrical/power system. At block 610, similar to block 210 of method 200, electrical measurement data from or derived from the energy-related signals is processed to identify events (e.g., power events) in the electrical/power system. Additionally, at block 615, similar to block 215 of method 200, it is determined if any alarms have been, should be, or should have been, triggered in response to the identified events in, or associated with, the electrical system (e.g., power events).

At block 620, select information is aggregated. For example, in one example implementation, information relating to at least the identified events and/or the identified alarms may be aggregated (e.g., quantity of daily events or alarms, quantity of groups of time-wise-overlapping events, impact on the downstream loads, etc.). It is understood that other example types of information may be aggregated at block 620, similar to comparable blocks of previous methods (e.g., block 220 of method 200). For example, in accordance with embodiments of this disclosure, the aggregated information may further include information from at least one of: an EPMS, a SCADA system (e.g., Power SCADA, Manufacturing SCADA), a building management system (BMS), I/O devices or data, PLC data, and system users (e.g., user-initiated actions). As noted earlier in this disclosure, in some instances the EPMS may include the at least one IED responsible for capturing or deriving the energy-related signals (e.g., at block 605 of method 600).

Similar to block 220 of method 200, in accordance with some embodiments of this disclosure, the information aggregated at block 620 may be aggregated based, at least in part, on customer or segment-type (e.g., retail, offices, hotels, hospitals, data centers, food and beverage, and oil and gas) because electrical system issues may be unique to each site/customer application).

At block 625, the aggregated information is analyzed to determine issue(s) associated with the electrical system. In some embodiments, the issue(s) associated with the electrical system may include issue(s) associated with an EPMS responsible for monitoring the electrical system, for example. The issue(s) associated with the EPMS may include, for example, issue(s) associated with the EPMS not detecting or inadequately detecting issue(s) existing in the electrical system (e.g., not configured, misconfigured, IED issue, comms issue, etc.). It is understood that many other types of issue(s) may exist and be determined. For example, the issue(s) may be associated with loads, infrastructure (e.g., transformers), and/or other types of monitoring equipment in addition to EPMS in the electrical system. For example, data event and/or alarm data from a first IED can be used to identify an event and/or alarm that should be or should have been (but were not) captured from a second IED. This approach can be used to identify misconfigurations (e.g., incorrect threshold settings), missing data, inappropriate IED applications, etc. In another application, the system may detect that all IEDs are only using the default settings and/or no alarm has been tuned or configured for this site. In either case, the system would optionally raise an alert and send a report to user of the EPMS.

It is understood that various types of information may be used to determine the issue(s) associated with the electrical system. For example, information relating to impact and location may be analyzed with the aggregated information to determine the issue(s) associated with the electrical system, in some example implementations. Additionally, in accordance with some embodiments of this disclosure, the issue(s) associated with the electrical system may be determined, based, at least in part, on the customer or segment-type.

In accordance with some embodiments of this disclosure, the issue(s) associated with the electrical system may be indicative of the electrical system's health. An electrical system's health may correspond, for example, to a condition of the electrical system or ability of the electrical system to perform or operate as intended. In some example implementations, the electrical system's health may be related to electrical system's alarm health, with the electrical system's alarm health being indicative of the electrical system's health. The electrical system's alarm health may be determined, for example, based, at least in part, on an analysis of at least one of: quantity(s), type(s), behavior(s), impact(s), and location(s) of the identified alarms.

At block 630, the aggregated information may also be analyzed to determine origin(s), source(s), cause(s), transitions/evolutions and/or interrelationships of the issue(s) associated with the electrical system. Similar to block 625, in accordance with some embodiments of this disclosure, information relating to impact and/or location may be analyzed with the aggregated information to determine the origin(s), source(s), cause(s), transitions/evolutions, and/or interrelationships of the issue(s) associated with the electrical system.

In accordance with some embodiments of this disclosure, the origin(s) may include time(s), location(s), etc. of the issue(s). Additionally, the source(s) may include process(es) and/or specific load(s) associated with the issue(s). The cause(s) may include something the process(es) or specific load(s) is/are doing (e.g., motor starting in a process). The transitions/evolutions may include changes overtime in the issue(s). For example, the transitions/evolutions of the issue(s) may indicate changing severity(s), impact(s), priority(s), type(s), etc. of the issue(s) over time. For example, the issue(s) may transition/evolve from a first issue type to a second issue type over time (e.g., a phase-to-ground changing to a phase-to-phase-to-ground fault).

The interrelationships of the issue(s) may indicate relationship(s) between various issue(s) associated with the electrical system. For example, a first issue in the electrical system may be linked either directly or indirectly to a second issue in the electrical system. Knowledge of the interrelationships between these issues may help better characterize the issues and more effectively identify solution(s) for addressing or solving the issues. For example, continuing the above example, the initial alarm was generated by a tree branch blowing onto one phase of an overhead three-phase circuit (e.g., a phase-to-ground fault). An arc then developed due to the fault condition and flashed over to a second phase of the overhead three-phase circuit (e.g., a phase-to-phase to ground fault).

At block 635, one or more actions may be taken or performed to address the issue(s) associated with the electrical system, for example, based on the origin(s), source(s), cause(s), transitions/evolutions, and/or interrelationships of the issue(s) determined at block 630. The actions may be taken, for example, to increase or improve the operation of the electrical system. More detailed aspects relating to analyzing alarms to address electrical system issues are discussed further later in this disclosure. However, let it suffice here to say that in instances the one or more actions to address the issue(s) associated with the electrical system may include adjustments to one or more alarm parameters or thresholds. Additionally, in embodiments where the issue(s) associated with the electrical system include issue(s) associated with an EPMS responsible for monitoring the electrical system, the one or more actions may include adjusting one or more settings associated with the EPMS configuration to address the issue(s) associated with the EPMS.

In one example implementation, the one or more actions to address the issue(s) are automatically performed by a control system associated with the electrical system. The control system may, for example, be communicatively coupled to the at least one IED responsible for capturing or deriving the energy-related signals, and/or to a cloud-based system, on-site/edge software, a gateway, and/or other head-end system associated with the electrical system.

It is understood that method 600 may include one or more additional blocks in some embodiments. For example, in some embodiments the method 600 may further include determining impact of the identified alarms and/or alarm periods associated with the identified alarms on the electrical system and provide actionable recommendations for reducing or eliminating the impact of the identified alarms and/or the alarm periods associated with the identified alarms on the electrical system. In accordance with some embodiments of this disclosure, the actionable recommendations may be based on customer or segment-type and/or customer-configured or determined preferences.

Figure 7:
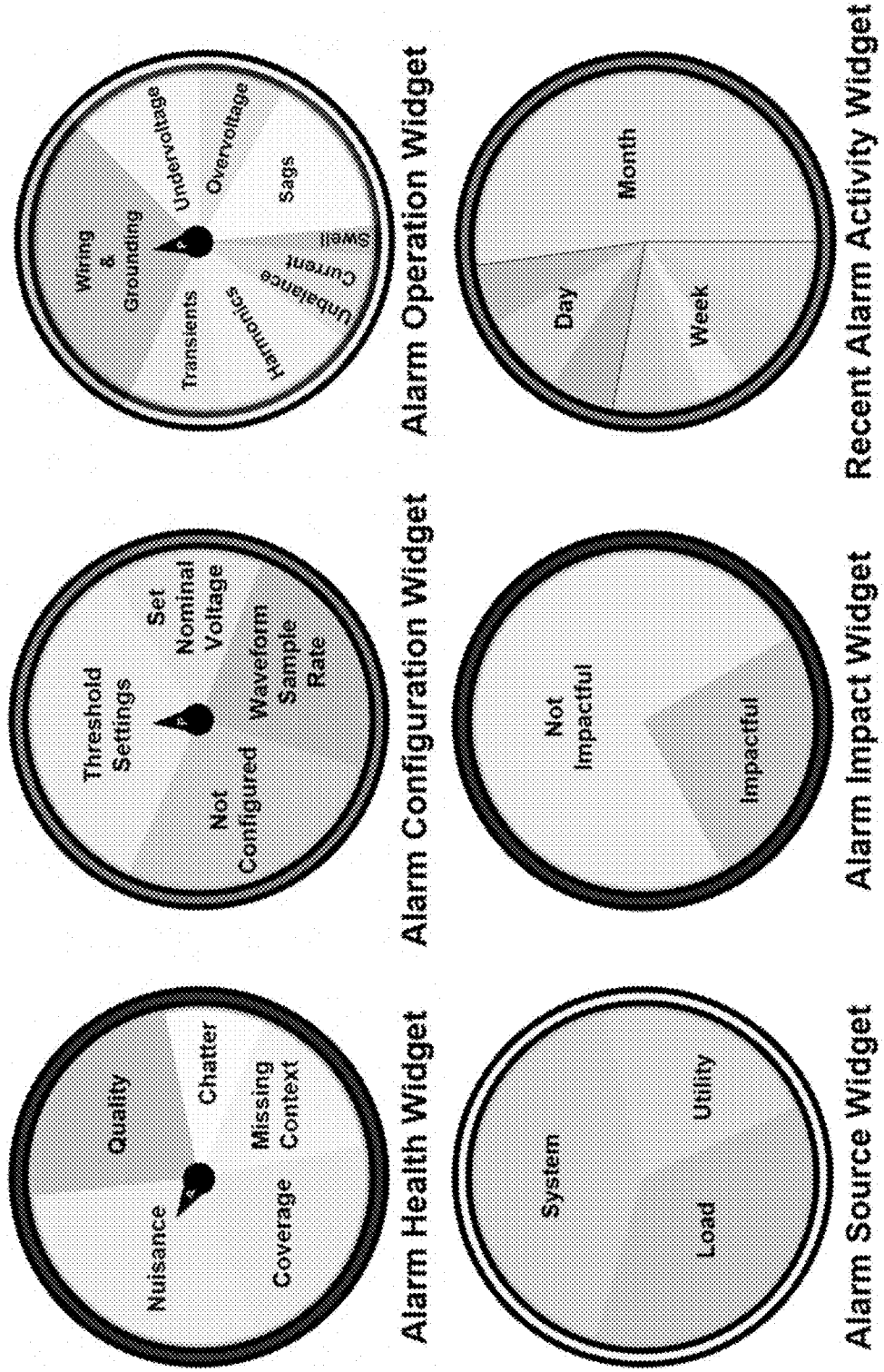
FIG. 7 shows an example alarm data dashboard in accordance with embodiments of the disclosure.

Additionally, method 600 (and other methods disclosed herein) may further include communicating relevant information relating to the identified alarms. The relevant information may, for example, provide real-time awareness of one or more of: alarm health, alarm configuration(s), alarm operation(s), alarm source(s), alarm impact(s), and recent alarm activity. In accordance with some embodiments of this disclosure, the relevant information may be provided on an alarm data dashboard, report, text, email and/or audible communication. Referring briefly to FIG. 7, shown is an exemplary alarm data dashboard in accordance with some embodiments of this disclosure. In some example implementations, the alarm data dashboard may be customizable and configurable (e.g., based on customer segment and/or in response to user input). Additionally, in some example implementations, one or more aspects of the alarm data dashboard may be user selectable and capable of providing more detailed insights and analytics in response to one or more user actions on the alarm data dashboard.

As is known, alarms provide one of an EPMS's most important values to a customer. Unfortunately, they can also be one of the biggest nuisances as well if not properly configured and/or applied. Those with EPMSs universally are required to manage myriads of alarms, some critical and some trivial, some frequent and some occasional; and customers have always been concerned with differentiating between the two. There are many problems associated with alarms that customers face including: excessive alarms, extraneous alarms, alarm criticality, and most especially, their implication to the overall system. Regrettably, events producing alarms can be among a facility's most critical influences on profitability, losses, and overall productivity. Businesses are constrained by their resources and expertise, so it is important to streamline/optimize alarm information to assist customers with simplification, interpretation and resolution of EPMS alarms (and the events that produce them).

The alarm data dashboard shown in FIG. 7, for example, provides many tools to facilitate these needs. For example, the alarm data dashboard provides a clear view/understanding for customers into their EPMS's alarm superstructure. Each "widget" shown in the alarm data dashboard (e.g., Alarm Health Widget, Alarm Configuration Widget, etc.) is presented at a high-level; however, the customer may be allowed to "deep-dive" into any widget's information (e.g., based on or in response to user interactions with the widgets). These tools allow facility managers to more easily understand and quickly respond to electrical alarms and events in real-time. They are also useful for "tuning" the end-user's EPMS according to the needs/requirements of a specific market segment (i.e., what's important, what is not important). Ultimately, this feature increases the value and usefulness of an EPMS, saving the facility manager time, money and resources.

It will be appreciated by one of ordinary skill in the art that alarm data dashboards similar to the alarm data dashboard shown in FIG. 7 may provide numerous benefits in addition to those noted above. For example, alarm data dashboards may: (1) simplify multiple alarm sets on one page/screen, (2) provide "at-a-glance" real-time awareness of alarm health, configuration, operation, sources, impacts and recent activity for both experts and non-experts, (3) enable standard configuration of widgets based on customer segment context, provide continuous evaluation of alarm information and issues, (4) highlight critical alarm priorities, (5) provide vital alarm health metrics via partitioning based on their impact (or potential impact), (6) partition configuration issues according to projected influence on an EPMS, (7) normalize and partition operational impacts according to historical issues related to the end-user's electrical system, and (8) provide the ability to "deep dive" into alarm information from comprehensive to detailed.

It is understood that the alarm data dashboard shown in FIG. 7 is one of many example dashboards contemplated herein.

Figure 8:
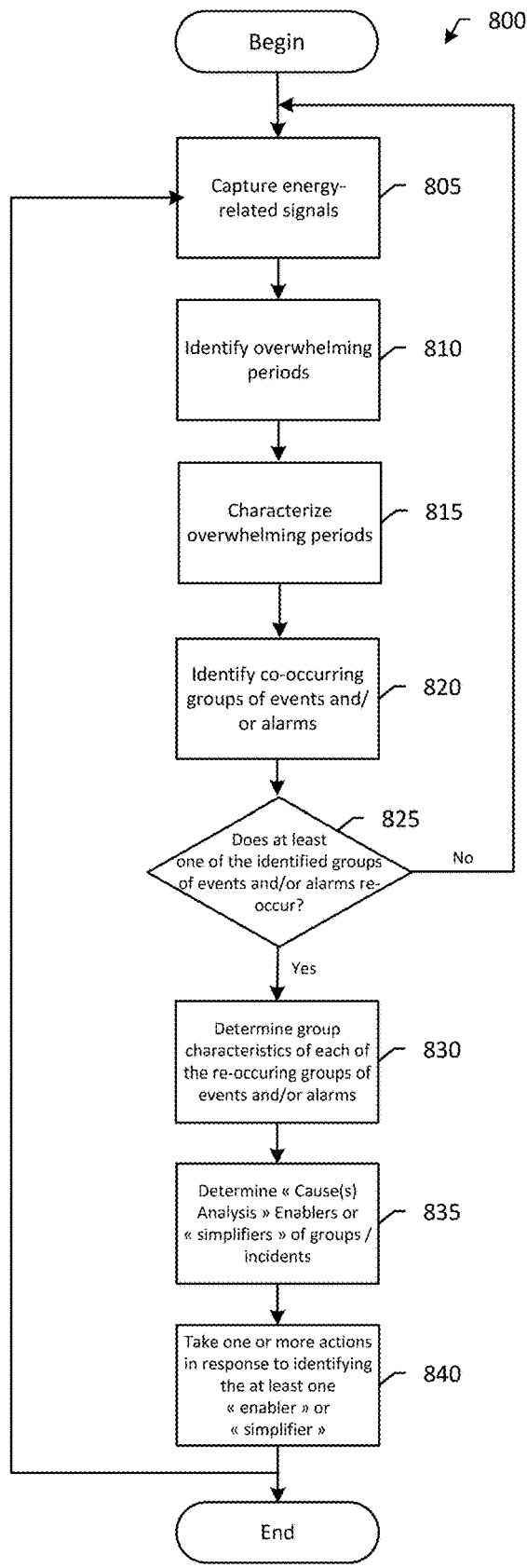
FIG. 8 shows another example method for analyzing alarms to characterize electrical system issues in accordance with embodiments of the disclosure.

Referring to FIG. 8, a flowchart illustrates another example method 800 for analyzing alarms to characterize electrical system issues. In accordance with some embodiments of this disclosure, method 800 is illustrative of example steps that may be performed in connection with one or more of the methods discussed above (e.g., method 600). Similar to the methods discussed above, method 800 may be implemented on a processor of at least one IED (e.g., 121, shown in FIG. 1A) in the electrical/power system, a processor of a diagnostic computing system (e.g., 125, shown in FIG. 1) in the electrical/power system, and/or remote from the at least one IED and the diagnostic computing system.

As illustrated in FIG. 8, the method 800 begins at block 805, where similar to block 205 of method 200 discussed above, energy-related signals (or waveforms) are captured or derived by at least one IED in the electrical/power system. At block 810, electrical measurement data from or derived from the energy-related signals is processed to identify overwhelming periods (distinguishing from normal operating levels). More particularly, the electrical measurement data is processed to identify overwhelming periods of events and/or alarms in the electrical system. For example, the overwhelming periods of events and/or alarms may be identified based on an analysis of aggregated information associated with events and/or alarms identified in the electrical system. As noted in previous figures, the alarms may be triggered in response to the identified events in some instances.

Figure 16:
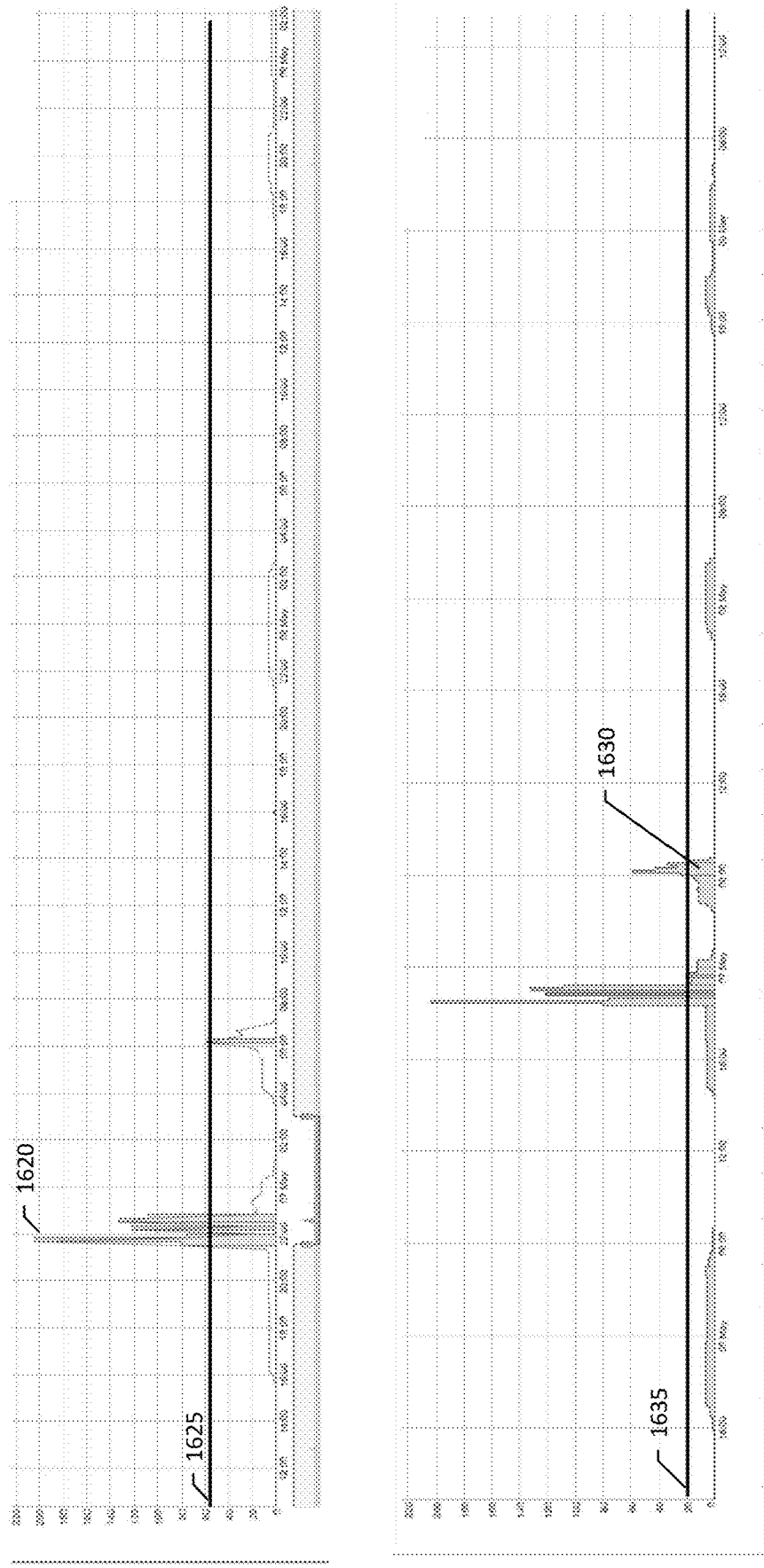
FIG. 16 illustrates two types of overwhelming periods in accordance with embodiments of the disclosure.

In accordance with some embodiments of this disclosure, the goal at block 810 is to identify and tag all periods of overwhelming events and/or alarms. These may be equated, for example, to abnormally high rates of events and/or alarms occurring at a specific time-period (or over one or more specific time periods). It is understood that different time periods may be analyzed, for example, with the time periods selected/analyzed based on what best suits each analysis and/or presentation (e.g., graph in report or in UX of software), as well as combining several time periods to extract the different information from each time period analysis. FIG. 16 provides an illustration of two types of overwhelming periods: spikes (1620) and peak periods (1630). As is visible on this graph, a threshold is inferred from statistical analysis in 1635 (e.g., normal outlier based on median+1.5×IQR) and in 1625 (e.g., extreme outlier based on median+3×IQR) of the number of alarms per interval. These longer duration periods may be defined by fixed time periods (durations), for example, spanning 3 different 10-minute time periods or having a duration of more than 20 minutes. Alternatively, they may be dynamically derived from the normal duration periods. For example, the system could be using the duration of 3rd quantile multiplied by a factor of 3 to determine a "normal duration," and then classify events as peak periods when lasting longer than this "normal duration."

Figure 9:
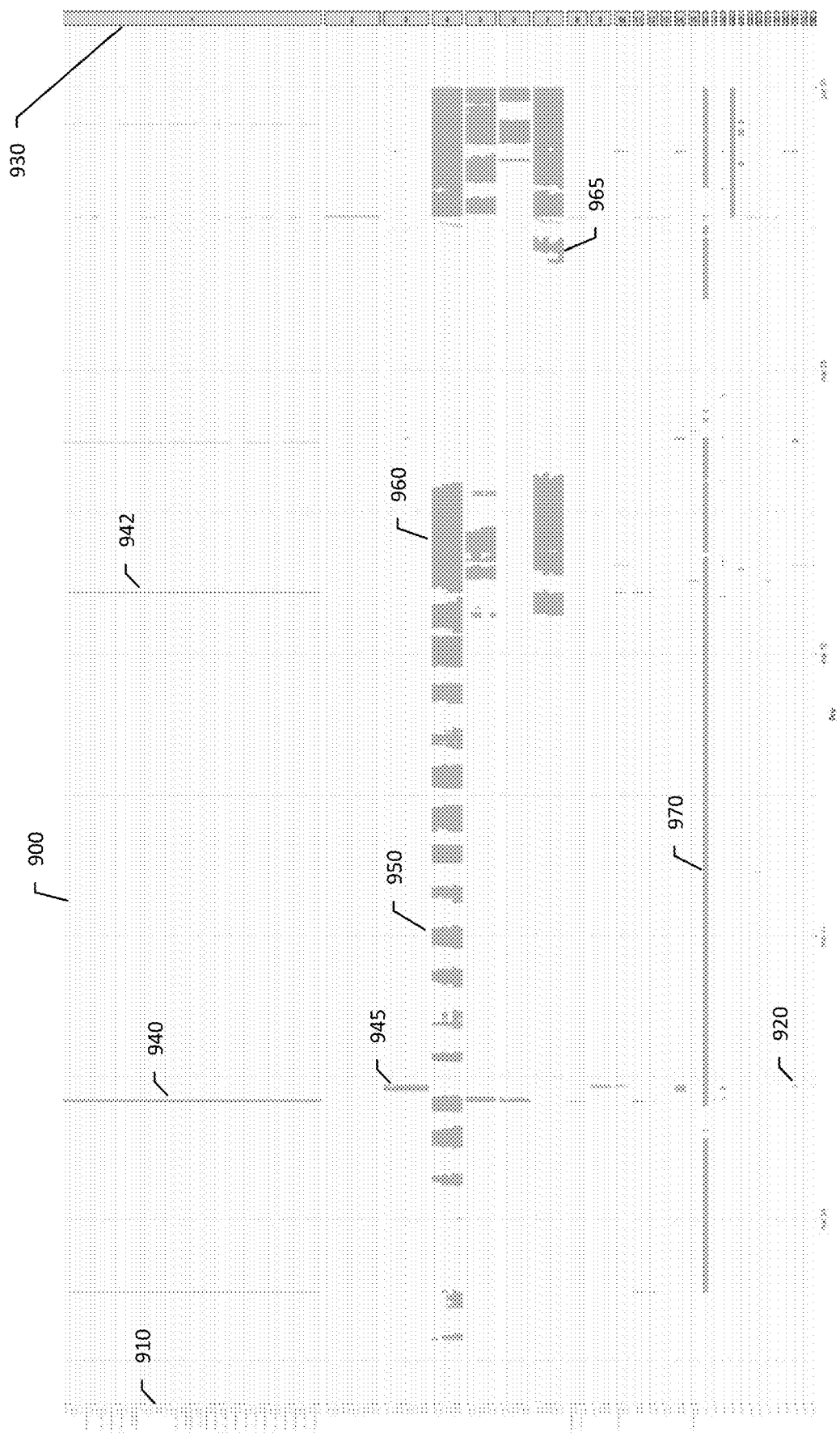
FIG. 9 illustrates various concepts related to identifying overwhelming periods in accordance with embodiments of the disclosure.
Figure 10:
FIG. 10 illustrates various concepts related to identifying overwhelming periods in accordance with embodiments of the disclosure.

FIGS. 9 and 10 illustrate various concepts related to identifying overwhelming periods. For example, in FIG. 9 a fixed 10-minute interval period is used, which may be typical for electrical utilities (depending on geographies as some countries use 15-minute interval periods, but these two may be considered similar). This 10-minute interval period is also used as reference inside the ISA 18.2 standard. It is simple to understand and very intuitive; however, a drawback is that alarms can appear at any time within any given 10-minute interval. Accordingly, you may have a series of alarms appearing in the last minute of a given 10-minute interval, continuing during 12 minutes for example. In this case, it starts in the last minute of interval 1, continues all of interval 2, and ends at the end of minute 1 of interval 3. These series of alarms may be reported by 3 different 10-minutes intervals, for example. A non-specialist may consider this alarms series as a 30-minute duration, which obviously is incorrect.

It is understood that there are several other fixed time periods which may be used. For example, a 1-minute time period may be used. An example advantage of this time period is higher resolution of events start and end. An example drawback of this time period is less aggregation, which may produce more complexity for users. Additionally, it is not used in the ISA 18.2 and may be considered too short a duration to measure any response capability. One-minute time interval periods also typically do no match any team or process reactivity measurement (10 minutes is often used as the minimal time required for a team to be alerted, and possibly to have a fast first-level response to new event(s) and/or alarm(s)).

In accordance with embodiments of this disclosure, 1-hour time periods may also be used. A main advantage of this time period is aggregation of data over a longer time period (vs. 1- or 10-minute time periods). Additionally, it's easy for a maintenance manager to think of eight 1-hour periods as representative for a work shift, for example. A main disadvantage is that 1-hour is extremely long compared to the duration of certain types of events such as voltage sags or voltage swell or transients. Additionally, several occurrences or re-occurrences may happen during this long-time interval. It is understood that this time period may not provide sufficient granularity for certain types of analysis conducted in later steps in some instances.

In accordance with embodiments of this disclosure, 2-hour time periods may also be used. It is understood that 2-hour time periods have similar benefits and drawbacks as the 1-hour time interval period, for example. A 2-hour time period may be used to trigger certain steady-state alarms (e.g., "mean THD over 2-hour time interval" alarm) in some instances. As such, aggregating alarms over a 2-hour interval duration would match the interval used to trigger the alarms (e.g., the 2 hours used to calculate the mean value). An example benefit may the analysis time period matches the alarm-trigger period be for these types of alarms. An example disadvantage is the reduction of granularity. Again, if you compare events which have a duration of less than one second to the 2-hour interval, the precision of time analysis is reduced to a 1:7200 (2 hours×60 minutes×60 seconds).

It is understood that other fixed time periods may be used, such as 8 hours (i.e., equivalent to a typical work shift), daily, weekly, monthly, quarterly, semesterly, yearly, for example. These time periods are useful for reporting aggregated results such as highlighting trends of the increase in the average rate of alarms or the number of overwhelming periods when comparing different seasons over a 1-year analysis period.

It is understood that there are also events/alarms driven periods (i.e., events/alarms inferred periods). These periods are not based on any fixed reference such as duration of the interval, pickup timestamp or dropout timestamps. By definition, events and/or alarms are triggered only when an event and/or alarm is detected, which may sometimes make fixed time periods less relevant. In some instances, only few time periods may have events and/or alarms. Additionally, there may be very short alarms bursts (e.g., alarms within 2 seconds) in some instances. There may also be several alarm bursts within 10 minutes (e.g., four bursts of 70 alarms picked up by 35 different IEDs) or another time interval, for example, with each burst being short (e.g., a few seconds) and separated by more than one minute from the next alarm burst.

FIG. 10 illustrates leveraging events and/or alarms-driven periods such as, for example, the "detection of the sequences of overlapping events," which most often have different durations. Some may last only 2 seconds, for example. As described in co-pending U.S. patent application Ser. No. 17/044,934, for example, which is entitled "Systems and Methods for Intelligent Alarm Grouping" and assigned to the same assignee as the present disclosure, the system may add some duration to extend the dropout timestamp of these sequences, the goal being to extend the sequence and grab any related, yet delayed event and/or alarm (or to compensate for clock drift). The consequence is that any sequence will be deemed to have ended if no new event/alarm occurs during a given duration. This could be a fixed duration (e.g., minimum 60 seconds of no event and/or alarm occurrence) or it could be inferred from the previous months (e.g., based on the typical duration to next sequence of overlapping events when not applying the time extension calculation). Additionally, this may even be tuned to the type of power quality or protection type of event and/or alarm.

FIG. 10 has groups in block 1030 that are similar to block 930. They are the groups calculated by the system based on the alarms co-occurrences in all of the sequences (numerical 1015 shows the number of sequences on X axis of this graph). The lines in numerical 1010 are similar to numerical 910 as well. Numerical 1020 is also similar to 920. This is an illustration of single sequence (similar to the 10-minutes interval). Numerical 1040 illustrates the same events as in 940. This provides more details for a user and the automated analysis. In 940, three consecutive 10-minute interval showed voltage sags from all these IEDs. In 1040, it becomes visible that the system detected 9 sequences. The internal details of these sequences may be visualized further in FIG. 15B where numerical 1510 shows that the same IED was first to detect this event in eight of these sequences, always indicating a downward direction into the electrical system. Numerical 1050 shows similar single event as 920 does, so zooming into the sequences does not provide additional distinctive information from analyzing the 10-minutes interval data.

Different implementations of how to detect overwhelming periods are possible and covered by the present disclosure. In one example implementation, statistical methods may be used such as calculating over an analysis period (e.g., 1-month, or 1-quarter as example), calculating the median value, and the interquartile ratio (i.e., IQR or distance between the 25th percentile and the 75th percentile). Two different thresholds may be determined, for example, based on "median value+1.5*IQR" (i.e., "outlier" threshold) and "median value+3*IQR" (i.e., extreme outlier threshold).

Figure 11:
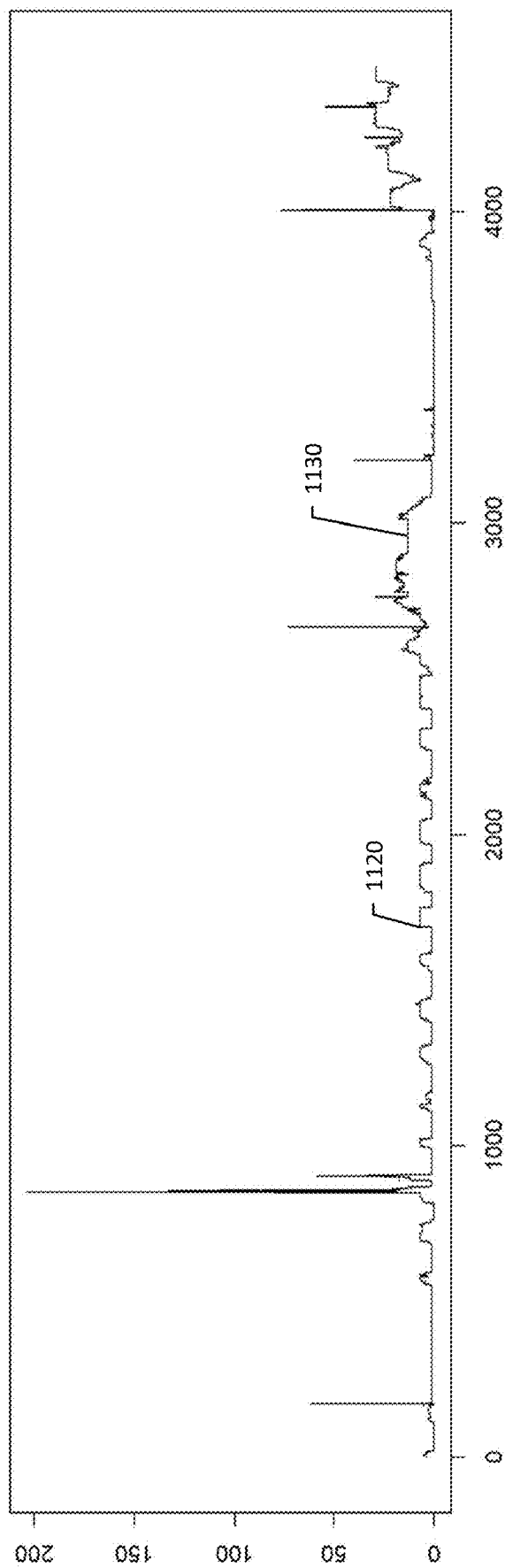
FIG. 11 illustrates an example of leveraging machine learning changepoint identification algorithms in accordance with embodiments of the disclosure.

FIG. 11 illustrates leveraging of machine learning change-point identification algorithms (e.g., based on median or mean variations or variance variations). Using these algorithms, the system may calculate the locations of all the changepoints, for example (numerical 1120 illustrates one of these changepoints). From each new changepoint forward until the next changepoint is detected, the algorithm will be able to define a median value for this section (numerical 1130 illustrates one of these median values). Each section is composed of all time intervals comprised between two consecutive changepoints. Once these sections are identified, each may be weighted by the number of intervals that are contained in a section and then a method to define what is normal, abnormal, and extreme may be applied. It could rely on statistics (e.g., median and IQR described above, "mean+2*standard deviation" for outlier, "mean+4*standard deviation" for the extreme outliers' thresholds) or on some other machine learning methods (e.g., clustering).

In another example implementation, machine learning or artificial intelligence algorithms or tools may be leveraged for the same purpose. For example, using the example of alarms represented by FIG. 11 and using clustering, we may find 4 clusters (e.g., cluster 1 covering a range from 0 to 2 values, cluster 2 covering a range between 3 and 10 alarms, cluster 3 covering range of 15 to 45, and cluster 4 covering ranges from 55 to 210). Taking the upper value of each cluster, we may deduce a threshold at 2, 10 and 45 (alarms per 10-minute interval). By checking this against a distribution we see that only very few values are present in cluster 4, few values are present in cluster 3, and most values (>50% of the total quantity of values) are present in clusters 1 and 2. Keeping the two higher clusters, we may consider the value of 45 (and so all points above) to be extreme high values as a threshold, and we may consider a threshold for abnormally high values (aka outliers) at values ranging between 15 to 44.

It is understood that there may be many other algorithms and tools and methods that may be considered and implemented or leveraged by any one knowledgeable in the art of AI, machine learning, specifically in the field of outlier identification or anomaly detection.

At block 815, the overwhelming periods identified at block 810 may be characterized. For example, by leveraging the above identified thresholds for outliers and extreme outliers, it is possible to tag each interval and/or sequence, as a potentially "overwhelming period/interval" (i.e., number of alarms is above outlier threshold) or "extremely overwhelming period/interval" (i.e., number of alarms is above extreme outlier threshold).

After this statistical and/or machine learning tag, some expertise or commonsense rules should be applied to filter "absurd" classifications (e.g., when most values are at 0 alarms per interval, 2 alarms per interval may already be considered outlier, and 4 alarms as extreme outlier, from a pure statistical approach). These rules may be very simple, for example, "if less than 15 alarms per 10-minute interval, then do not use that threshold", or "create a threshold if more than 50 alarms per 10-minute interval". Or they may be set specifically by leveraging expertise and knowledge of the site (e.g., if one knows the number of operators, for example). Thorough alarms knowledge and knowing the maintenance alarms-handling capacity is helpful to establish these rules. Additionally, one could use expertise rules, leverage statistical, or machine learning algorithms to deduce typical thresholds for a specific customer segment or type of driven process or loads.

After tagging each interval as "normal," "overwhelming period/interval," or "extremely overwhelming period/interval," the system may append relevant characteristics to each interval (e.g., number of alarms present, number of different IED where alarms are present, different types of alarms present, etc.), and may progressively enrich these characteristics as the analysis progresses (e.g., adding the number of clusters present during the interval, as will be visible in block 820 for example).

It is understood that identifying the periods is an important step in articulating the mitigation and remediation actions, and the potential impacts on alarm health more specifically. To determine the action to prioritize, it may be useful to know what part and how many of the "overwhelming periods/intervals" may be reduced or resolved.

At block 820, co-occurring groups of events may be identified. As apparent from the previous step, it is unclear how events and/or alarms may relate to each other. Without looking for co-occurrences, it would produce a very blurred picture of alarms, and no clear pattern would be visible, even to the expert's eye making any analysis very difficult. Today, experts use the location of IED(s) to select a subset of IED(s) or try to identify relevant IEDs, and often may select a time window of events and/or alarms to focus their analysis on. Once the subsets are analyzed, the analysis is tested to see whether it is generalizable (e.g., does it solve the alarms problems occurring during that time period). This may be iterated several times trying to reduce the quantity of events/alarms, looking at other IEDs or time periods. By not analyzing all data available (i.e., focusing on subset of meters and/or time intervals/periods), essential components may be missed and there be no discernment between alarms that are exceptionally co-occurring and alarms that always or generally co-occur.

In one example implementation, the groups of co-occurring alarms may be based on pairwise correlation calculations to provide a distance measurement between each of the IED pairs. This may then be transformed into a matrix that is the input for a hierarchical clustering algorithm (e.g., using K means clustering). Using any method to determine the optimal number of clusters (e.g., a single method or a combination of methods such as described in "nbclust" R package), the clustering tree may be cut at the level defined as optimal. In another example implementation, the system may use any relevant distance measurement calculation (e.g., Euclidean, correlations, z-score, DTW, shape-based distance, etc.) or any machine learning time series clustering algorithms or suite (e.g., dynamic time-warping, shape-based clustering, permutation distribution clustering, TADPole clustering, k-shape clustering, etc.). Whatever chosen techniques will be implemented, this application defines groups of co-occurring events and/or alarms and their corollary, discriminating between alarms that are related (i.e., inferred from these groupings) and alarms that are un-related (i.e., do not or only rarely co-occur over the analyzed period).

There are several steps that are novel. For example, the system may look for co-occurrences of alarms. To perform this, the system only leverages one step of the analysis (i.e., a value 1 for an alarm present in the time interval, or 0 if not present (active alarm) during the same interval). In later steps, the number of alarms is leveraged (e.g., the impact of mitigation prioritization in the probable impact evaluation of a mitigation action, the mitigation performance measurements).

The system may iterate through the sequences of overlapping events, recalculating sub-sequences per cluster. Initially, sequences of overlapping events may take all alarms and events into account that co-occurred as a first step. This may create confusion on the real boundaries of the sequences (e.g., this may link all alarms occurring during one cluster).

In accordance with some embodiments of this disclosure, the system may use the different time periods to calculate the clusters, analyzing and reconciling any differences. At a minimum, for example, the system may run clustering based on presence (or absence) of alarms in the fixed "10-minute intervals," and the dynamic (event inferred) "sequences of overlapping events." For each of these, the system may identify the optimal number of clusters and identify the clusters (e.g., and alarms are contained in each cluster) of co-occurrences of alarms.

The system may then identify any discrepancy, for example, by comparing the clusters identified by the "sequences of overlapping events" to the clusters of "10-minute interval." The system may resolve the differences based on several principles. For example, the differences may be resolved leveraging the most granular information, which will often be the "sequence of overlapping events" clustering. As these sequences may be much shorter (sometimes less than 1 second), and as there are details of all sequences occurring during the 10-minute interval, much more information will be available. Iterations may be triggered, for example, to refine the clustering at later steps, potentially each time more information is appended to a cluster. Examples of appended data per sequence could be whether an event(s) was determined to originate upstream or downstream from an IED. Additionally, the highest confidence level of the source from an IED may be determined in sequence. Load impact information may also be determined in some instances. For example, it may be determined whether any load loss was detected as a result of a voltage sag. Additionally, the maximum impact may be determined in each sequence.

In accordance with some embodiments of this disclosure, the system may apply business logic to these statistical and machine learning tools. In one example implementation of this business logic, all clusters containing only one (e.g., or 2, 3) alarm(s) may be clustered into a "group of distinctive single alarms." Each one of these alarms may have a very distinct signature of presence (i.e., it's clustered by itself and doesn't overlap with other alarm; each alarm is an independent group), so that each cluster may be correctly identified. Accordingly, it may be determined that the machine learning did what was expected. However, the single alarms clusters do not represent anything useful for alarms management. Business logic can then be applied by the system to group all these single-cluster alarms into one new group of "distinctive single alarms." A similar process may be applied by the system for clusters of 2 or 3 alarms, depending on the number of distinct alarms occurring during the analysis period. The main advantage is to understand the patterns that re-occur and have a group of all alarms that do not display any pattern, except that the absence of a common pattern may be considered as a pattern as well). These grouping may be useful in further analysis to filter alarms from further analysis, displays/graphs, or for mitigation actions investigations for example.

Figure 9A:
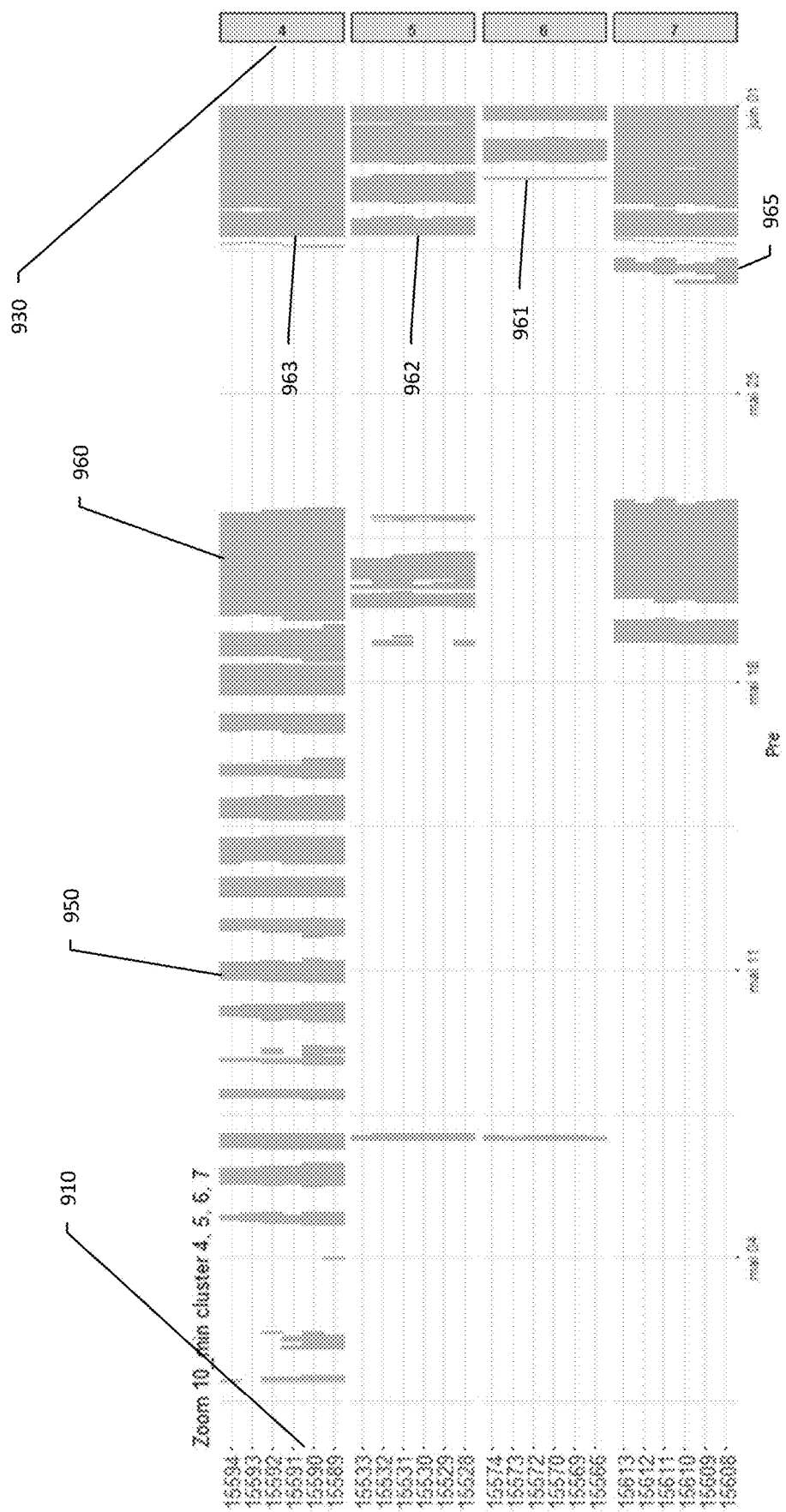
FIG. 9A shows a first perspective view of FIG. 9.

In accordance with some embodiments of this disclosure, the system may infer hierarchical relationships from the clusters and co-occurrence analysis and add these to refine the groupings. In FIG. 9A, for example, we can visually show a link such as (1) Cluster 6 (block 961) is included in Cluster 5 (block 962), and (2) Cluster 5 (block 962) is included in Cluster 4 (block 963). Block 965 shows one example occurrence where cluster 7 is distinct from cluster 4. In this illustration, the system used the term of "cluster" instead of "group" as synonyms. In Cluster 1, for example, alarms A, B, C always co-occur. Alarm D frequently co-occurs with ABC as well, but sometimes is not present. Expert rules may leverage event and/or alarms information (e.g., magnitude, duration, location inside the electrical installation, etc.) to verify the relationship. In some example implementations, the system may recalculate the clustering when significant changes to input data are detected. For example, when new sub-sequences of overlapping events are detected, the system may use the new sub-sequences to recalculate the groups (aka clusters).

At block 825, it may be determined whether the co-occurring groups of events re-occur, for example, how often a pattern repeats. Additionally, it may be determined whether patterns reoccur in at least one group. The system may then evaluate the usefulness of the clustering. To perform this evaluation, the system may first identify how many events reoccur in each grouping. This is one criterion to evaluate the usefulness of the created clusters (i.e., groups of co-occurring events and/or alarms).

The previous step defines similar and dissimilar groupings using co-occurrences as a key input. This means it identifies discriminant patterns based on timestamps and durations. However, at this stage, the system has not yet determined the impact of defining mitigation actions to the system. By evaluating each cluster and determining the number of sequences that reoccur, the systems will be able to predict a probable reduction of future alarms per cluster, and whether a given mitigation action is implemented and achieves expected results.

For example, cluster 1 may have 30 different alarms. On average, each sequence may include 45 alarms within a sequence with some alarms repeating. In one example implementation, cluster 1 may have 20 sequences where similar patterns occur. By focusing on solving the issue related to cluster 1, the number of alarms should decrease by 900 alarms (20 sequences*45 average number of alarms per sequence) in the subsequent month. If all other alarms only repeat rarely (e.g., 5 times or less), then focusing on the more repetitive alarms may be determined as the most useful by the system, based on the count of alarms and of the reoccurrences of the pattern. Other usefulness criteria may be derived, for example, from the alarms data (e.g., impact) or from the contextual data (e.g., type of segment, load types, etc.).

At block 825, if it is determined at least one of the co-occurring groups of events reoccur, the method may proceed to block 830. Alternatively, if it is determined that none of the co-occurring events reoccur, the method may end or return to block 805 (e.g., capturing and analyzing additional energy-related signals).

At block 830, group characteristics of each of the reoccurring co-occurring groups of events are determined. For example, each of these groups (i.e., clusters) may be characterized by their content and patterns. For example:

Quantity of different alarms occurring in each group and typical pattern,

Quantity of different IEDs and sources of alarms in each group,

Quantity of re-occurrences in analyzed period of each group,

List of typical alarm types of each group,

List of the type(s) of alarms in each group,

List of infrequent event types co-appearing in each group,

Identify groups to further separate based on expertise-based rules (e.g., identifying "no possible link" between event types occurring in same group), and Determine typical event-related measured or derived values per group (e.g., typical duration(s) of events and/or alarms, typical number of phases impacted, typical magnitude(s), etc.).

These characteristics may be iteratively completed as the system moves through the workflow (e.g., adding root source identification, impact evaluation, location analysis, direction detection, possible mitigation actions, evaluation of impact of mitigation and remediation solutions, etc.).

At block 835, cause analysis enablers or simplifiers of groups/incidents are identified. For example, the group characteristics of each of the reoccurring co-occurring groups of events identified at block 830 may be used to determine issue(s) associated with the electrical system, such as the origin(s), source(s), cause(s), transitions/evolutions, and/or interrelationships of the issue(s).

It is understood that all the following steps may be combined, and any of these may run sequentially or in parallel to any of the other. For clarity purpose of this application, each will be described as a separate step. But this application will gain from cross-correlating and cross examination to determine any combination of enablers of analysis. The analysis may become more relevant as one or more of these steps are combined and considered as only applying to one of the groups of events and/or alarms. Ideally, if each group has a distinct set of relevant characteristics associated, the cause analysis of each group should trigger specific and distinct mitigation and/or remediation actions. In parallel, the system may always check for a loss of discrimination by evaluating whether other groups start to be related by each step of combining.

A high-level principle is that everything specific (or any specific combination) to a group of events and/or alarms, the specific list of IEDs of this group, or any specific type of event and/or alarm occurring only in this group on these IEDs may be considered as a possible distinctive analysis enabler. Anything that creates overlaps of groups will be re-evaluated and possibly recombined with other measurements and/or enablers (e.g., a list of IEDs may appear in group 1 and group 5). In group 1, the event types are all voltage sags with very short durations. In group 5, all events are related to voltage THD as steady-state events. In such a case, the combination of IED list+type of PQ events will be a discriminant characteristic and may become important. Leveraging the location of related IEDs, the associated loads, the affect circuit branches, and any other enabler may therefore be linked to a specific combined key of IED+PQ type of events). For example, load impact may be determined (e.g., loss of 50% of the load) AND related to a load's operations (e.g., motors' protection relay have tripped) AND the location inside the electrical system may be leveraged in combination to a specific process (e.g., capacitor bank energizing) AND related to a PQ type (e.g., a voltage sag). By looking at all this information and the related time sequences, the system may infer that an energizing capacitor bank created a voltage sag triggering a motor protection relay impacting 50% of the motors' driven loads in a specific production site location. This may be limited to only two branches of the electrical system (i.e., the other branches were un-affected by this event since no alarms were detected as co-occurring on other IEDs).

At block 840, one or more actions are taken or performed in response to the identified cause analysis, enablers or simplifiers. These actions may be taken, for example, to mitigate or remediate issue(s) associated with the electrical system, based in part on the identified cause analysis, enablers or simplifiers. By addressing issue(s) associated with the electrical system, operation of the electrical system may be improved in some instances.

It is understood, there are many types of signals, data and/or information that may be used as inputs to select (e.g., best match) and/or trigger mitigation and/or remediation actions. For example, in one example implementation, the system may leverage a ranked list for each group (e.g., as described in connection with FIG. 12), several groups, and/or all groups as inputs. Additionally, in another example implementation, the system may use any or all result(s) of the steps described in connection with FIG. 12 as inputs, for example. In a further example implementation, any direct measurements, any information on segment type, site size, type of loads, any other site, group of sites, customers groups, and/or user groups used to define benchmarks, etc. may be used as inputs. In another example implementation, any previous actions and associated triggers, measurements, information, events, alarms, and/or any other relevant data may be used as inputs. In a further example implementation, any learned trigger (e.g., triggers, measurements, information, events, alarms, and/or any other relevant data) may be used as inputs. It is understood that the actions to trigger and to select/best match an action may be either pre-defined or learned (e.g., from expert rules, example thresholds based, user inputs using some mobile application to select best solutions, to define, describe, and/or trigger the best actions). It is understood that each one of these implementations may be combined or arranged in any manner as necessary.

Various implementations of remediation and/or mitigations actions that may be taken at block 840, for example, are discussed later in this disclosure.

Subsequent to block 840, the method may end, return to block 805, or one or more actions may be taken. For example, in one embodiment, the method may continue to method 1200 for further analysis. Other example aspects, features, and/or variations of the disclosed invention will be appreciated from discussions below.

Figure 12:
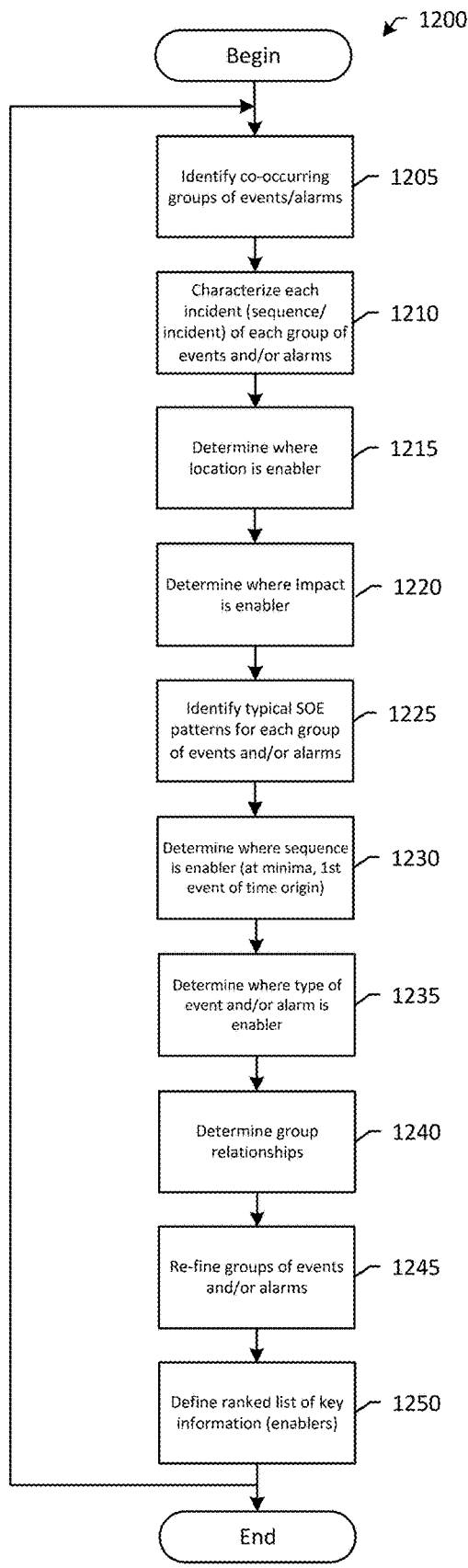
FIG. 12 shows another example method for analyzing alarms to characterize electrical system issues in accordance with embodiments of the disclosure.

Referring to FIG. 12, the flowchart illustrates a further example method 1200 for analyzing alarms to characterize electrical system issues. In accordance with some embodiments of this disclosure, method 1200 is illustrative of example steps that may be performed in connection with one or more of the methods discussed above (e.g., method 800). Similar to the methods discussed above, method 1200 may be implemented on a processor of at least one IED (e.g., 121, shown in FIG. 1A) in the electrical/power system, a processor of a diagnostic computing system (e.g., 125, shown in FIG. 1) in the electrical/power system, an EPMS, and/or remote from the at least one IED and the diagnostic computing system (e.g., in another part/location of the EPMS).

As illustrated in FIG. 12, the method 1200 begins at block 1205, similar to block 820 of method 800 discussed above, co-occurring groups of events and/or alarms may be identified. At block 1210, each incident (sequence/incident) of each group of events/alarms may be characterized. In accordance with some embodiments of this disclosure, this block is similar to block 830 of method 800 in which group characteristics of each of reoccurring groups of events and/or alarms are determined.

At block 1215, it may be determined where location is enabler (key discriminant factor). For example, which IED was first to pick up an event, where the IED located in the electrical system, etc. The system will search for the event source location(s) of each incident (i.e., sequence of overlapping events). In accordance with some embodiments of this disclosure, the event source location(s) may be identified by leveraging all IEDs present in a given cluster and in un-related clusters that may be co-occurring frequently, yet appearing in at least one of the sequences of the given cluster. For example, the list of IEDs per cluster and the hierarchical information contained in the electrical single line diagram may be leveraged to establish any typical specific branch locations for each incident of each cluster. Additionally, this information may be used to deduce a general impacting event (e.g., all branches of the power system are detecting this event and/or alarms).

In accordance with some embodiments of this disclosure, it may be determined whether there are any locations overlapping with other groups. If so, then the differences or relations may be inferred. For example, the same IEDs may be present in cluster 1 and cluster 2; however, the type of events may differ between the two clusters. Identification per location may also be performed, for example, with relevant characteristics appended (e.g., number of sequences, number of alarms, IEDs capabilities & settings per type of event, etc.). Additionally, identification per cluster may be performed by leveraging the list of IEDs and more general contextual information. Links of each cluster to any physical building location (e.g., event zone, distances) or to any typical application derived from a location analysis (e.g., HVAC, lighting, motors, etc.) may be determined in some instances, potentially creating specific graphical representations or graphs to help expert analysis (e.g., spread heatmap, per cluster impacted electrical system branch visualization, etc.).

Figure 13:
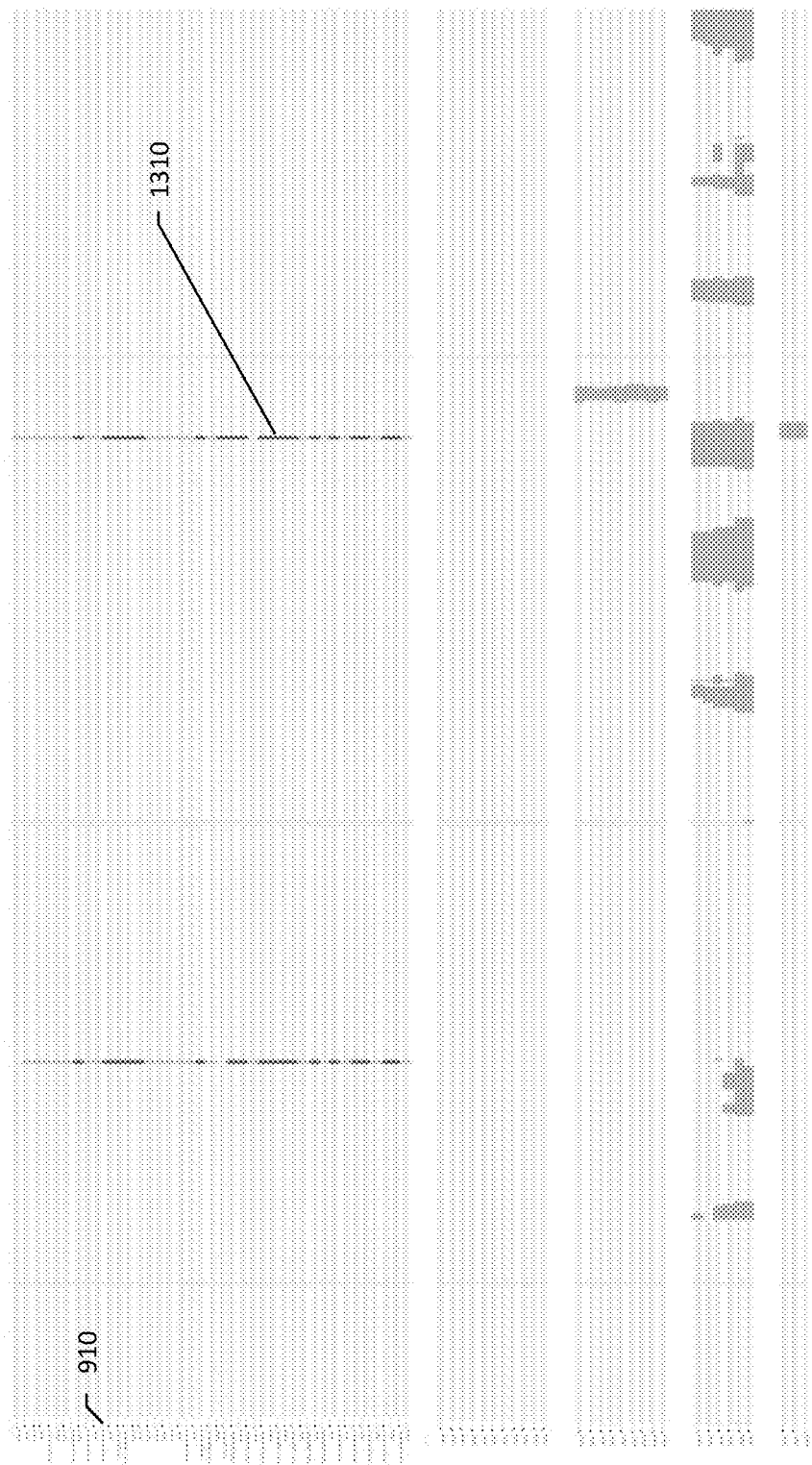
FIG. 13 illustrates example disturbance source location information in accordance with embodiments of the disclosure.

In accordance with some embodiments of this disclosure, analyzing disturbance source location information, by itself, may already provide some useful information. For example, if all disturbance source location measurements indicate sources within the power system, the analysis may clearly infer the causes/sources are most probably within the site (i.e., not originating from the utility), even in absence of an electrical system drawings (e.g., single-line diagrams or SLDs). If disturbance source location information is available in addition to the electrical system drawings, the system may conduct even further analysis leveraging location as possible discriminant information. Further visualization may be produced, for example, as shown in FIG. 13. There the disturbance source location information is represented through grayscale or a color scheme (e.g., downstream source is red, upstream source is blue) and through grayscale (e.g., high confidence is black, low confidence is light gray) or color intensity (e.g., high confidence is very intense color, low confidence is less distinct color). Numerical 1310 illustrates one of these disturbance source location in this graph.

At block 1220, it may be determined where contextual data is enabler (key discriminant factor). In accordance with some embodiments of this disclosure, contextual data may be defined as all data which is not measurements, but which describe some aspects of the environment of these measurements. Some examples provided to illustrate are loads (e.g., motors or capacitor banks), building and manufacturing processes, applications such as lighting or HVAC, etc. In accordance with some embodiments of this disclosure, available and related contextual data may be determined for each incident.

Provided below are examples of different contexts.

Building-related loads (e.g., HVAC rooftop unit, water pump, etc.), building-related applications (e.g., lighting, elevators, etc.), building-related processes and controls (e.g., BMS, etc.).

Manufacturing-related loads (e.g., motors in a conveyor belt, etc.), manufacturing-related application (e.g., automated painting cabin application, etc.), manufacturing-related process and control (e.g., manufacturing SCADA system, etc.).

Power system-related loads (e.g., transformers, capacitor banks, etc.), power system-related applications (e.g., power monitoring system), power system-related process and control (e.g., power system SCADA system, etc.).

Each of these contexts may provide useful data, such as settings, settings changes with timestamps, timestamped status changes of I/O, control or process pickup or dropout timestamps, descriptions of loads with nameplate information, just to provide examples of data. This is very broad and will often be related to a customer segment, building type, application type, size of site, and other variables used to classify activities of sites, buildings, and customers, as may be a standard practice for customer segmentation or customer applications.

In accordance with some embodiments of this disclosure, the system may link the contextual data to the events and/or alarm groups and times of occurrences. In one example implementation, timestamped contextual data is combined with alarm groups and with each incident occurrence time periods (e.g., sequences and/or 10-minute interval). Additionally, in one example implementation, global settings (e.g., configurations of the BMS or the Power SCADA systems, etc.) related to the events, alarms and/or IEDs of this group of events and/or alarms may be appended to the group as meta-data. In one example implementation, identified load(s) monitored by IEDs present in this group of events and/or alarms may be appended to each of the events and/or alarms group as meta-data. As is apparent from the above examples, different layers of attachment are possible, for example, from each event and/or alarm to the IED, and up to anyone of the overall system(s) or application(s). The system may leverage this data to identify a potential enabler of discrimination analysis.

Leveraging this specific type of data, the system may identify a specific link between the data of the group of events and/or alarms and this specific data. To determine if a link is specific, groups may be compared with each other. If any of this data is specific to a given group and does not appear or cannot be linked by the system to any other group (e.g., a BMS process change always co-occur with certain alarms), the system may consider this data as related and distinct to one specific group. Expert rules may then be applied by the system or a user input to teach the system how to determine what is a discriminant enabler. To move a "potential enabler" to a status of validated "enabler," the system may leverage rules based on expertise (e.g., normal measurements by the power system for a given event such as a transformer or capacitor bank energizing) or knowledge (e.g., site type, customer segment type, installation size, etc.). The system may also, over time (e.g., a 6-month learning period), learn and derive an enabler from user inputs (e.g., maintenance teams, etc.).

At block 1225, it may be determined where impact is enabler (i.e., key discriminant factor). For example, possible and measured impacts within each incident of each group of alarms may be identified. It is understood that different impact measurements or probable impact evaluations are a core domain of research. One example of such impact analysis and measurement may include impact analysis and measurement of loss of load (i.e., typically due to an event). Loss of load describes the percentage of the load lost between the pre-event and post-event time periods. For example, current and/or power levels are normalized to 100% before an event is triggered, and loss load indicates the decrease/loss after the event. For example, retaining only 30% of the pre-event current or power after the event concludes.

In accordance with some embodiments of this disclosure, all measured impacts within each incident of each group of alarms may be identified. Each incident may comprise several occurrences of events and/or alarms of the same type from the same IED. Additionally, each one of the events and/or alarms may have an impact measurement associated with it. Probable impacts may be identified if no measurement is available. Additionally, a confidence level may be associated to this estimate. Leveraging segment and building type, a list of probable loads may be inferred. Additionally, expertise-based rules may be leveraged by the system to determine probable impact. For example, it is understood that a contactor will not have sufficient energy to stay closed under a certain magnitude and/or duration of a voltage sag event. If this is a "normally open" contactor, the contactor will open and all the loads driven by this contactor will be de-energized. Combined with the location, application, loads, or electrical system drawings information, this type of analysis will gain higher confidence. The system may be able to estimate impacts with an associated confidence level.

In accordance with some embodiments of this disclosure, groups of alarms may be characterized by measured or estimated impact and determine an impact level (real or probable=risks). For example, information may be aggregated at the incident level and the system may select the highest impact or the cumulative effect if the system identifies it is like a step-by-step incremental impact, in order to characterize the groups of alarms by measured impact.

Described now is an example situation where of a series of consecutive loss or loads were observed. It has been shown that within one month in a cluster (i.e., group of co-occurring alarms), fifteen distinct sequences of voltage sags occurred. But eight of these appeared with less than one hour (i.e., each was separated by at least one minute from the next occurrence with a typical duration less than a few seconds). By comparing the load level of all these voltage sags occurring within one sequence of overlapping events (i.e., incident) or between some very close sequences (e.g., three sequences of voltage sags occur within a 20-minute interval), the system may infer that each loss of load is distinct or the system may infer that the loss of loads is additive (i.e., the impact is cumulative).

The system may infer that each loss of load is distinct. In this case the system may show a very resilient power system and driven loads if each pre-event is returns to similar levels of the 1st initial pre-event level. For example, the power before first sag event is normalized to 100% and the loss of load is 72% after first event. The load then recovers to 99% before a second sag event occurs, dropping the loss of load to 75% after second event, for example. In this case it indicates that any loss of load recovered before next voltage sag occurrence. This could be possible if a process was restarted automatically by a BMS or some control system within the load itself (e.g., rooftop unit control, etc.) and would give an indicator of the max time of recovery (described in previous patent application). The system may also detect an initial impact and subsequently stabilize, for example, if only the first voltage sag occurrence had a loss of load and all successive occurrences of voltage sags did not generate any loss of load.

The system may also detect a progressive impact (i.e., cumulative loss of load) of voltage sags. For example, a first voltage sag occurrence may detect 30% of the load being removed from the system, for example, at 60% of nominal voltage (i.e., during the voltage sag). Subsequently, a more severe voltage sag may occur soon after the first occurrence (e.g., 30 seconds after the initial voltage sag). Additional loss of load may be detected, dropping again by 50%. The system may infer a total loss of load of 65% from initial level before first voltage sag occurred (initial 30%+(50% of the left 70%)).

To characterize the groups of alarms by estimated impact, estimated impact may be aggregated at the incident level. Described now is an example where estimated impact may be used. In a wastewater treatment plant, for example, many large motors may be used that are critical to the process. If a voltage sag occurs and raises alarms that do not contain any loss of load measurements over a relatively long duration (e.g., voltage drops to 30% of nominal voltage in less than one second), the expert rule may state that all contactors opened if no ride-through capabilities (e.g., no uninterruptable power supply) are installed in site. This would mean that the system may infer an impact estimate as being >90% of loss of load for the water processing plant.

At block 1230, it may be determined where the sequence analysis (i.e., at minima identification of $1^{st}$ event and/or alarm in sequence) is an enabler (i.e., key discriminant factor). This type of analysis for one specific incident is widespread in its usage. As such, this will not be developed herein, but simply described at a high level and illustrated. The core hypothesis underlying this type of analysis is a first IED detects an event and potentially triggers an alarm closest to the source of the issue. The implicit condition for this to be valid is the IED's clock should be synchronized (i.e., pickup timestamps all occurring within fractions of a second).

This application will focus on the specific application of a $1^{st}$ event and/or alarm in relation to the groups' analysis (i.e., in the claims). An example novel aspect of the invention is leveraging the identification of the $1^{st}$ event and/or alarm for a group of co-occurring events. By grouping first and then applying this analysis only to the IEDs of this group, it enables discriminating between possible co-occurring events at one specific incident time, but may be completely unrelated. A major benefit is to reduce the probability of wrongly identifying the $1^{st}$ IED to pick up an event and/or alarm. As such, this grouping enables looking in each incident for the real $1^{st}$ location associated with each group of events and/or of alarms. Therefore, it determines a localized (i.e., limited to only the alarms of this group) $1^{st}$ event and/or alarm for each group.

After a $1^{st}$ location was established for all incidents present in each group, the system may look for any patterns indicative of incorrect groupings or for any relation between groups. If an incorrect grouping is detected, the system will try to divide the group into separate groups. The system may trigger the reprocessing of step 1215 and infer a new list of co-occurrence groups. After these steps, a more robust assessment of $1^{st}$ events and/or alarms of all incidents related to each specific group may be provided. The system may identify patterns and infer typical sequences of occurrences within all the incidents of this group.

Figure 15A:
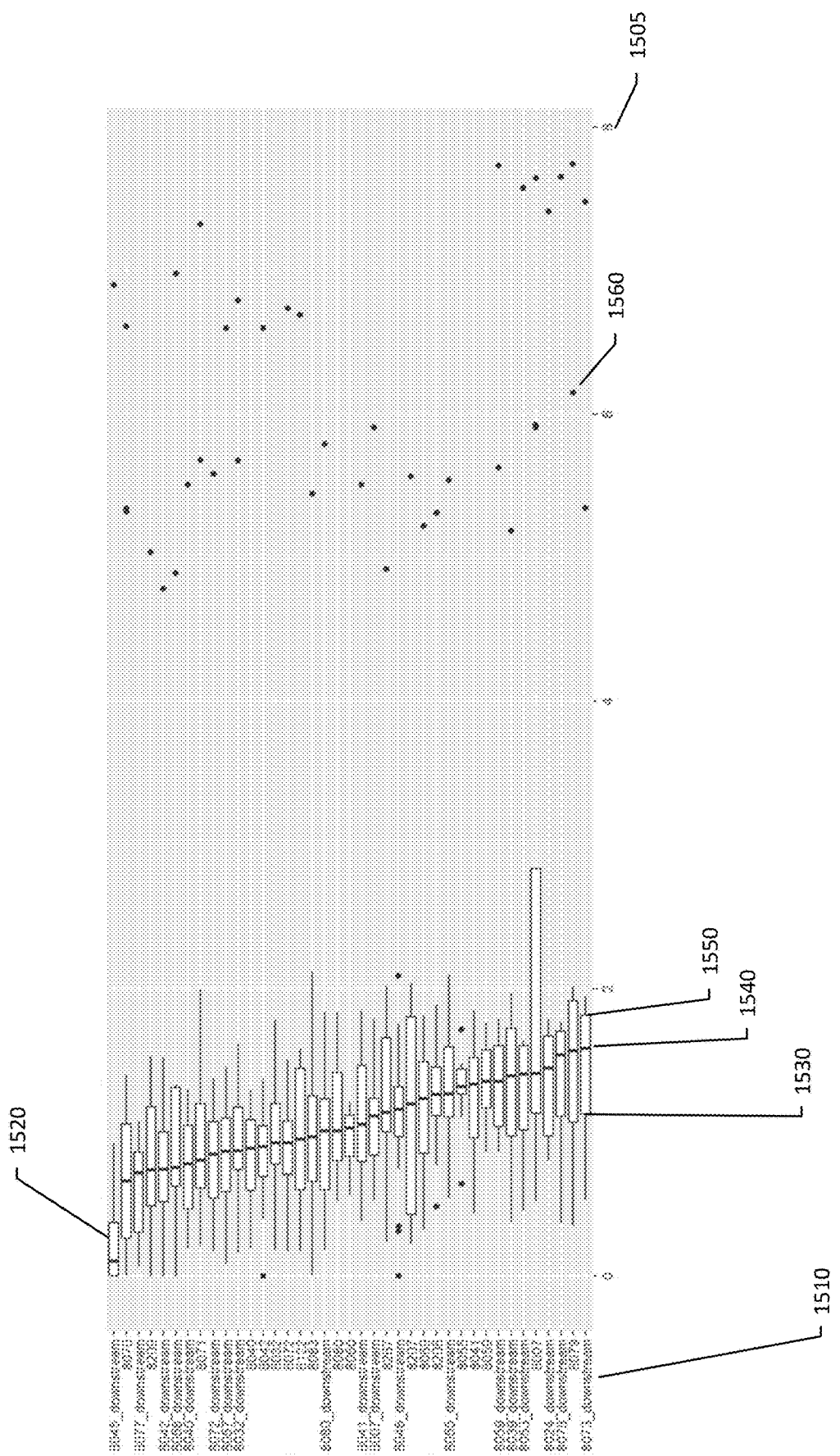
FIG. 15A shows an example analysis of sequences in accordance with embodiments of the disclosure.
Figure 15B:
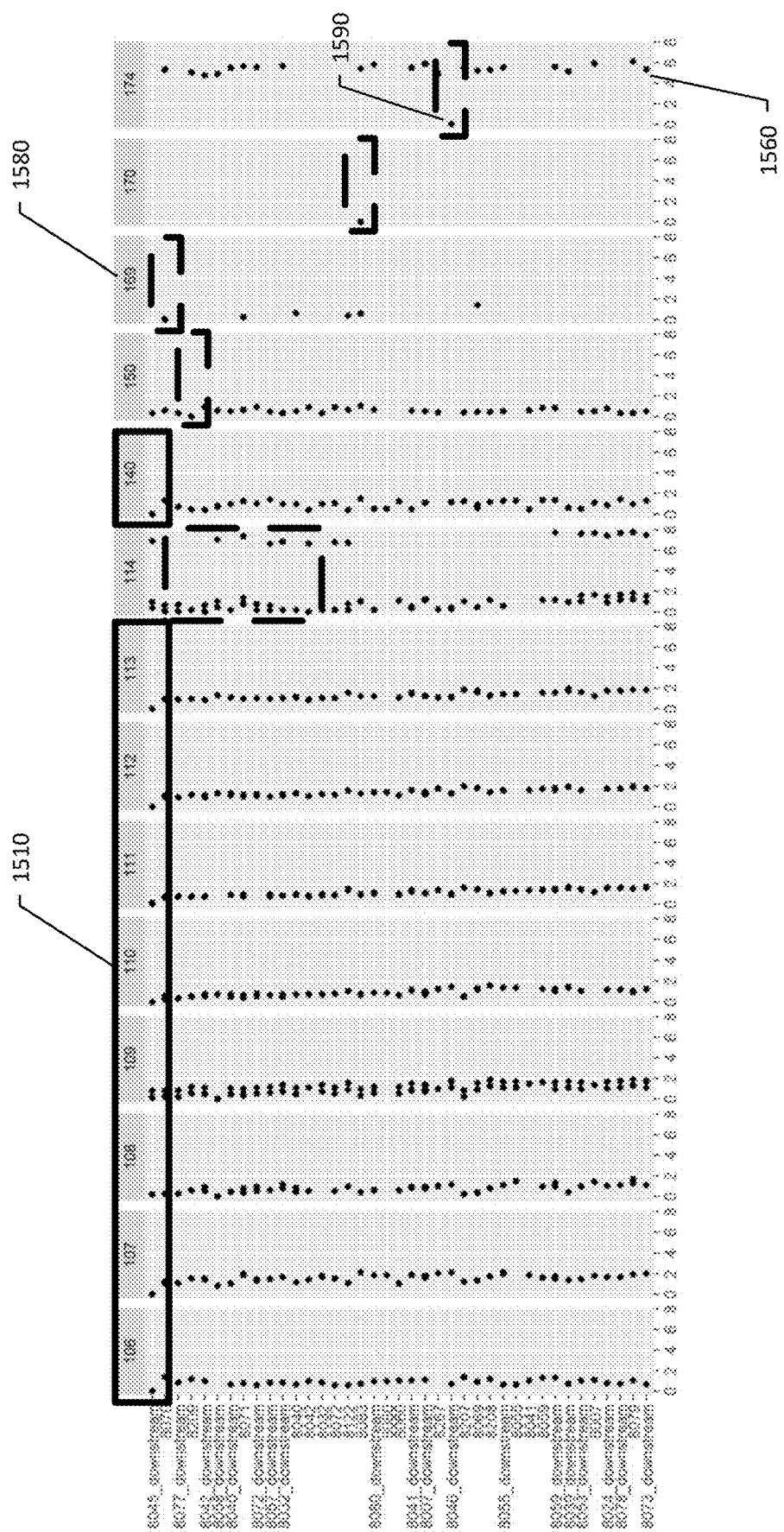
FIG. 15B shows another example analysis of sequences in accordance with embodiments of the disclosure.

FIG. 15A provides an illustration of sequences statistics on fourteen occurrences of incidents. Additionally, FIG. 15B provides a detailed view of the different incidents. Sequences 106 through 113 display the same repetitive pattern, starting each time with 8045 downstream alarms. These sequences correspond to 940 and 1040, and can be considered as a progressive zoom into the incidents and a detailed view of the sequences (timestamp based). It is interesting to note that FIG. 15B seems to confirm the timestamps appear to be synchronized as no meter is always lagging or leading with respect to time. The system may perform an automatic check as described previously. Another automatic check performed is the detection of any outlier behavior. The sequence 174 stands out and will be re-analyzed when considering 1590, and this may retrigger a potential clustering iteration. Some analysis rules may be leveraged in one example implementation. In other cases, the system may request a user/expert assessment, and may subsequently learn from these classifications and propose them to users for validation.

The system may identify the different patterns for each group. The "most frequently re-occurring pattern," such as the 1st one which reoccurs in 8 adjacent sequences (106-113), represents 57% of the occurrences in this group (i.e., 8 out of 14 sequences for this group). This major pattern is considered by the system to have reoccurred in sequence 140 several days later. A second pattern will be distinguished as a "partial presence" occurring in two adjacent sequences (169 & 170). The system may, in one implementation, decide to aggregate the 170 into 169 and may consider 170 as a "replica" of the event of 170.

Three other single occurrences of sequences of alarms will be considered distinct and analyzed individually. An expert analysis may be learned by the system to infer additional rules to automate the processing. These sequences are 114, 150 and 174. Furthermore, the system may apply different simulation options to check for potential matching. For example, the system may tag 174 as particular since most alarms appear to be in a close relation to each other, albeit, in an abnormal relation (timewise) to the first event detected (i.e., 1590). The system may then compare to 174 to a similar $1^{st}$ alarm detected in 114 if the 1590 event was not considered a part of this sequence.

Leveraging additional data available from the above-described application, the duration of alarm 1590 is known to have lasted less than 0.05 seconds. The system will thus analyze the difference between the duration of the alarm in one application, 1) the fact that only one alarm appears separately from all the others, 2) the fact that all other alarms seem aligned with each other, and 3) the fact that the distance between the first alarm and all the following alarms is 4 seconds, providing a ratio of 80 (i.e., 4 sec of "time-to-next"/0.05 sec of "alarm duration"). By using all these indications, the system may slice this specific incident into two separate incidents.

In accordance with some embodiments of this disclosure, the system may detect the probability of IEDs clocks not being synchronized. Additionally, in accordance with some embodiments of this disclosure, the system may create a confidence index of correct sequences by leveraging several indicators and comparing the timestamps of event's pickup pairwise. This is particularly valid if a similar lead or lag occurs in different groups for the same pairwise IED comparison. For example, if the two specific IEDs appear in two or more different groups with different alarm types and there is always a similar leading or lagging time, this would indicate the clocks not being synchronized. Comparing all pairwise lead or lagging times, the system can determine whether one specific device's clock is not synchronized or if the different devices all seem to have clock synchronization issues. This may be leveraged, for example, to improve the EPMS by pointing to the mitigation action of setting up a time synchronization procedure and possibly a system agent to perform clock synchronization on regular basis (e.g., once per day at 00h00). The system may also derive a confidence index from such analysis. In the above-described example, several devices seeming to have similar lead timestamps my cause the system to attribute a low confidence because probable clock synchronization issues occurred. Conversely, if no pattern of leading or lagging regular timestamps appears, the timestamp orders would be varying and the system would derive a high confidence of clock time synchronization.

Figure 14:
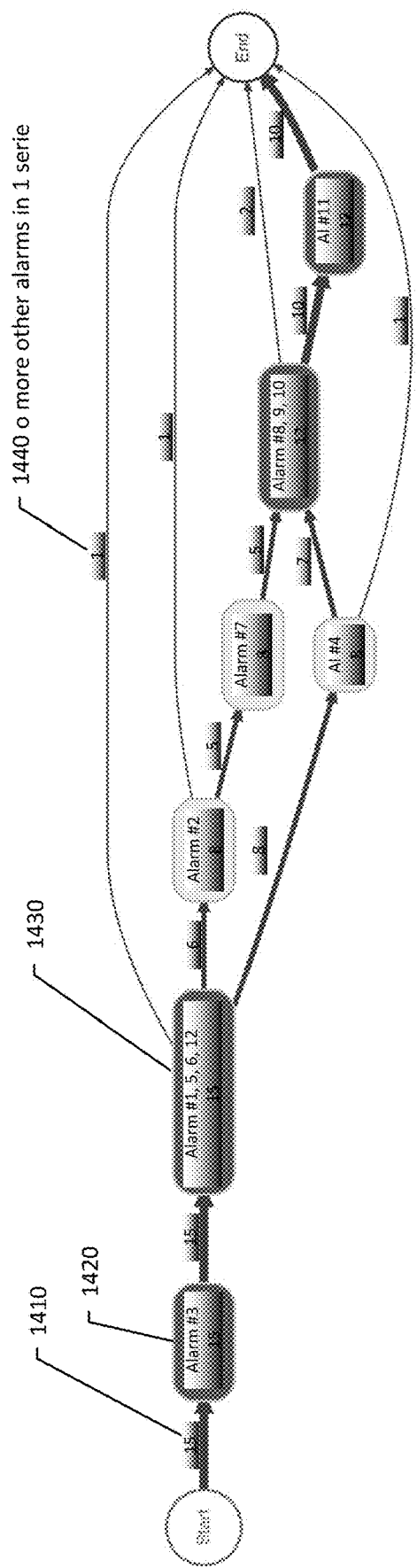
FIG. 14 illustrates example patterns in accordance with embodiments of the disclosure.

In accordance with some embodiments of this disclosure, the system may also look for any reoccurring pattern of appearance of alarms. This may be defined as sequence of alarms analysis. The system may, for example, evaluate whether any pattern emerges. If no pattern represents a certain weight (e.g., 15% of all present alarms in group representing 5 alarms), then a partial pattern may be searched for focusing on the 2 or 3 first steps. FIG. 14 provides an illustration of an example where some clear patterns occur and one particular representation illustrates how to graphically display such a pattern. The input data for this algorithm and for the related graphical output of this analysis is a series of 15 sequences, similar, but not the same as described in FIG. 15B). FIG. 14 presents a graphical output that reads order of occurrence within these sequences. The group of co-occurring alarms being analyzed contains twelve alarms and contains 15 different incidents—1410. For each of these incidents, the sequence of alarms appearing in the incident is used. In all 15 cases, alarm 3 appears first—1420. In all 15 cases, alarms 1, 5, 6 and 12 appear together just after alarm 3-1430. Subsequently, the patterns begin to diverge. In one case, no other alarm is triggered (e.g., path direct to end)—1440. Additionally, in six cases, alarm 2 is triggered. Further, in eight cases, alarm 4 is triggered. It is understood that additional analyses may be performed and more alarms may be observed.

Another analysis of the sequences may be illustrated by the FIG. 15A. At reference numeral 1505, measurement used in the x-axis is the duration from the first occurrence of alarms in seconds. This provide a visual representation a user may use to understand whether all the alarms are extremely close timewise, or whether there are time gaps between the occurrence of one alarm and the following ones (i.e., further providing key information for a source and causal analysis). Reference numeral 1510 shows the ranked by order median duration (reference numeral 1540 illustrates this in the "boxplot"). This ranked list of alarms already provides easy-to-read information for any expert because the alarm appearing in the top row is the first to most frequently appear (reference numeral 1520). The type of statistical graphs used here provides further easy-to-read information for anyone skilled in the art of data analysis related to quartiles (e.g., reference numeral 1530 is second quartile, reference numeral 1550 is third quartile) and outliers (e.g., reference numeral 1560). FIG. 15B then adds more details for a given group of alarms. Reference numeral 1580 is the number of each sequence where any of the alarms of a given group occur. Reference numeral 1590 highlights some very different patterns from the ones displayed most frequently (e.g., reference numeral 1510).

At block 1235, it may be determined where the type of event and/or alarm is an enabler. It is understood that the determination is probably the most common analysis performed by users of alarms, experts trying to troubleshoot alarms, or even IT teams asking experts for a list of alarm types.

A single type of event per group of events and/or alarms will first be considered. Returning now to FIG. 9, as illustrated by reference numerals 940 and 955, several groups of co-occurring events and/or alarms (i.e., clusters) may have only one type of events and/or alarms. When types of events and/or alarms are distinct for each group of events and/or alarms, the system may infer the type of event and/or alarms is an enabler (i.e., discriminant between the groups). Additionally, when a specific type of events and/or alarms is shared by several groups, the system leverages this information to compare the groups and perform a link analysis (cf. 880—Determine Group relationships). The type of events and/or alarm is already a common key between at least two groups and will be leveraged to identify possible links accordingly. The system also leverages this information to distinguish between groups that do not share this type of event and/or alarms.

When a single type of event and/or alarms appear in a majority of groups, the type(s) of events and/or alarms may be mainly an enabler for link analysis of all groups who share the same types of events and/or alarms (as described in 880). They may also be even more discriminant for one or few groups of alarms that do not share the same type(s) of events and/or alarms. However, in certain cases, several types of alarms may co-occur within the same group of events and/or alarms This may re-trigger analysis (e.g., loop back to 1205).

In accordance with some embodiments of this disclosure, grouping may be refined and split into more coherent sub-groups, for example, based on expertise or rules. Some events may be co-occurring, but are by nature of different types. Additionally, there are potentially many possible reasons for co-occurring alarms, the simplest one is that of a global process, turning on several machines/loads at the same time. However, these machines/loads may have different issues and may be started independently by other processes. For example, an HVAC control action triggering several actions only under certain conditions (e.g., several pumps and rooftop units related to one specific process step by the BMS). Another example of a global process is a complex production process step in a manufacturing SCADA system that may start several motors and a welding machine, while the motors and the welding machine have no relation in other process steps.

Based on expert incompatibility rules, the system may split the group into sub-groups with a single or only deemed compatible type(s) of co-occurring events and/or alarms. These rules may be pre-defined or may be learned (e.g., by a user input). In one example implementation, the grouping may be refined and split into more coherent sub-groups based on reapplying the grouping (i.e., clustering) of events and/or alarms specifically to this group or these groups, if several groups display this characteristic. The system may add additional criteria for the clustering to extend beyond the time co-occurrence measurement and move towards multi-dimensional clustering (e.g., adding alarm duration, alarm types, alarm severity score, alarm impact, event source location, etc.).

After an evaluation, the system may consider the groups to be consistent. Further analysis may be performed to determine whether the multiple types of events are related to the same events and/or alarms. If confirmed, this may be a strong indicator (enabler) for expert analysis. In conjunction with other enablers (e.g., first alarm in sequences, loss of load impact, event source location indicating a specific branch and loads, etc.), this will help distinguish between single causes (e.g., one motor start producing voltage sags, etc.) and global process related issues.

As illustrated by the above descriptions, the type(s) of events and/or alarms may be part of any analysis and often will be an enabler of discriminant analysis of events and/or alarms in many or most cases. This may be useful to better understand what is happening, the cause or a consequence of detected events and/or alarms, and relationships that may exist between the different groups and/or between the different events and/or alarms within group(s). It is important to note that, definitions for power quality events and/or alarms, the patterns of steady-state events (e.g., harmonics, voltage unbalance) and of non-steady-state events (e.g., voltage sags, swells, transients) may be very different due to the definition of such an event's typical duration.

Figure 9B:
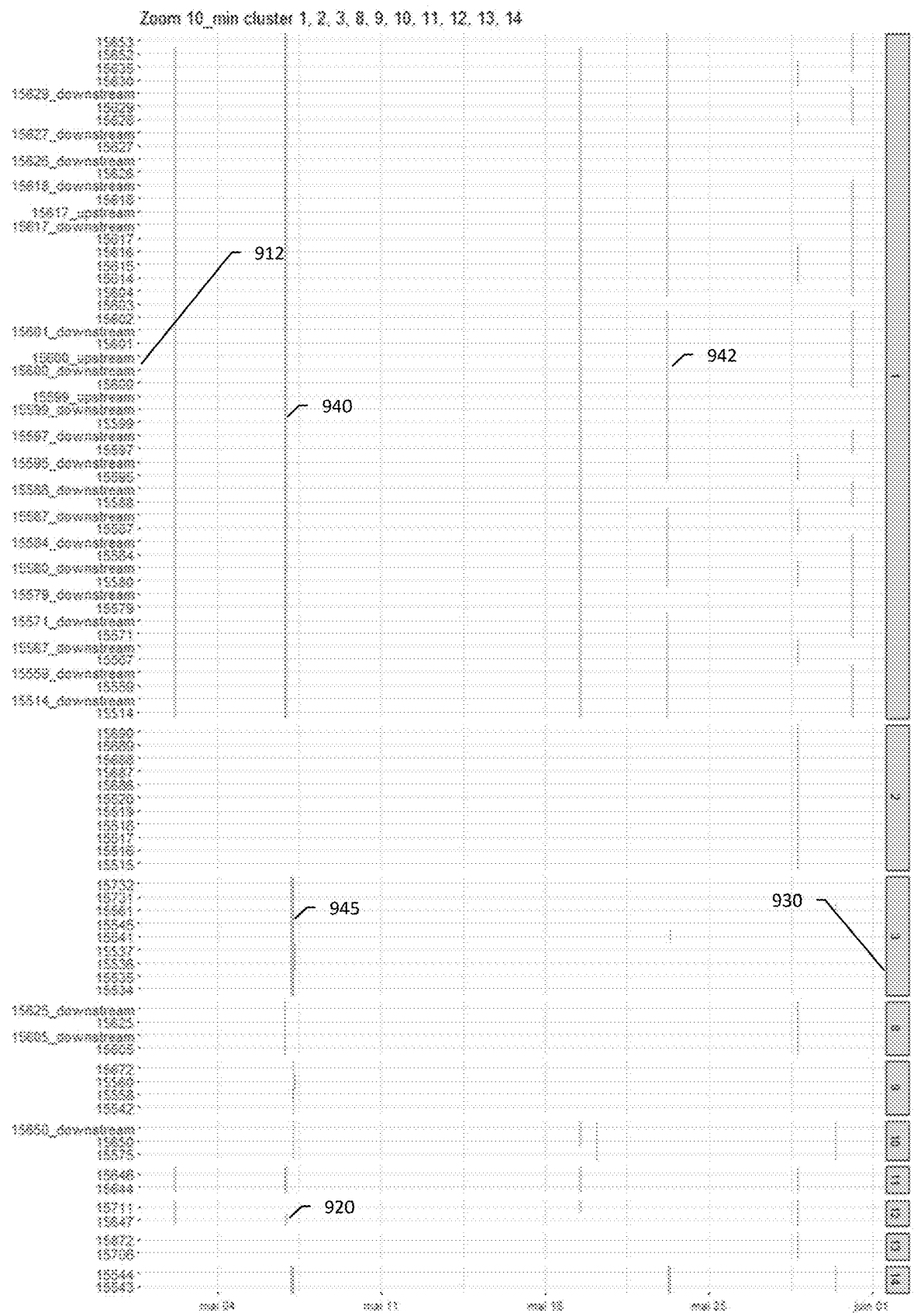
FIG. 9B shows a second perspective view of FIG. 9.
Figure 9C:
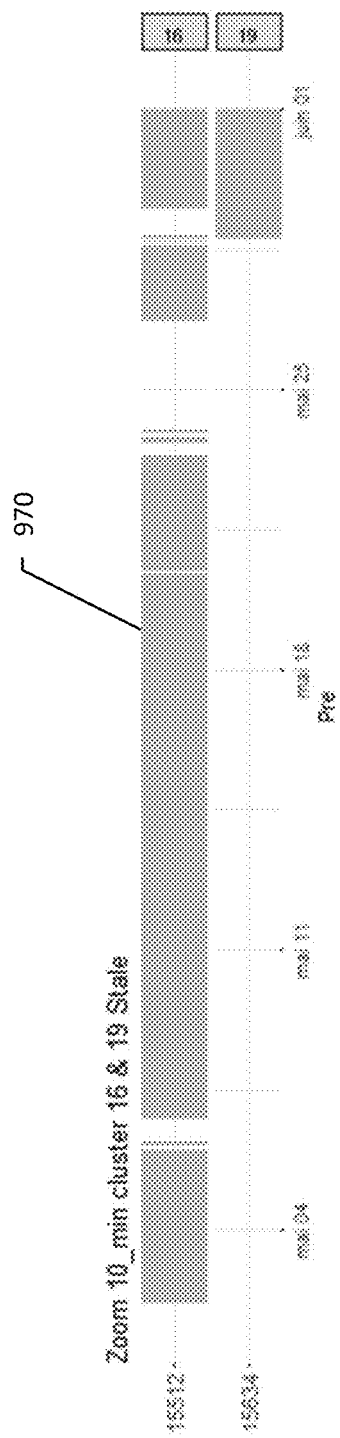
FIG. 9C shows a third perspective view of FIG. 9.

Steady-state PQ events will often last longer than one or more 10-minute intervals, visually becoming spread periods (e.g., 950 in FIG. 9 and in FIG. 9A) that show what may be called "half-day, open hours" periods when alarms appear, or when "several days of consecutive alarms" patterns become visible (e.g., 960 in FIG. 9 and in FIG. 9A). While non-steady-state events are often of a short duration by definition. This would imply that such events and/or alarms only are visible in single or very limited consecutive 10-minute intervals. This is illustrated by 942 in FIG. 9 and in FIG. 9B where voltage sags are present in only one single 10-minute interval, or by 945 in FIG. 9 and in FIG. 9B where voltage sags are present in five consecutive intervals.

If a non-steady-state events show a pattern similar to 950 or worse (e.g., 960), it may be evident to any expert or anyone understanding power quality events that an issue needs to be resolved. There may be an issue with the alarms, for example, when alarms settings may be oversensitive (e.g., voltage sag setting at 5%), or measurements may be incorrect (e.g., incorrect CT or PT ratio setting in an IED creating measurement errors). There may also be an unresolved issue in the site creating constantly repeating or redundant alarms.

In these cases, an impact evaluation analysis may be required to understand, leveraging loss of loads or risks evaluation to the loads affected (i.e., using segment knowledge and load type sensitivity). If load impact is not measured and the risk of impact is low, an end-user may choose to change the alarms and/or events settings to reduce the related alarms nuisance behavior. This is because the events and/or alarms have no load impact and do not require any end-user action, now being categorized as nuisance alarms. If load impact is measured and/or the risk of impact is probable, then alerting and/or mitigation or corrective actions should be triggered. The innovation, as stated in other cases, is the application of this type of analysis to groups of co-occurring events and/or alarms.

At block 1240, group relationships may be determined. In this step, the system may unify different groupings and information from previously performed analysis. Information may include, for example, different identified enablers (e.g., location, impact, type of events, sequences, etc.). Consequently, the system may determine the probable existence of relationship(s) between groups and the probable type of relationship between groups of co-occurring alarms.

In one exemplary implementation, the system may infer inclusion logic. For example, rules may be leveraged when group A contains group B. The rules may include a general assumption, for example, when A has more events/incidents occurrences than B. Absolute inclusion may also be inferred from simple rules, for example, B is included in A each time it occurs (i.e., A co-occurs). For "most frequent inclusion," B may be included in A most of the time it occurs. Periodically, B may appear without co-occurrences of A. This "most of the time" may be predefined (e.g., 90% percentage threshold) or be inferred (e.g., "learned" from groups over a one-year learning period, identifying thresholds to be inside same cluster A of co-occurrences from the clusters, creating a new cluster B). This is useful when end-users do not understand the system in depth (e.g., a new maintenance manager is appointed).

It is understood that group A may be independent of group B in some instances. For example, there may be minimal overlap of alarms in incidents (i.e., "sequences of overlapping events"). Absolute independence may be determined when no alarms overlap (i.e., no co-occurrences). General independence may be determined, for example, when observations indicate that (generally) when A occurs, B does not co-occur. For "most of the time," the above illustration of methods to define these should be consider applicable (e.g., predefined, learned).

In another example implementation, the system may analyze "differences or proximity in types of events" of groups logic. For example, when types of events and/or alarms are distinct for a group of events and/or alarms, the system may confirm groups as being independent. Additionally, when specific types of events and/or alarms are shared by multiple groups, the system may run inclusion logic to check for any type of inclusions of these groups. The system may use this to reduce the subset the groups on which to perform the inclusions analysis. This approach leverages types of events as a preliminary filter of which groups to compare and which are already considered independent (i.e., due to the types of events and/or alarms). When a single type of event and/or alarms appear in a majority of groups, the type(s) of events and/or alarms may be primarily an enabler for confirming independence of the few groups (i.e., clusters) that are of different type of events and/or alarms of the majority of groups.

In the case where several types of alarms may co-occur within the same group of events and/or alarms, the system may evaluate the probability of the cluster being an un-related sub-group. For example, if the system evaluates the sub-groups as being unrelated based on different types of events, the system will refine the grouping and divide the group into more coherent sub-groups. As another example, the system may consider the group to be consistent and leverage it in further analysis after evaluation (e.g., multiple types of events being considered as related to the same events and/or alarms).

In accordance with some embodiments of this disclosure, this step of method 1200 is focused on identifying any type of relationship to validate and, if needed, improve the groupings. These groupings are key aspects for all the analysis. In the above examples, focus is on validating or splitting groups. In another implementation, groups may also be joined together to create a more global group. In FIG. 9, cluster 7 may be considered included in cluster 2. Based on end-user input using pre-defined rules (e.g., if absolute inclusion is identified, merge the two groups), the system may merge the groups together.

At block 1245, groups may be re-grouped or further split into sub-groups based on other enablers. For example, leveraging disturbance source location information to separate groups so that all events and/or alarms indicate toward the source (i.e., probable source is upstream) and are separated from events and/or alarms when the disturbance source location indicates downstream or have mixed directions (i.e., unclear source). Different sequences patterns may also be leveraged by the system to divide groups into more coherent sub-groups (e.g., one group always has an alarm #1 as first to occur while another group may aggregate all the alarms where there is no clear pattern of the first alarm to occur, and no other repetitive pattern of sequences may be identified).

At block 1250, a ranked list of discriminant characteristics and enablers may be defined. By this step, the system has iterated through the groups and arrived at a stability of the groupings. This may be considered an optimal state of splitting and grouping events and/or alarms. Each dimension of the analysis (e.g., location, impact, time origin, load context, the electrical system's layout) is now related to each incident (i.e., "group of co-occurring events and/or alarms", "cluster of alarms").

In accordance with some embodiments of this disclosure, it is essential to understand that each or any of these dimensions may contribute to identifying sources and causes of issues, or may be indicators of "where to focus in the incident analysis" and "what links are identified" for further analysis. In each of these cases, the goal is to use automated analysis to move toward identifying the causes of issues (e.g., capacitor bank energizing, motor starting, etc.) or the sources of issues (e.g., cause unknown, but the location in the electrical system of the IED closest to the issue/event is known). In each case, this automated analysis helps characterize and comprehend each issue. For example, it may be determined whether there are repetitive patterns that may help in prioritization. Additionally, it may be determined whether there are patterns and links that may be missed by a human analyst due to the amount of data or its complexity (e.g., correlation analysis of all events related to a group of events and/or alarms).

At block 1250, this list may be ranked, combined and/or possibly reduced to keep the most discriminant, most important, and most helpful information for future analysis. For example, the information may be used to select, trigger, and/or implement the optimal actions for mitigations and remediations (e.g., at block 840 of method 800 and other methods disclosed herein). In some implementations, the system may leverage dimensions that may be considered "constant." For example, in one instance, all alarms in all the groups may indicate same type of event. As such, a single type of events and/or alarms may be considered a "constant." It is important to highlight this as very unusual (i.e., generally, many different types of alarms tend to occur over longer periods). In some instances, this may become the most relevant information to leverage. As such, end-users and maintenance teams will have only one type of issue to focus on. Implementing mitigation actions (e.g., ride-through solution for voltage sags) becomes easier to define or to specify.

In another example, many alarms may be related to voltage sags, and the disturbance source location may systematically indicate towards the source in all meters using this feature. The system also knows from the electrical system layout that several of the IEDs are utility shadow meters (i.e., installed adjacent to utility meter). In such cases, the system may report all voltage sags appear to originate from the utility and that the voltage sags are originating from the utility system. Consequently, the system may generate a monthly report indicating and quantifying the process impact and evaluating a financial impact based on knowledge of the affected loads.

In some example implementations, the system may establish a rank of all the different dimensions for each group of events and/or alarms. The system may, for example, leverage measured information (e.g., loss of load due to voltage sags), alarms settings (e.g., event severity), and more general site-related information (e.g., geographic location, customer segment, facility size, loads impacted) to define a rank of groups impacted the most in the user and power system (i.e., alarms management). In some instances, the ranking may be based on measurements (e.g., leveraging the mean worst severity scores to define rank per group). Additionally, in some instances, the ranking may be based on expert rules. For example, A predefined list of relative ranks may be leveraged, depending on the types of events and/or alarms (e.g., a score of 100 for voltage sags when loss of load was detected, a score of 90 for voltage imbalance, a score of 80 for voltage THD, etc.). Further, in some instances, the ranking may be based on learned information, for example, when an end-user's interface enables users to attribute a ranking score for each analyzed single or group of events and/or alarms). The system may use these and other means to establish a rank of the different dimensions.

The system may also filter dimensions that are not considered discriminant (i.e., "not impacting"). For example, after the above ranking step, the system may apply a filter to remove dimensions that are considered non-relevant for this group of events and/or alarms. In some instances, it may be based on simple rules (e.g., a minimal ranking score of 40 on a scale of 100) or any other more complex or learned behavior or pattern (e.g., when users no longer tag an event and/or alarm or alarm group with a ranking score).

In some example implementations, the system may have, for each group and with overall ranking score, a possible ranked list of dimensions at the end of all these possible processing steps. This list may be filtered according to each group. Generally, several dimensions may be present. This combination of non-filtered dimensions will be leveraged by the system to determine actions for possible mitigation and/or remediation. The global rank score will be leveraged to determine priorities between groups. Sporadically, one dimension will be present. In this case, the relative score is based on this single dimension that is deemed as the most important and sufficient for determining actions and priority of this action. Infrequently, dimensions will not be present (i.e., all would be filtered as non-relevant). In this case, the system will infer no further analysis of this specific group of alarms is requested and priority will be considered below a minimal threshold.

In one exemplary implementation, the system may attribute higher priority to any groups that are regularly associated with block 810 "Identify overwhelming (from normal operating) periods" and block 815 that "characterizes overwhelming periods" of method 800, for example. The reason to attribute a higher rank score to groups that are regularly associated with the overwhelming periods (i.e., "flood periods of alarms") is the users of alarms (e.g., maintenance teams, engineers) may be able to clearly observe that alarms are overwhelming and/or associated with overwhelming periods if the system resolves these periods.

Subsequent to block 1250, the method may end, return to block 1205, or one or more actions may be taken, as will be appreciated by one of ordinary skill in the art.

As is known, alarms have many purposes including enhancing safety, identifying problems, improving quality, and reducing risk. EPMS (and related) alarms, for example, have historically been used to indicate or bring attention to important conditions or issues. These important conditions may include, for example, anomalous events, meeting thresholds, exceeding parameters, loads energizing or deenergizing, achieving certain criteria, and indicating an allotted time has passed, just to name a few.

Figure 17:
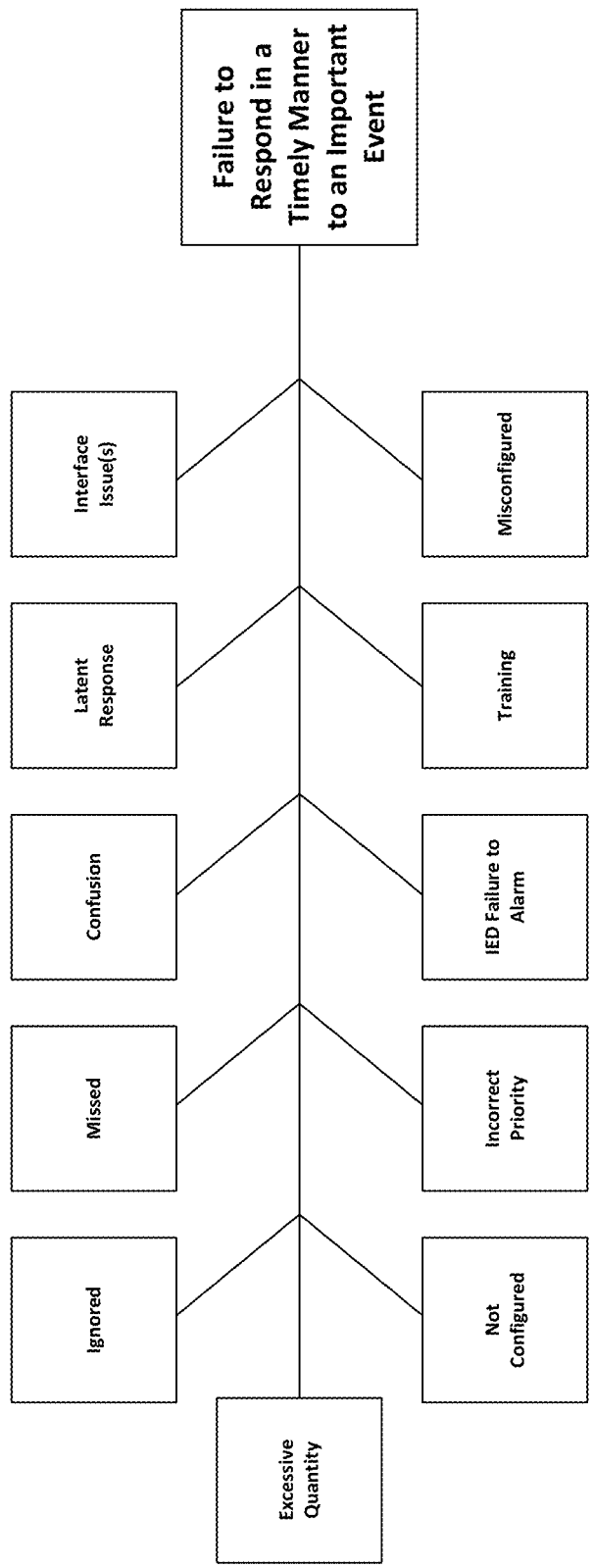
FIG. 17 illustrates several example conditions that can reduce the benefits alarms provide in accordance with embodiments of the disclosure.

An ideally configured EPMS will never fail to alarm on an important event and never alarm in the absence of an event. Unfortunately, real EPMSs may not be configured at all, may be misconfigured, may not use appropriate IEDs (or other equipment) for the intended application, may not have IEDs placed or installed correctly, or some combination of these problems. FIG. 17 illustrates several example conditions that can degrade the benefits alarms provide.

To optimize the value of an EMPS (and associated/related system), it should be designed to only capture events relevant to the users; there may be different types of users, end-users, and partners like services teams). For example, setting thresholds too high will result in potentially missing important events. Additionally, setting thresholds too low may generate too many alarms leading to false alarms and alarm fatigue.

While alarms are typically used to indicate (e.g., audibly, visually, physically, etc.) some form of event, they are also useful for other purposes. Analyzing alarms individually and as a system also provides clues and information related to the alarm's:

origin (e.g., specific load type, operational parameter, etc.), cause (e.g., motor start, fault, variable speed drive operation, etc.), location/source (e.g., utility, inside facility, etc.), severity (e.g., magnitude of the event, etc.), criticality (e.g., the "priority level" attached to each alarm in each IED), system influence (e.g., portions of system experiencing the event, etc.), impact (e.g., affect to loads, recovery time, etc.), occurrence (e.g., whether events are arbitrary or a chronic issue, patterns of co-occurrences and re-occurrences, etc.), and significance (e.g., consequence(s), etc.).

It is understood that a more comprehensive assessment can provide general and specific information related to an alarm's validity, redundancy, necessity, priority, and/or efficacy.

Analyzing alarms provides insight into the event(s) that initiated them; however, it is also possible to infer solutions for those event(s) as well in some cases, especially when viewed through the context of their application (e.g., segment, load, etc.). Addressing the source of alarms (and the events they indicate) through mitigation or remediation will potentially decrease electrical system issues with a commensurate compound reduction in the number of alarms generated by the EPMS (depending on its number of devices).

The culmination of having alarms in EPMSs is to mitigate or remediate electrical system issues. EPMS alarms are available 24/7 (hopefully) to provide a first indication a problem existed, exists or will exist (e.g., when a recurring regular re-occurring pattern of alarms is detected and will re-occur, unless mitigated or remediated, again in a foreseeable future). Once the problem is recognized and identified, the next step is to make it go away through mitigation and/or remediation.

Figure 18:
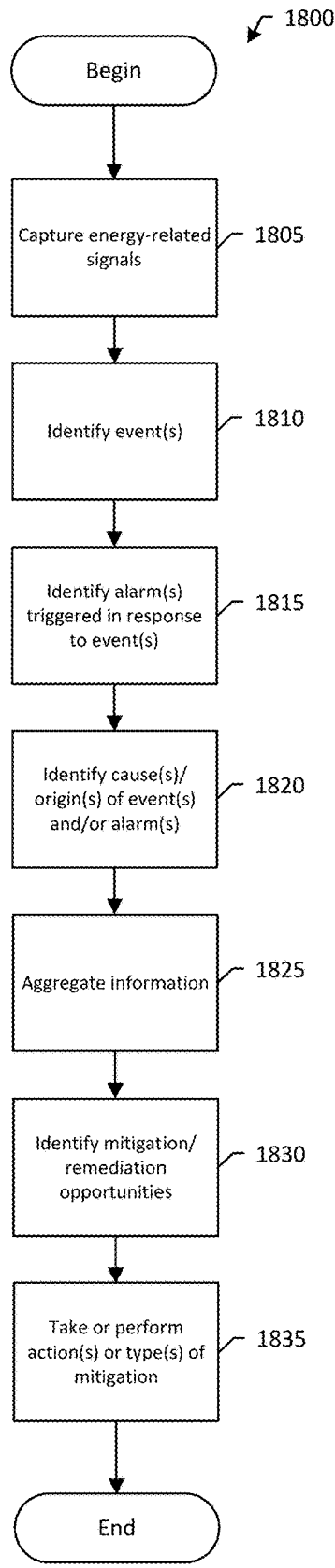
FIG. 18 shows an example method for analyzing alarms to address electrical system issues in accordance with embodiments of the disclosure.

Referring now to FIG. 18, a flowchart illustrates an example method 1800 for analyzing alarms to address electrical system issues, for example, through mitigation and/or remediation, in accordance with one aspect of the disclosure. Similar to the methods previously discussed, method 1800 may be implemented on a processor of at least one IED (e.g., 121, shown in FIG. 1A) in an electrical/power system, a processor of a diagnostic system (e.g., 125, shown in FIG. 1) in the electrical/power system, and/or remote from the at least one IED and the diagnostic system.

As illustrated in FIG. 18, the method 1800 begins at block 1805, where similar to block 205 of method 200 discussed above, energy-related signals (or waveforms) are captured or derived by at least one IED in the electrical/power system. The at least one IED may be part of or associated with an EPMS in accordance with embodiments of this disclosure.

At block 1810, similar to block 210 of method 200, electrical measurement data from or derived from the energy-related signals is processed to identify events (e.g., power events) in the electrical/power system. Additionally, at block 1815, similar to block 215 of method 200, it is determined if any alarms have been, should be, or should have been, triggered in response to the identified events (e.g., power events) in or associated with the electrical system.

At block 1820, cause(s) and/or origin(s) of the identified event(s) and/or the identified alarm(s) is/are identified. Cause, in this context, is what initiated the event. Examples may include motor start, capacitor bank energizing, lightning strike, non-linear load operation, illegal neutral-ground bond, etc. Origin, in this context, is where an event occurs or the location where it occurs. Examples may include upstream from a reference point, downstream from a reference point, on the utility/source system, inside a facility, etc. The reference point may include, for example, an IED, capacitor bank, motor, variable speed drive, outlet, motor control center, breaker or relay, etc.

At block 1825, select information is aggregated. For example, in one example implementation, information relating to at least one of: the identified events, the identified alarms, and the identified cause(s) and/or origin(s) of the identified event(s) and/or the identified alarm(s) may be aggregated. For example, the number of daily events or alarms, or the number of groups of time-wise-overlapping events, or the impact on the downstream loads, are but few examples among many others. It is understood that other example types of information may be aggregated at block 1825, similar to comparable blocks of previous methods (e.g., block 220 of method 200). For example, in accordance with embodiments of this disclosure, the aggregated information may further include information from at least one of: an EPMS, a SCADA system (e.g., Power SCADA, Manufacturing SCADA), a building management system (BMS), I/O devices and data, PLC data and system users (e.g., user-initiated actions). As noted earlier in this disclosure, in some instances the EPMS may include the at least one IED responsible for capturing or deriving the energy-related signals (e.g., at block 205 of method 200).

Similar to block 220 of method 200, in accordance with some embodiments of this disclosure, the information aggregated at block 1825 may be aggregated based, at least in part, on segment-type (e.g., retail, offices, hotels, hospitals, data centers, food and beverage, and oil and gas). It is important to note the electrical system issues are generally unique to each site/customer application.

At block 1830, the aggregated information is analyzed to identify addressment opportunities. More particularly, in on example implementation, the aggregated information may be analyzed to identify and/or determine mitigation/remediation opportunities and techniques/approaches/methods, for example, to address at least one of: event symptom(s), alarm source(s), and the identified cause(s) and/or origin(s) of the identified event(s) and/or the identified alarm(s). Event symptoms, in this context, are general and specific characteristics often associated with an event type. These may be dependent on specific segment types, specific load types, operation or issues, specific locations within a facility, specific times of day, etc. Examples may include breakers opening when a downstream fault occurs, lights dimming or flickering when a motor starts, VSDs tripping offline when a capacitor bank energizes, etc. Alarm sources, in this context, are the device, system, and/or other provider of alarms to the EPMS. Examples may include metering devices, breakers, relays, UPSs, PLCs, analog or digital I/O sources, cloud-based repositories, Edge systems, gateways, etc. "Resolving an alarm source(s)" means addressing an events or issue associated with the alarm source, for example, due to misconfiguration, no data, too much data, not the right data, etc.

At block 1835, at least one action (e.g., at least one mitigation or remediation technique) is taken or performed to improve or resolve the at least one of: the event symptom(s), the alarm source(s), and the identified cause(s) and/or origin(s) of the identified event(s) and/or the identified alarm(s). In accordance with some embodiments of this disclosure, the at least one action is taken or performed based on the analysis of the aggregated information at block 1830. Additional aspects relating to the at least one action, including example types of action(s) and mitigation technique(s), are described further in connection with FIG. 19 below.

Subsequent to block 1835, the method may end, return to block 1805, or one or more actions may be taken. For example, in one embodiment, the method may further include evaluating the effectiveness of the at least one action taken or performed at block 1835. Other example aspects, features, and variations of the disclosed invention, including techniques associated with evaluating the effectiveness of the at least one action, will be appreciated from discussions in connection with FIG. 19, for example.

Figure 19:
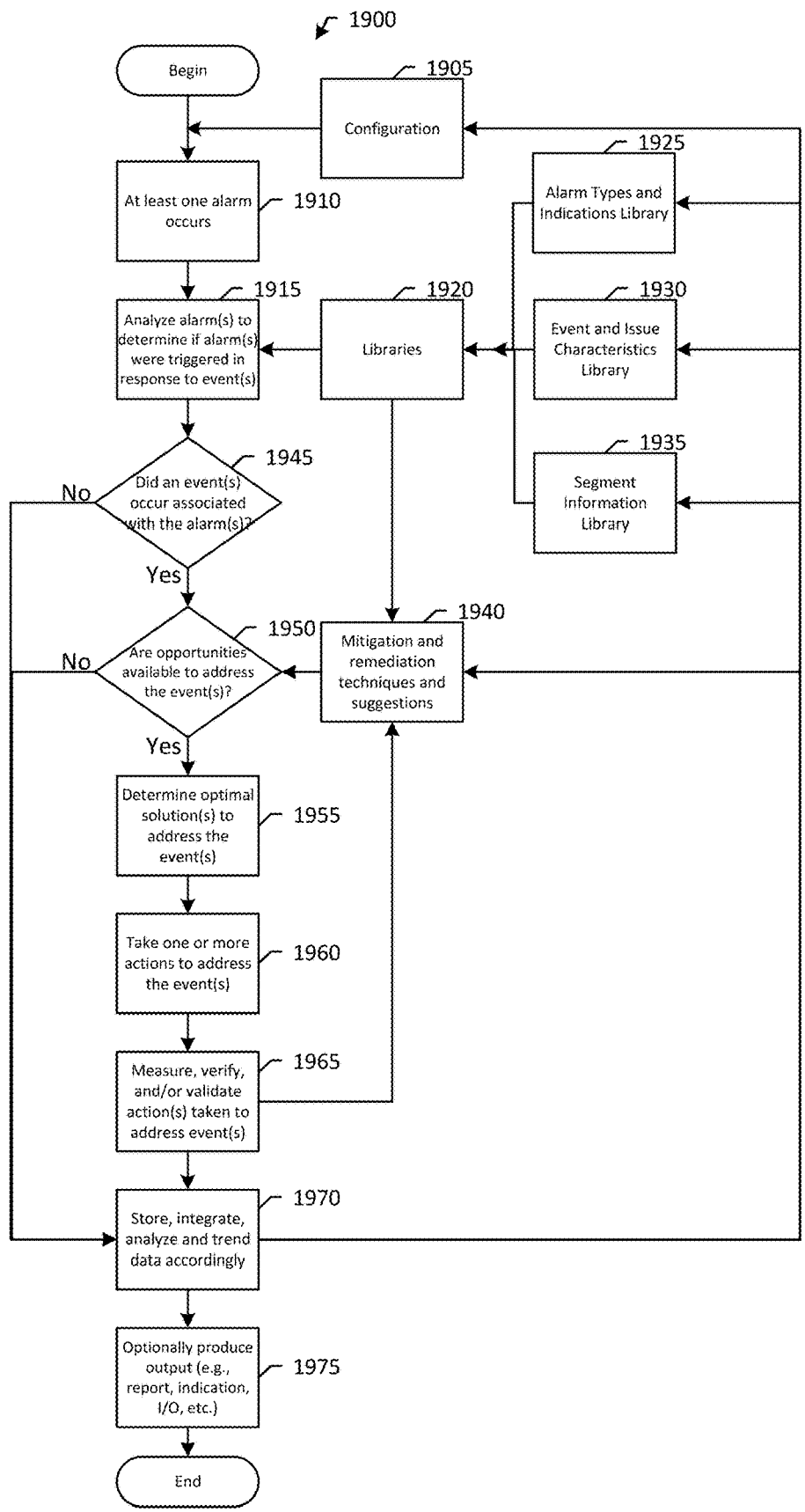
FIG. 19 shows another example method for analyzing alarms to address electrical system issues in accordance with embodiments of the disclosure.

Referring now to FIG. 19, a flowchart illustrates another example method 1900 for analyzing alarms to address electrical system issues, for example, through mitigation and/or remediation, in accordance with one aspect of the disclosure. In accordance with some embodiments of this disclosure, method 1900 is illustrative of example steps that may be performed in connection with one or more of the methods discussed above (e.g., method 1800). Similar to the methods discussed above, method 1900 may be implemented on a processor of at least one IED (e.g., 121, shown in FIG. 1A) in the electrical/power system, a processor of a diagnostic system (e.g., 125, shown in FIG. 1) in the electrical/power system, and/or remote from the at least one IED and the diagnostic system.

As illustrated in FIG. 19, the method 1900 begins at block 1905, where it is determined if relevant alarms are configured properly. More particularly, in an EPMS system (e.g., including the at least one IED discussed above in connection with FIG. 18), the initial step is to ensure the relevant alarms are configured properly to be used in the Alarm Management System (i.e., AMS). The AMS may be located within an IED, Edge, gateway, cloud-based, or any other internal or external location. The purpose of the AMS is to manage the alarm algorithms described in this document. There are many types of alarms generated by EPMSs including voltage sags, voltage swells, high-speed transients, harmonic distortion, low power factor, leading power factor, frequency deviations, voltage and current imbalance, and overcurrents just to name a few. Because each parameter is unique, they will (in most cases) use different thresholds to trigger. They may also incorporate a form of delay (sometimes referred to as alarm hysteresis) before triggering to ensure the threshold has been exceeded for a sufficient period of time for the event to be relevant.

Because this invention leverages alarms, at least one alarm is necessary to initiate the process (here, at block 1910). The at least one alarm may originate anywhere within the EPMS, PLC system, digital or analog I/O, and/or any other internal or external source that influence the system managing the alarms. This may include IEDs, other equipment connected to transducers, alarms derived at the Edge (on-site software) or from gateways, cloud-based systems, and/or any other sources of data that can be alarmed upon.

At block 1915, one or more alarms entering the AMS are analyzed accordingly to determine their relevancy to the associated electrical system or to its EPMS. In accordance with some embodiments of this disclosure, various libraries of contextual data related to issues, events, alarm types, alarm sources, alarm characteristics, and segment information may be used in the analysis, as indicated by blocks 1920, 1925, 1930, 1935, for example. Additionally, historical data (including past alarm data), historical analyses, and/or historical determinations may also be leveraged. Although it is shown in a separate function block, mitigation and remediation techniques and suggestions (here, block 1940) may also be included within the library functional block in some instances.

The AMS (or associated component) contains the libraries associated with this application. An associated component may be located in a single repository (e.g., cloud-based memory) or across multiple repositories (e.g., EPMS and cloud-based repository). One or more of the libraries may be updated as required or desired to ensure the veracity of the libraries and resulting analyses, accordingly.

There are four general libraries illustrated in FIG. 19 (mentioned above); however, the application may use more or less information than what is shown, including supplemental information required to facilitate useful alarm analysis. Additionally, the algorithm may request additional information (e.g., metadata, user interactions, etc.) from the end-user to provide more direct and useful results. Information included within the libraries may be prescriptive, empirical/experiential, and/or theoretical.

Figure 20:
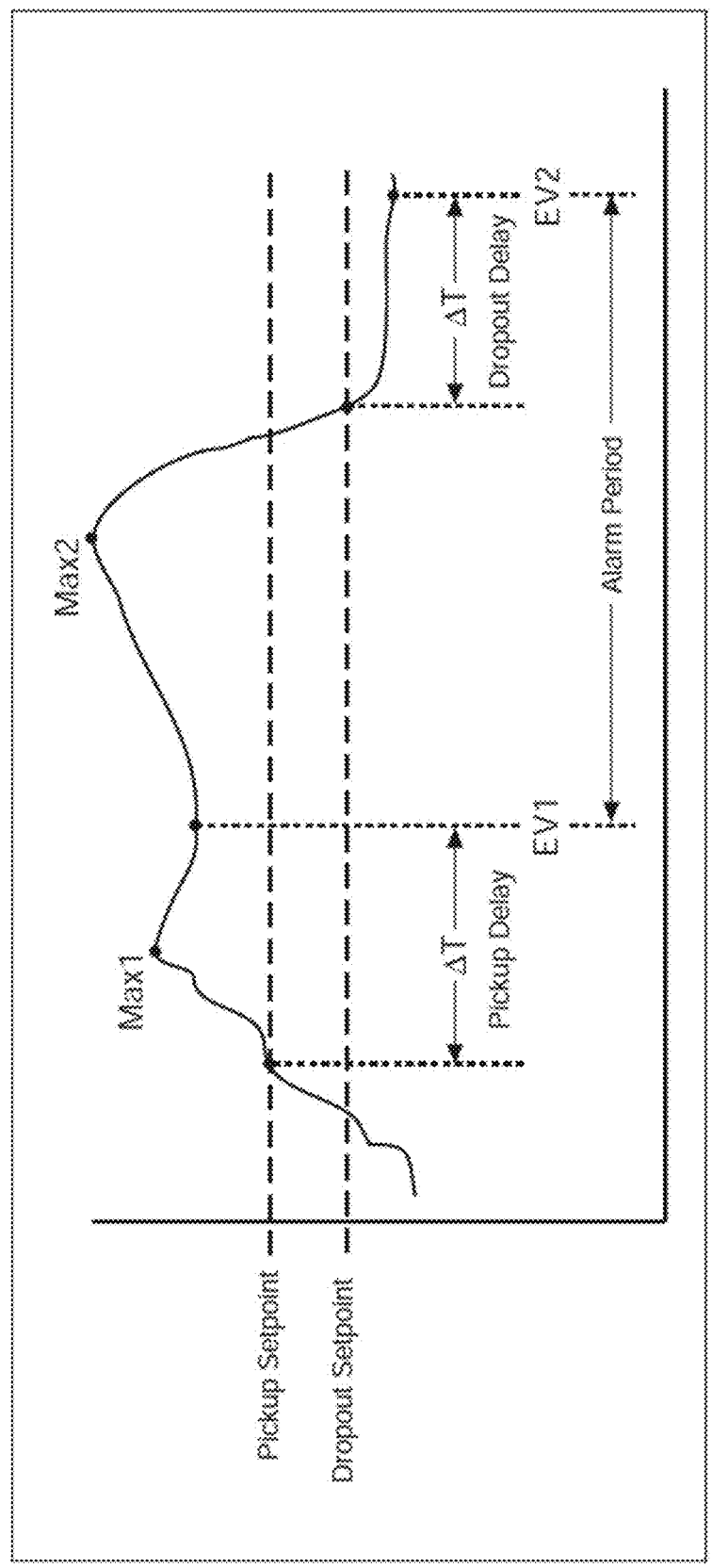
FIG. 20 illustrates how setpoint-driven alarms function with alarm pickups, dropouts and delays in accordance with embodiments of the disclosure.

The first example library illustrated in FIG. 19 is the Alarm Types and Indications Library (depicted by block 1925), which may be used to describe information related to alarm parameters, characteristics, types, data, indications, limitations, configurations, and so forth. For example, there are many alarm types including power quality-related (e.g., sags, transients, harmonics, etc.), energy-related (e.g., peak demand, power factor, consumption, etc.), etc. Each is intended for its own area of significance, may have unique alarm thresholds and setpoints, priorities, delays, and so forth. Alarms can be used for steady-state issues/conditions and some may be used for indiscriminate events. Alarms may also be used in combination (e.g., Boolean alarms) with others while others may act as "standalone" alarms. Input/Output (i.e., I/O) alarms can be used to bring in external information from switches and/or transducers or may be used to trigger output signals to external IEDs and/or other equipment. Some IEDs (or other alarm sources) may only provide a subset of alarms, so understanding the constraints of an IED (or other alarm source) is important to, in turn, understand the constraints of the proposed mitigation or remediation solution. The key to the Alarm Types and Incidents Library is to understand the alarm data received and to ensure the appropriate data is available for analysis and resolution of electrical issues. FIG. 20 provides a simple illustration of how setpoint-driven alarms function with alarm pickups, dropouts and delays.

IEDs, Edge, gateways, and/or cloud-based applications generate alarms that may, in turn, provide and/or generate supplemental information. For example, a voltage sag event may generate a voltage sag alarm in an IED. This voltage sag alarm may subsequently trigger an analysis of the voltage sag event, triggering an analysis of the data associated with the voltage sag alarm, providing additional information regarding the voltage sag's impact, duration, type, recovery time, location, and so forth.

Because alarm source will have inherent limitations, the Alarm Types and Indications Library will contain these limitations to the extent it is possible. For example, a specific metering device may have a limitation of its sample rate, which may constrain the information available or that can be derived from an event. This information will be important to consider when analyzing alarms to determine the best approach for mitigation or remediation.

Configuration information may also be included in the Alarm Types and Indications Library since improper configuration can impact the quality/quantity of alarms generated by algorithms. Because part of the solution involves measuring, verifying and/or validating a mitigation and/or remediation activity, proper configuration of alarm sources is pertinent. It is understood that an evaluation may include at least one of: measuring, verifying and validating the mitigation and/or remediation activity. Configuration information may be associated with a single alarm source or viewed through the lens of two or more alarm sources (i.e., a system view). Additionally, it may be important to change/adjust the configuration of one or more alarm sources to improve the quality/quantity of alarm information produced by the EPMS (or other sources). Finally, because the configuration of one or more devices may be changed/updated, it is relevant to maintain a record of any changes to one or more alarm configurations to ensure consistency in the analyses.

The second example library illustrated in FIG. 19 is the Event and Issue Characteristic Library (depicted by block 1930), which may be used to describe information related to events and issues including causes, symptoms, effects/ramifications, typical event waveform characteristics, and so forth. Alarms generated by the EPMS (or other alarm sources) may be evaluated against the content of the Event and Issue Characteristics Library to ascertain potential alarm causes, sources, locations, general impacts, severity, recovery parameters, system influences, other symptoms, and/or additional conditions, for example. Additionally, event and issue characteristics may be evaluated from discrete alarm sources and/or from two or more alarm sources as required. The key to the Event and Issue Characteristics Library is to understand the external (i.e., to the alarm source) stimulus that caused (or could have caused) the alarm and its influences and/or ramifications to the operation, process, system and/or equipment associated with the alarm.

It is understood that there are a range of events that result in alarms. Some exemplary event causes and associated alarms include, but are not limited to:

| | |
|---|---|
| Faults (voltage sags) | Capacitor fuses blowing (imbalance) |
| Nonlinear load operation (harmonics) | Premature failure (overloaded equipment) |
| Large load energizing (voltage sags) | Intermittent load operation (voltage fluctuations) |
| Sync issues (frequency deviations) | Equipment component failure (impulsive transient events) |
| Light fixture failure (overvoltage) | VSDs tripping (oscillatory transient events) |

While event causes may sometimes also be considered as a symptom, additional clues may be indicative of an underlying issue. Although not an exhaustive list, a few exemplary symptoms are listed here:

| | |
|---|---|
| Excessive heating | Misoperation |
| Unplanned outages | Reduce product quality |
| Inefficiency | De-energization |
| Reduced life expectancy | Instability |

Effects/ramifications associated with events may include a range of adverse effects including (but not limited to):

| | |
|---|---|
| Higher utility bills | Reduced product quality |
| Lower productivity | Increased downtime |
| Greater maintenance costs | Poor reliability |
| Larger CAPEX and OPEX | Decreased customer satisfaction |

Event source locations may be broadly determined by examining the voltage and current alarm waveform data generated from a single device or more precisely determined by examining the voltage and current alarm waveform data generated by multiple devices (i.e., from a system perspective). Hierarchical context of the EPMS or electrical system can be used to provide discrete relationships between a first alarm source and a second alarm source. Time interrelations, timestamps of alarms and the inferred order in the sequence of events may also be indicative of a source location. Additionally, the source location of an event may be manually entered by the end-user and characterized over time to evaluate and determine alarms with similar parameters/traits to determine a potential source location of the event. Event source context may be determined from the Event and Issue Characteristics Library, derived from event and/or alarm data, or retrieved from other sources.

Delineation between impactful and non-impactful events is important because it may be used to determine prioritization of mitigation and/or remediation solutions. It is important to note here that impactful events are typically issues due to their effect on the end-user's electrical system and business interests; however, non-impactful events can merely be an annoyance. Because 1) there are different types of impacts, and 2) an event may impact one system differently than another system, it is important to consider the context of the application (e.g., market segment, process, load, etc.). For an example of different types of impacts, an interruption of the primary electrical source may be one type of impact while excessive harmonics (and their resulting effect to equipment) may be another type of impact. The former interrupts production (i.e., production impact); the latter impacts equipment life (and associated costs and risks to production). For an example of the effects of an event impacting systems differently, a voltage sag in an office building will have a different impact on the buildings operation than the same event would have on the operation of a data center. The former is able to operate with lower reliability requirements than the latter. Moreover, the costs associated with mitigating or remediating events will be different (significantly in many cases) because the office building may not be able to justify excellent reliability, while excellent reliability is critical to the operation of a data center.

The importance of an event's severity and breadth are, again, determined (to some degree) by the application of the system, and are essentially "subsets" of the topic of impact. The severity of an event's impact may be determined based upon which, when, where, and to what magnitude a load, process, system and/or facility is affected. Likewise, the breadth of an impact is more relevant when critical elements of the customer's operation are affected. Again, an event's influence on a system may be determined (to a larger degree) by the function or purpose of the associated system.

Another important parameter related to events is the application/load/system/process/facility's ability to recover from the event. Therefore, a recovery period is indicative of the duration in time required to bring the electrical system back (within some measure) to its pre-event conditions (e.g., load, operational characteristics, etc.). The recovery period may be different for different facilities or types of events; however, the recovery period may align (statistically) within analogous event types, especially if the source location is similar. In some cases (and within some customer segments), this may not be the case so exceptions should be considered. It is possible to learn the typical recovery period over time by analyzing successive event characteristics accordingly. The recovery period may be measured/determined using one or more EPMS components (or other sources).

Additional system influences regarding the cause(s) and effect(s) of events may be considered including (but not limited to): energy source reliability, system design (e.g., data center Tier 1,2,3,4,5, equipment used, etc.) geographic location and local meteorology, regulations, technology(s), and so forth. There may be some overlap between the cause(s) and effect(s) of events and the associated customer segment experiencing said event, which is provided below.

The third example library illustrated in FIG. 19 is the Segment Information Library (depicted by block 1935), which is used to describe the particular traits, characteristics, and/or needs associated with unique customer segments (or customer types). Each customer segment uses energy for different purposes. For example, an automobile manufacturer uses energy to make cars, a semiconductor fabrication facility uses energy to produce silicon wafers and chips, and a hospital uses energy to provide treatment of patients. Each of these examples are different from each other, but generally similar to others performing the same functions; hence the phrase 'customer segment.' The key to the Segment Information Library is to understand the susceptibility of, and impact to, events associated with specific types of customers and energy consumers, with due consideration of their ultimate purpose for consuming energy.

As previously mentioned, each event type impacts customer segments in different ways. For example, two customer segments (e.g., data centers and semiconductor fab facility) may have similar susceptibilities to voltage sags; however, the impacts are unique. A voltage sag event may interrupt the operation of a data center resulting in dropped servers, affected customers, and (importantly) a besmudged reputation. Alternatively, a voltage sag in a semiconductor fab facility can result in lost product, time, and wasted resources (e.g., energy, water, etc.). Each will experience a business impact, but in different ways.

Additionally, each segment tends to use a unique array of specific load types. For example, automobile manufacturers use compressed air systems for painting, plastic extrusion facilities use variable speed drives, hospitals use sensitive medical equipment (e.g., MRIs, etc.), and so forth. Assuming most customer segments employ similar types of equipment (within their segment) suggests their susceptibility to certain events will also be comparable. By analyzing alarms based (to a degree) on the customer segment they originate within, providing recommendations for mitigation and remediation is somewhat simplified. Again, even if two different customer segments use similar equipment, it is still likely they will have different purposes, goals, products, and systems for their facility/business.

To summarize, the Segment Information Library depicted by block 1935 is used to analyze whether a particular customer segment/type should care about an event, and if so, then why they should care, and how should they prioritize when multiple events are detected in a system. Certain customer segments are more apt to invest more heavily in mitigation and remediation solutions because of the criticality of their operation. It is important to consider the unique equipment and associated processes, susceptibilities to events, business objectives, required profit margins, and risks within a unique customer segment when analyzing alarm data and the events produced by them.

The fourth example library illustrated in FIG. 19 is Mitigation and Remediation Techniques and Suggestions Library (henceforth referred to as the Mitigation Library for simplicity) (depicted by block 1940), which is used to provide applicable and relevant solutions for events and EPMS issues. As mentioned above, there are many types of events and issues associated with alarms, and each specific customer segment tends to be more susceptible to, and impacted by, a particular set of event types (due to the equipment and processes they use). This library connects event and issue characteristics and segment information to the appropriate mitigation or remediation solution, which is ultimately driven by the alarm data. In short, the key to the Mitigation Library is to address equipment, process, system and/or facility susceptibilities, risks and issues to moderate or eliminate the impact of events to the customer's facility and business.

Returning now to the flow illustrated in FIG. 19, subsequent to at least alarm occurring at block 1910, and the alarm(s) being analyzed to determine if the alarm(s) were triggered in response to event(s) at block 1915, for example, based on analysis information from or derived from captured energy-related signals and the libraries discussed above, it is determined if there are any event(s) associated with the alarm(s) at block 1945.

In one example implementation, data from one or more libraries may be used to identify incipient, arbitrary, or chronic issues (i.e., "Is there a problem?"). Once an issue has been identified, data from one or more libraries is optionally used to determine the issue's relevancy to the customer segment/type (i.e., "Should I care?"). Again, issues may be associated with aspects of the customer's electrical system (e.g., equipment, infrastructure, etc.) or its accompanied EPMS. Moreover, the presence (or lack) of alarms may be indicative of issues to be addressed.

More simply put, an alarm may indicate the occurrence of an event, and an event indicates an issue may exist that needs to be addressed. Analysis of the alarms through the lens of the libraries connects these concepts together. This block connects the alarms to the events because the EPMS (or other source) alarms are the fundamental data used to identify events (and issues).

At block 1945, alarms associated with events may be filtered from alarms not associated with events in some instances. If it is determined there is at least one event associated with the alarm(s), the method may proceed to block 1950, where it is determined whether there are any opportunities available to address the event(s). Alternatively, if it is determined there is not at least one event associated with the alarm(s), the method may end in some instances or a decision may be may to store this decision for future analysis, trending, or other steps related to the algorithm.

At block 1950, it is determined whether there are opportunities to mitigate or remediate the event indicated by the alarm. In some cases, this step may be optionally bypassed until a threshold of a given event type (or event characteristics) are met. For example, one event likely does not indicate a chronic issue exists; therefore, providing mitigation may not be cost effective. However, a significant number of events may indicate a chronic issue exists, so mitigation or remediation actions should be considered. In one example implementation, one or more alarms may be generated, produced or initiated (e.g., using an EPMS associated with the electrical system) to indicate an opportunity to mitigate or remediate the at least one of the event symptom, the alarm source, and the causes/origins of the identified events and/or the identified alarms. These alarms may be presented on a user interface, occur audibly, via text, etc. in some instances.

Another evaluation at block 1950 is the availability of mitigation or remediation techniques and/or suggestions related to at least one event. In this instance, there may not be a mitigation or remediation technique or suggestion available or there may not be enough information available to determine the need for mitigation or remediation. In both of these cases, the analyses and decisions from previous blocks are optionally stored for future analysis, trending, and/or other steps related to the algorithm accordingly. Indications that there is not enough information OR there is no mitigation or remediation technique or suggestion will bypass actions taken to mitigate or remediate an event(s) and to optionally measure/verify/validate said event(s).

If the evaluation at block 1950 indicates at least one mitigation or remediation technique and/or suggestion is available, the process proceeds to block 1955 where optimal solution(s) to address the event(s) are determined. At least one of the libraries provides information may be used to evaluate the ability to mitigate, remediate and/or provide a suggestion to resolve an event(s). Techniques, suggestions, and thresholds to determine whether at least one mitigation, remediation, and/or suggestion is viable may be updated in the libraries based on analyses/analytics, measurement/verification/validation data, manual revisions, pushed from cloud-based applications, or other sources periodically or as required.

At block 1955, an analysis is performed to provide an optimal solution to mitigate or remediate an issue, which may require information from one or more of the libraries. For example, the Mitigation Library (e.g., block 1940) may include an array of mitigation and/or remediation techniques and suggestions generally associated with an array of issues and concerns related to the electrical system and/or EPMS.

Accordingly, the array of issues and concerns related to the electrical system and/or EPMS are related to the information within the other libraries (e.g., Event and Issue Characteristics Library, Alarm Types and Indications Library, etc.). Mitigation and remediation techniques and suggestions may be prioritized and optimized based on a combination of the segment type, event type, and/or alarm type, accordingly. It is understood that in all cases, the optimal goal is to mitigate or remediate an issue; not necessarily a single event (although it could be done). The occurrence of events indicate there may be an issue, but not necessarily. A threshold for events should be determined/set/understood before it is known whether there is an issue.

If it is determined one or more issues are occurring/co-occurring within a system, the recommended mitigation and/or remediation approaches may be chosen and provided based on one or more of several factors including: 1) minimal cost, 2) minimal maintenance, 3) minimal installation, 4) minimal space requirements, 5) industry and/or other similar customer type recommendations for issue(s) and/or segment type, 6) standards recommendations for issue(s) and/or segment type, 7) equipment manufacturer recommendations for issue(s) and/or segment type, 8) best performing historical solutions from measurement/verification/validation data for issue(s) and/or segment type, 9) other approaches that may be considered technically, operationally, and/or corporately satisfactory, and/or 10) any combination of the aforementioned factors. Furthermore, at least one historical or real-time metric may be used or leveraged to identify one or more optimal approaches to mitigate or resolve one or more issues associated with the electrical system and/or the EPMS.

It is understood that mitigation and remediation techniques may include an array of approaches to resolve electrical or EPMS issues. Without taking into account the cause of an issue, the table below provides a few simple examples of issues and potential mitigation or remediation techniques.

| Issue | Mitigation or Remediation |
|---|---|
| Component damage or failure | Install surge protective device (SPD) near sensitive loads |
| Brief voltage sags | Install CVT on equipment controls for ride-through |
| Transformer overheating | Resize transformer |
| Inadvertent VSDs tripping | Install line reactors |
| Heating on neutral conductors | Install Δ-Y transformer |
| Unknown issues | Install or relocate IEDs to acquire useful data for troubleshooting |

It is important to reiterate that the mitigation or remediation techniques provided in the table above are just for illustrative purposes and (in reality) would require additional information to substantiate or validate.

It is understood that mitigation or remediation may involve other approaches or suggestions to resolve issue(s). For example, recommendations may be made to balance a chronically imbalanced three-phase circuit, install reduced voltage starters to reduce voltage sags on across-the-line starting of motors, or shorten the lead lengths on SPDs. Mitigation or remediation recommendations are often determined based on load/equipment types. Using data from the Segment Information Library (depicted by block 1935), for example, it may be possible to ascertain equipment types typically used at a customer facility. From there, alarms (and the events they represent) are used to select approaches or provide guidance to customers regarding the resolution of certain issues.

It is understood that information from one or more libraries may be used to help mitigate or remediate customer issues. Additionally, data from one or more particular libraries may be prioritized or deprioritized, depending on any number of factors including (but not limited to): customer segment/type, event type, alarm type, equipment type, alarm source, etc. Measured, derived, statistical, hierarchical, metadata, or other forms of data/information may be used to update libraries, or be used in conjunction with any one or more libraries to determine the most optimal solution.

Subsequent to the optimal solution(s) to address the event(s) being identified at block 1955, one or more actions may be taken in response to the event(s). The action(s) may include, for example, the optimal solution(s) to address the event(s) identified at block 1955. Additionally, the action(s) may include storing, displaying and/or analyzing information related to the optimal solution(s).

After the appropriate action(s) is/are taken to address the event(s), the algorithm may optionally continue to evaluate the event(s) to determine the impact or effectiveness of the actions taken in response to the event(s) to address the event(s). This optional step may occur perpetually/ongoing, periodically, or in particular. In one example implementation, the evaluation includes analyzing and comparing aggregated information from prior to taking or performing the at least one action with aggregated information from subsequent to taking or performing the at least one action. In accordance with some embodiments of this disclosure, the aggregated information from prior to taking or performing the at least one action is derived from the energy-related signals captured or derived by the at least IED at a first time prior to taking or performing the at least one action. Additionally, in accordance with some embodiments of this disclosure, the aggregated information from subsequent to taking or performing the at least one action is derived from the energy-related signals captured or derived by the at least IED at a second time subsequent to taking or performing the at least one action.

The output(s)/result(s) of this step may be at least one of providing or indicating background, purpose, effectiveness, new or supplemental recommendations, requests for additional information and/or opportunities, discrete or system benefits (e.g., ROI, reduced recovery time, monetary savings, reduced downtime, reduced event(s), etc.), and so forth. In embodiments in which the evaluation includes quantifying the effectiveness of the at least one action that is taken or performed, it may be determined whether the quantified effectiveness meeting or exceeding an acceptable threshold. In response to the quantified effectiveness meeting or exceeding the acceptable threshold, it may be determined whether it is necessary to continue to take or perform the at least one action. Additionally, in response to the quantified effectiveness not meeting or exceeding the acceptable threshold, it may be determined whether any adjustments need to be made to the at least one action taken or performed, or if at least one alternative action should be taken or performed. Feedback from these (or other) output(s)/result(s) may optionally also be provided to at least one library for updating, improving, supplementing, and/or deleting information and/or data for mitigation or remediation recommendations.

At block 1970, data and/or information produced by the algorithm, appended to the libraries, and/or otherwise related to the process described herein may be stored for historical use, integrated into the algorithm and/or libraries, analyzed for supplemental opportunities, and/or statistically evaluated for additional insights. The data and/or information produced by the algorithm may also be used to change/adjust EPMS (or other source) configuration settings and thresholds accordingly. Finally, this information may be used to update, change, delete, or adjust data located in any data repository (e.g., library, etc.) related to the EPMS (or other source(s)) including cloud-based repositories and libraries, Edge-based systems, gateways, and/or any IEDs (or related devices).

At block 1975, the algorithm (or related system) optionally provides an output (in some form) to the end-user, system, support personnel, services personnel, and/or other interested party. The output may be a report, email, notification, signal(s), and/or any other indication related to the steps, analyses, and/or conclusions of this algorithm/process. The output may be produced indiscriminately, periodically, and/or continuously as configured in the first configuration function block. One or more records may be retained of one or more outputs from this application as necessary or desired. The output may contain recommendations/suggestions, actions, data, analyses, feedback and/or information related to mitigating or remediating at least one event as indicated by at least one alarm. Additionally, the output may consider any aspect, event, issue and/or improvement to the EPMS (or other alarm sources) and/or the electrical system, accordingly.

Subsequent to block 1975, the method may end, return to block 1905, or one or more actions may be taken, as will be apparent to one of ordinary skill in the art.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications) but rather, may be useful in substantially any application where it is desired to provide electrical system analytics. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method performed by one or more computers or intelligent electronic device (IED) (s) for analyzing alarms to characterize electrical system issues, comprising:

processing by the one or more computers or IED(s) electrical measurement data from or derived from energy-related signals captured or derived by multiple IEDs in the electrical system to identify power-related events in the electrical system, and to identify alarms triggered in response to the identified events;

aggregating by the one or more computers or IED(s) information related to at least the identified events and the identified alarms;

analyzing by the one or more computers or IED(s) the aggregated information to determine issue(s) associated with the electrical system, including identifying timewise co-occurring groups of the identified events and/or the identified alarms, and identifying reoccurrences of the identified co-occurring groups of the identified events and/or the identified alarms; and subsequent to identifying the reoccurrences of the identified co-occurring groups, taking or performing one or more actions to address the issue(s), including to increase or improve operation of the electrical system, wherein the one or more actions are automatically performed by a control system.

2. The method of claim 1, wherein the aggregated information further includes information from at least one of: an Electrical Power Monitoring System (EPMS), a SCADA system, a building management system (BMS), I/O devices, PLC data, and system users.

3. The method of claim 2, wherein the aggregated information is further analyzed to determine issue(s) associated with the EPMS and/or to determine at least one of the group comprising: origin(s), source(s), cause(s), transitions, evolutions, and additional interrelationships of the issue(s).

4. The method of claim 3, wherein the issue(s) associated with the EPMS include issue(s) associated with the EPMS not detecting or inadequately detecting issue(s) existing in the electrical system.

5. The method of claim 4, further comprising: adjusting one or more settings associated with the EPMS to address the issue(s) associated with the EPMS.

6. The method of claim 3, wherein the EPMS includes the multiple IEDs responsible for capturing or deriving the energy-related signals.

7. The method of claim 1, wherein the issue(s) associated with the electrical system are indicative of the electrical system's health.

8. The method of claim 7, wherein the electrical system's health corresponds to a condition of the electrical system or ability of the electrical system to perform or operate as intended.

9. The method of claim 7, wherein the electrical system's health is related to electrical system's alarm health, the electrical system's alarm health being indicative of the electrical system's health.

10. The method of claim 9, wherein the electrical system's alarm health is determined based, at least in part, on an analysis of at least one of: quantity(s), type(s), behavior(s), impact(s), and location(s) of the identified alarms.

11. The method of claim 1, further comprising: determining impact of the identified alarms and/or alarm periods associated with the identified alarms on the electrical system, and providing actionable recommendations for reducing or eliminating the impact of the identified alarms and/or the alarm periods associated with the identified alarms on the electrical system.

12. The method of claim 11, wherein the actionable recommendations are based on segment-type and/or customer configured or determined preferences.

13. The method of claim 1, further comprising:
communicating relevant information relating to the identified alarms, the relevant information providing real-time awareness of one or more of: alarm health, alarm configuration(s), alarm operation(s), alarm source(s), alarm impact(s), and recent alarm activity(s).

14. The method of claim 13, wherein the relevant information is provided on an alarm data dashboard, report, text, email and/or audible communication.

15. The method of claim 14, wherein the alarm data dashboard is customizable and configurable, and one or more aspects of the alarm data dashboard are user selectable and capable of providing more detailed insights and analytics in response to one or more user actions on the alarm data dashboard.

16. The method of claim 1, wherein the identified events include power quality events and/or events capable of triggering protection devices.

17. The method of claim 16, wherein the power quality events are indicative of power quality issues in the electrical system.

18. The method of claim 1, wherein the information is aggregated, and/or the issue(s) associated with the electrical system are determined, based, at least in part, on segment-type.

19. The method of claim 3 wherein information relating to impact and location is analyzed with the aggregated information to determine the issue(s) associated with the electrical system, and the origin(s), the source(s), the cause(s), the transitions,/evolutions and/or the interrelationship(s) of the issue(s).

20. The method of claim 1, wherein the one or more actions to address the issue(s) further include adjustments to one or more alarm parameters or thresholds.

21. The method of claim 1, wherein the one or more actions to address the issue(s) are automatically performed by a control system associated with the electrical system, wherein the control system is communicatively coupled to the multiple IEDs responsible for capturing or deriving the energy-related signals, and/or to at least one of the group comprising: a cloud-based system, on-site or/edge software, a gateway, and other head-end system associated with the electrical system.

22. The method of claim 1, wherein the aggregated information is automatically or dynamically analyzed.

23. A system for analyzing alarms to characterize electrical system issues, comprising:
at least one processor;
at least one memory device coupled to the at least one processor, the at least one processor and the at least one memory device configured to:
process electrical measurement data from or derived from energy-related signals captured or derived by multiple intelligent electronic devices (IEDs) in the electrical system to identify power-related events in the electrical system, and to identify alarms triggered in response to the identified events;
aggregate information related to at least the identified events and the identified alarms;
analyze the aggregated information to determine issue(s) associated with the electrical system, including to identify timewise co-occurring groups of the identified events and/or the identified alarms, and to identify reoccurrences of the identified co-occurring groups of the identified events and/or the identified alarms; and
subsequent to identifying the reoccurrences of the identified co-occurring groups, take or perform one or more actions to address the issue(s), including to increase or improve operation of the electrical system,
wherein the one or more actions are automatically performed by a control system.

24. The system of claim 23, wherein at least a portion of the at least one processor and the at least one memory device are included in a control system associated with the electrical system, and wherein the one or more actions to address the issue(s) are automatically performed by the control system, wherein the control system is communicatively coupled to the multiple IEDs responsible for capturing or deriving the energy-related signals, and/or to at least one of the group comprising a cloud-based system, on-site/edge software, a gateway, and a head-end system associated with the electrical system.

25. The method of claim 1, wherein the one or more actions to address the issue(s) include at least one of the group comprising: causing an installation of an equipment or on an equipment of the electrical system; causing configuration of the equipment; causing control of a parameter of the equipment; causing relocation of the equipment; causing control of a load of the electrical system; and causing delay, change of the sequence, or postponement of a process in another system.

26. A method performed by one or more computers or intelligent electronic device (IED) (s for analyzing alarms to characterize electrical system issues, comprising:
processing by the one or more computers or IED(s) electrical measurement data from or derived from energy-related signals captured or derived by multiple IEDs in the electrical system to identify power-related events in the electrical system, and to identify alarms triggered in response to the identified events;
aggregating by the one or more computers or IED(s) information related to at least the identified events and the identified alarms;
analyzing by the one or more computers or IED(s) the aggregated information to determine issue(s) associated with the electrical system, including identifying timewise co-occurring groups of the identified events and/or the identified alarms, and identifying reoccurrences of the identified co-occurring groups of the identified events and/or the identified alarms, and to further determine origin(s), source(s), cause(s), transitions, evolutions and/or interrelationships of the issue(s); and
subsequent to determining the issue(s), taking or performing one or more actions to address the issue(s), including to increase or improve operation of the electrical system,
wherein the one or more actions to address the issue(s) are automatically performed by a control system associated with the electrical system, wherein the control system is communicatively coupled to the multiple IEDs responsible for capturing or deriving the energy-related signals, and/or to at least one of the group comprising a cloud-based system, on-site or/edge software, a gateway, and other head-end system associated with the electrical system, or
wherein the one or more actions to address the issue(s) include at least one of the group comprising: causing an installation of an equipment or on an equipment of the electrical system; causing configuration of the equipment; causing control of a parameter of the equipment; causing relocation of the equipment; causing control of a load of the electrical system; or causing delay, change of the sequence, and postponement of a process in another system.

\* \* \* \* \*